(12) United States Patent
Cho et al.

(10) Patent No.: US 12,382,668 B2
(45) Date of Patent: Aug. 5, 2025

(54) SEMICONDUCTOR DEVICE INCLUDING PLURALITY OF CHANNEL LAYERS

(71) Applicant: SAMSUNG ELECTRONICS CO., LTD., Suwon-si (KR)

(72) Inventors: Keunhwi Cho, Seoul (KR); Gibum Kim, Hwaseong-si (KR); Myunggil Kang, Suwon-si (KR); Dongwon Kim, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 480 days.

(21) Appl. No.: 18/046,656

(22) Filed: Oct. 14, 2022

(65) Prior Publication Data

US 2023/0120496 A1    Apr. 20, 2023

(30) Foreign Application Priority Data

Oct. 18, 2021    (KR) .................. 10-2021-0138404

(51) Int. Cl.
| | |
|---|---|
| *H10D 30/67* | (2025.01) |
| *H10D 30/01* | (2025.01) |
| *H10D 30/43* | (2025.01) |
| *H10D 62/10* | (2025.01) |
| *H10D 84/01* | (2025.01) |

(Continued)

(52) U.S. Cl.
CPC ......... *H10D 30/6757* (2025.01); *H10D 30/43* (2025.01); *H10D 30/6735* (2025.01); *H10D 30/6739* (2025.01); *H10D 62/102* (2025.01); *H10D 62/121* (2025.01);

(Continued)

(58) Field of Classification Search
CPC .............. H10D 30/6757; H10D 30/43; H10D 30/6735; H10D 30/6739; H10D 62/102; H10D 62/121; H10D 84/85; H10D 30/014; H10D 84/0167; H10D 84/038; H10D 64/667; H10D 64/256; H10D 84/0177; H10D 30/62; H10D 30/024; H10D 30/6219; B82Y 10/00
See application file for complete search history.

(56) References Cited

U.S. PATENT DOCUMENTS

| | | |
|---|---|---|
| 10,096,688 B2 | 10/2018 | Tak et al. |
| 10,217,816 B2 | 2/2019 | Bhuwalka et al. |

(Continued)

*Primary Examiner* — Mohammad A Rahman
(74) *Attorney, Agent, or Firm* — MORGAN, LEWIS & BOCKIUS LLP

(57) ABSTRACT

A semiconductor device includes a substrate, an active fin on the substrate, and a transistor on the active fin. The transistor includes a lower channel layer, an intermediate channel layer, and an upper channel layer sequentially stacked, and a gate structure traversing the active fin, respectively surrounding the channel layers, and including a gate dielectric and a gate electrode. The gate electrode includes a lower electrode portion between the active fin and the lower channel layer, an intermediate electrode portion between the lower channel layer and the intermediate channel layer, and an upper electrode portion between the intermediate channel layer and the upper channel layer. The gate electrode includes a work function adjusting metal element, and a content of the work function adjusting metal element in the lower electrode portion is different from that in each of the intermediate electrode portion and the upper electrode portion.

20 Claims, 33 Drawing Sheets

(51) Int. Cl.
  *H10D 84/03* (2025.01)
  *H10D 84/85* (2025.01)
(52) U.S. Cl.
  CPC ........... *H10D 84/85* (2025.01); *H10D 30/014* (2025.01); *H10D 84/0167* (2025.01); *H10D 84/038* (2025.01)

(56) References Cited

U.S. PATENT DOCUMENTS

| | | |
|---|---|---|
| 10,319,863 B2 | 6/2019 | Lee et al. |
| 10,833,085 B2 | 11/2020 | Shin et al. |
| 10,930,649 B2 | 2/2021 | Kang et al. |
| 2006/0024874 A1 | 2/2006 | Yun et al. |
| 2020/0303521 A1* | 9/2020 | Son ..................... H10D 62/121 |
| 2021/0066100 A1 | 3/2021 | Liaw |
| 2021/0066452 A1 | 3/2021 | Liaw |

\* cited by examiner

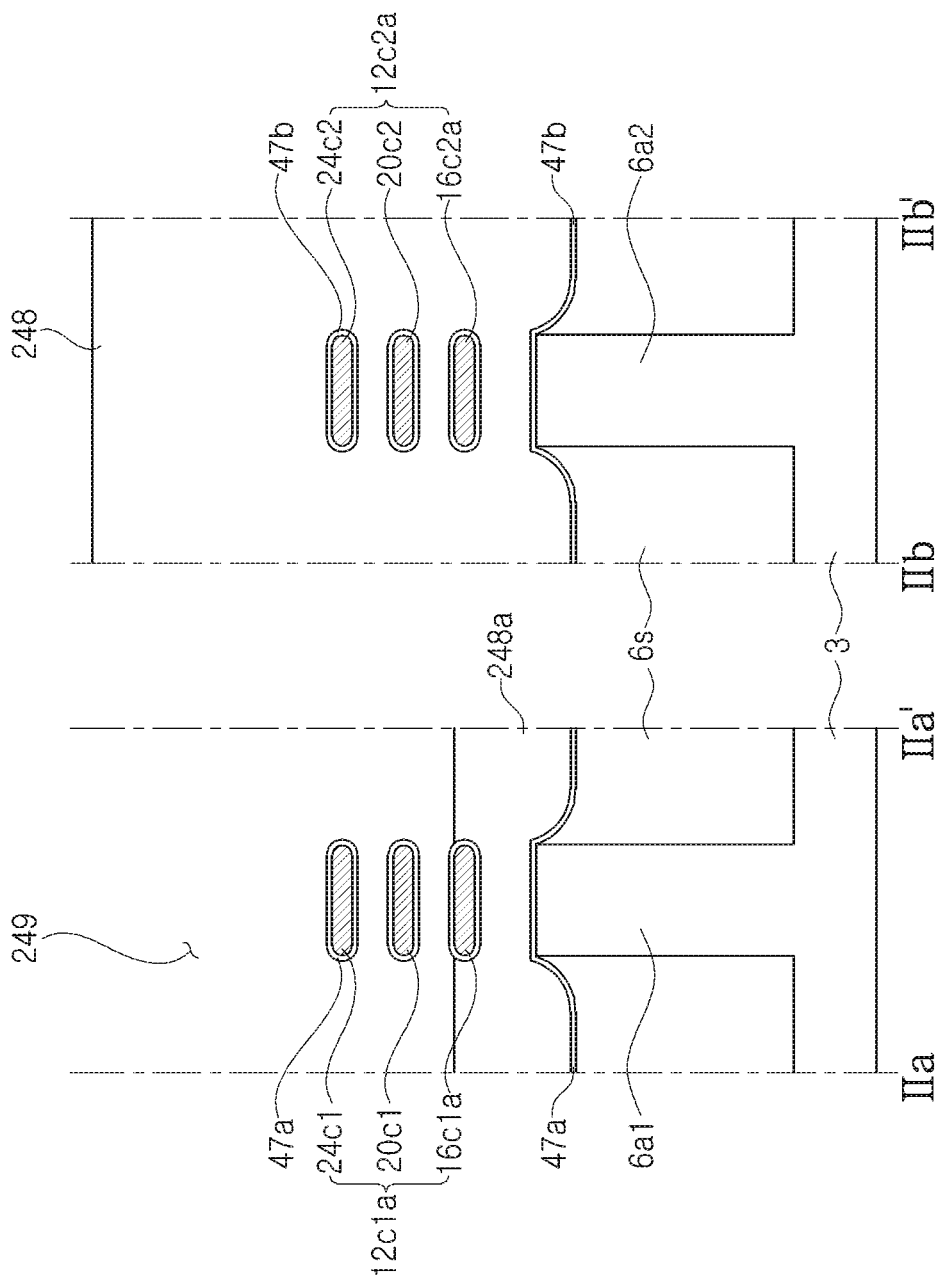

ial application No. 10-2021-0138404, filed on Oct. 18, 2021, in the Korean Intellectual Property Office, the disclosure of which is incorporated by reference herein in its entirety.

TECHNICAL FIELD

The present inventive concept relates to a semiconductor device including a plurality of channel layers spaced apart from each other vertically.

DISCUSSION OF RELATED ART

As the demand for high performance, high speed, and/or multifunctionality of semiconductor devices increases, the semiconductor devices become highly integrated, with individual circuit patterns being further miniaturized to integrate more semiconductor elements in a small area. As a result, when a semiconductor device corresponding to the trend for high integration of semiconductor devices is manufactured, the semiconductor device may include a fine pattern having a fine width or a fine separation distance. In addition, to reduce the limitation of operating characteristics due to size reduction of planar metal oxide semiconductor field effect transistors (MOSFETs), efforts have been made on developing semiconductor devices including transistors having a three-dimensional channel structure.

SUMMARY

Example embodiments of the present inventive concept provide a semiconductor device in which sub-threshold leakage current may be significantly reduced or prevented in a transistor including a plurality of vertically spaced channel layers.

Example embodiments of the present inventive concept provide a semiconductor device in which an operating threshold voltage distribution may be enhanced in a transistor including a plurality of vertically spaced channel layers.

According to an example embodiment of the present inventive concept, a semiconductor device includes a substrate; a first active fin on the substrate and extending in a first direction parallel to an upper surface of the substrate; a second active fin on the substrate and extending in the first direction; an isolation region disposed on the substrate and disposed on side surfaces of the first active fin and the second active fin; a first transistor on the first active fin; and a second transistor on the second active fin. The first transistor includes a first source region and a first drain region spaced apart from each other in the first direction, on the first active fin, a plurality of first channel layers including a first lower channel layer, a first intermediate channel layer, and a first upper channel layer spaced apart from each other in a vertical direction perpendicular to the upper surface of the substrate, on the first active fin, and sequentially stacked, the plurality of first channel layers being disposed between the first source region and the first drain region; and a first gate structure extending in a second direction perpendicular to the first direction while traversing the first active fin, and respectively surrounding the plurality of first channel layers. The second transistor includes a second source region and a second drain region spaced apart from each other in the first direction, on the second active fin; a plurality of second channel layers including a second lower channel layer, a second intermediate channel layer, and a second upper channel layer sequentially stacked on the second active fin and spaced apart from each other in the vertical direction, the plurality of second channel layers being disposed between the second source region and the second drain region; and a second gate structure extending in the second direction while traversing the second active fin and respectively surrounding the plurality of second channel layers. The first gate structure includes a first gate dielectric in contact with the first active fin and the plurality of first channel layers, respectively, and a first gate electrode in contact with the first gate dielectric. The first gate electrode includes a first lower electrode portion between the first active fin and the first lower channel layer, a first intermediate electrode portion between the first lower channel layer and the first intermediate channel layer, and a first upper electrode portion between the first intermediate channel layer and the first upper channel layer. The second gate structure includes a second gate dielectric in contact with the second active fin and the plurality of second channel layers, respectively, and a second gate electrode in contact with the second gate dielectric. The second gate electrode includes a second lower electrode portion between the second active fin and the second lower channel layer, a second intermediate electrode portion between the second lower channel layer and the second intermediate channel layer, and a second upper electrode portion between the second intermediate channel layer and the second upper channel layer. Vertically adjacent first channel layers among the plurality of first channel layers are spaced apart from each other by a first distance, and the first active fin and the first lower channel layer are spaced apart from each other by a second distance different from the first distance. The first transistor has a first parasitic threshold voltage in the first lower electrode portion and the first active fin, and a first operating threshold voltage between the first intermediate and upper electrode portions and the plurality of first channel layers, and the first parasitic threshold voltage is greater than the first operating threshold voltage.

According to an example embodiment of the present inventive concept, a semiconductor device includes a substrate; a first active fin disposed on the substrate and extending in a first direction, parallel to an upper surface of the substrate; an isolation region on the substrate and on a side surface of the first active fin; a first source region and a first drain region spaced apart from each other in the first direction and on the first active fin; a plurality of first channel layers including a first lower channel layer, a first intermediate channel layer and a first upper channel layer sequentially stacked while being spaced apart from each other in a vertical direction perpendicular to the upper surface of the substrate, on the first active fin, the plurality of first channel layers being disposed between the first source region and the first drain region; and a first gate structure traversing the first active fin and extending in a second direction perpendicular to the first direction, the first gate structure respectively surrounding the plurality of first channel layers. Vertically adjacent first channel layers among the plurality of first channel layers are spaced apart from each other by a first distance, the first active fin and the first lower channel layer are spaced apart from each other by a second distance different from the first distance, the first gate structure includes a first gate dielectric in contact with the first active fin and each of the plurality of first channel layers, and a first gate electrode in contact with the first gate dielectric, the first gate electrode includes a first lower electrode portion between the first active fin and the first lower channel layer, a first intermediate electrode portion between the first lower channel layer and the first intermediate channel layer, and a first upper electrode portion between the first intermediate channel layer and the first upper channel layer, the first intermediate electrode portion and the first upper electrode portion have a first work function equal to each other, and the first lower electrode portion has a second work function different from the first work function.

According to an example embodiment of the present inventive concept, a semiconductor device includes a substrate; an active fin on the substrate and extending in a first direction parallel to an upper surface of the substrate; an isolation region disposed on the substrate and disposed on a side surface of the active fin; and a transistor disposed on the active fin. The transistor includes a source region and a drain region spaced apart from each other in the first direction on the active fin, a plurality of channel layers including a lower channel layer, an intermediate channel layer and an upper channel layer sequentially stacked while being spaced apart from each other on the active fin, in a vertical direction perpendicular to the upper surface of the substrate, the plurality of channel layers being disposed between the source region and the drain region, and a gate structure traversing the active fin and extending in a second direction perpendicular to the first direction, the gate structure respectively surrounding the plurality of channel layers. The gate structure includes a gate dielectric in contact with the active fin and each of the plurality of channel layers, and a gate electrode in contact with the gate dielectric. The gate electrode includes a lower electrode portion between the active fin and the lower channel layer, an intermediate electrode portion between the lower channel layer and the intermediate channel layer, and an upper electrode portion between the intermediate channel layer and the upper channel layer. The gate electrode includes a work function adjusting metal element. A content of the work function adjusting metal element in the lower electrode portion is different from a content of the work function adjusting metal element in each of the intermediate electrode portion and the upper electrode portion.

BRIEF DESCRIPTION OF THE DRAWINGS

The above and other aspects and features of the present inventive concept will be more clearly understood from the following detailed description, taken in conjunction with the accompanying drawings, in which:

FIGS. 22A to 22C are cross-sectional views schematically illustrating a modified example of a method of forming a semiconductor device according to an example embodiment of the present inventive concept.

Figure 1:
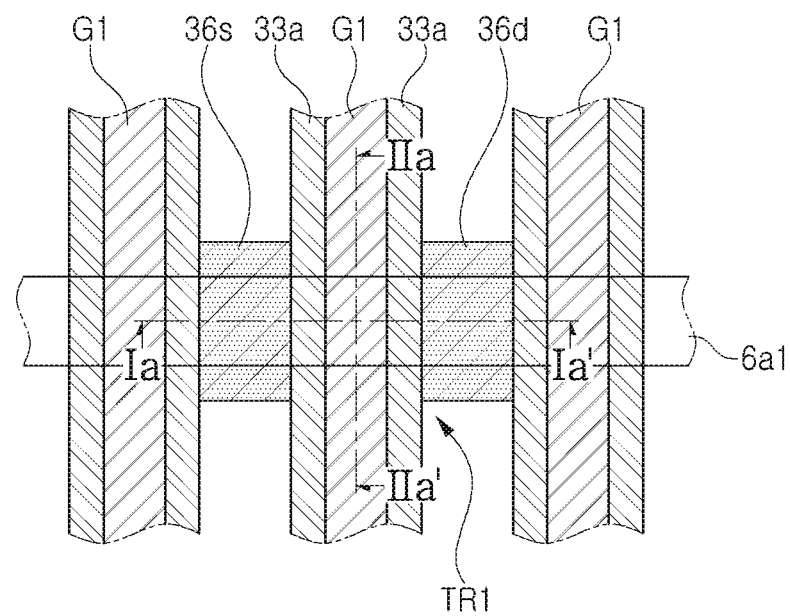
FIG. 1 is a plan view schematically illustrating a semiconductor device according to an example embodiment of the present inventive concept.
Figure 1:
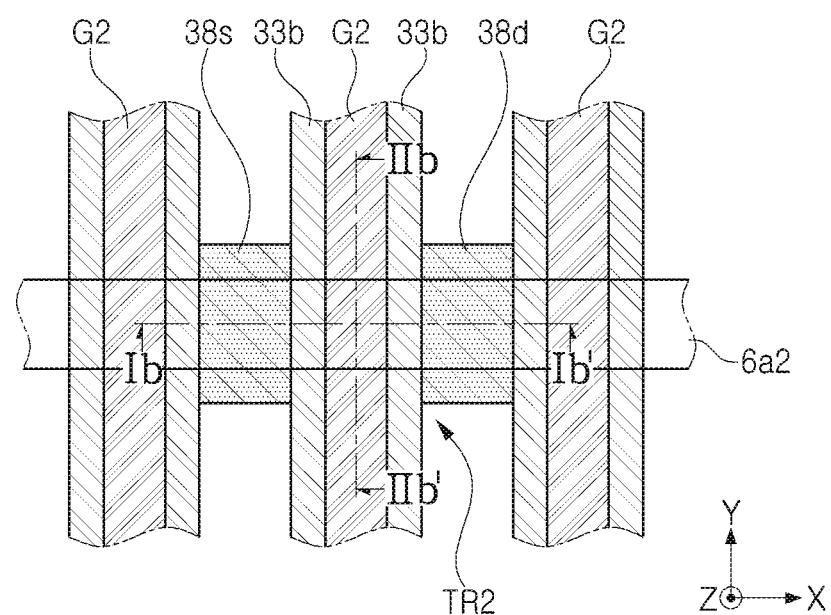

Since the drawings in FIGS. 1-22C are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Hereinafter, illustrative examples of semiconductor devices according to example embodiments of the present inventive concept will be described.

Figure 2A:
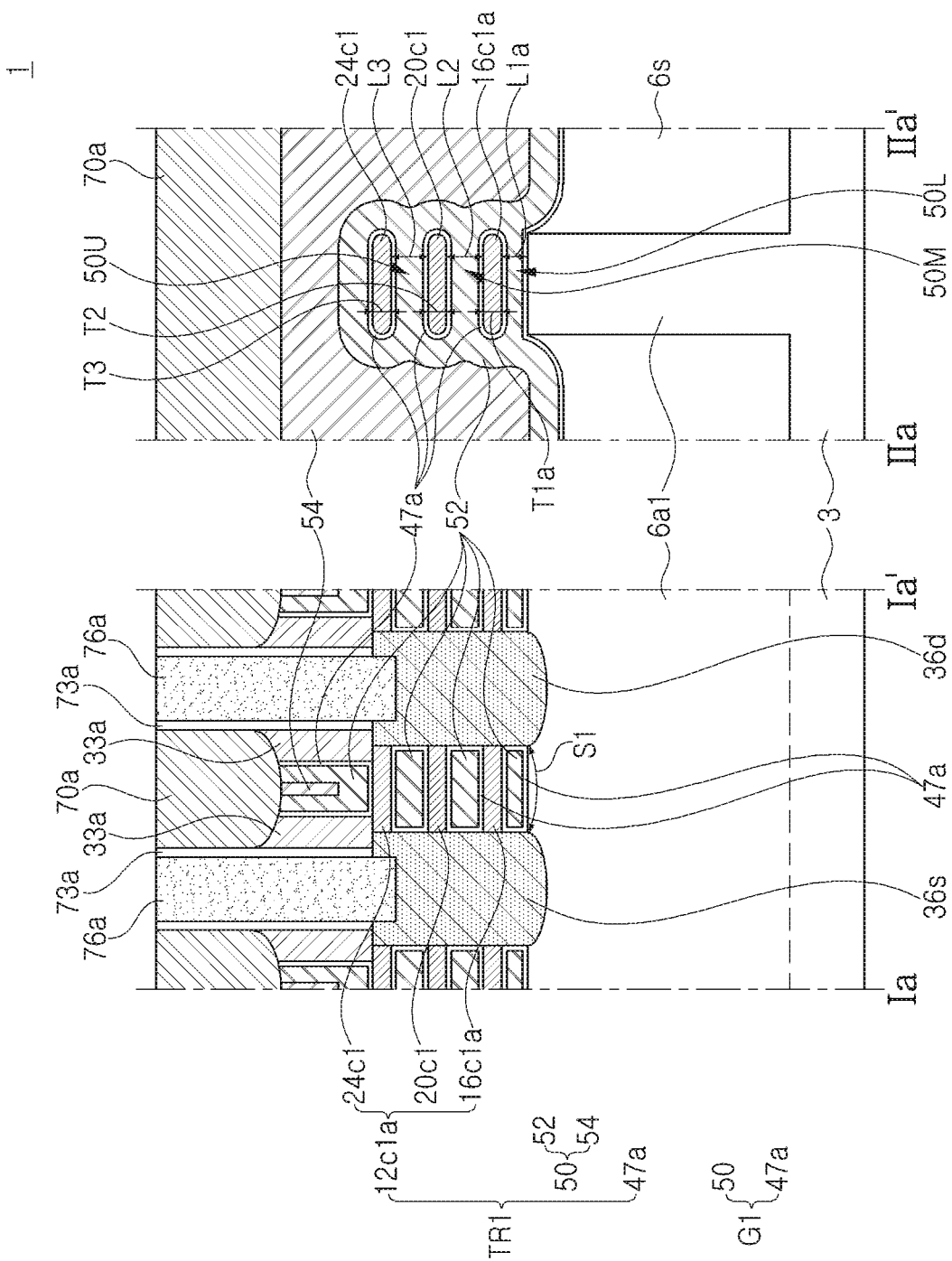
FIGS. 2A and 2B are cross-sectional views schematically illustrating an example of a semiconductor device according to an example embodiment of the present inventive concept.
Figure 2B:
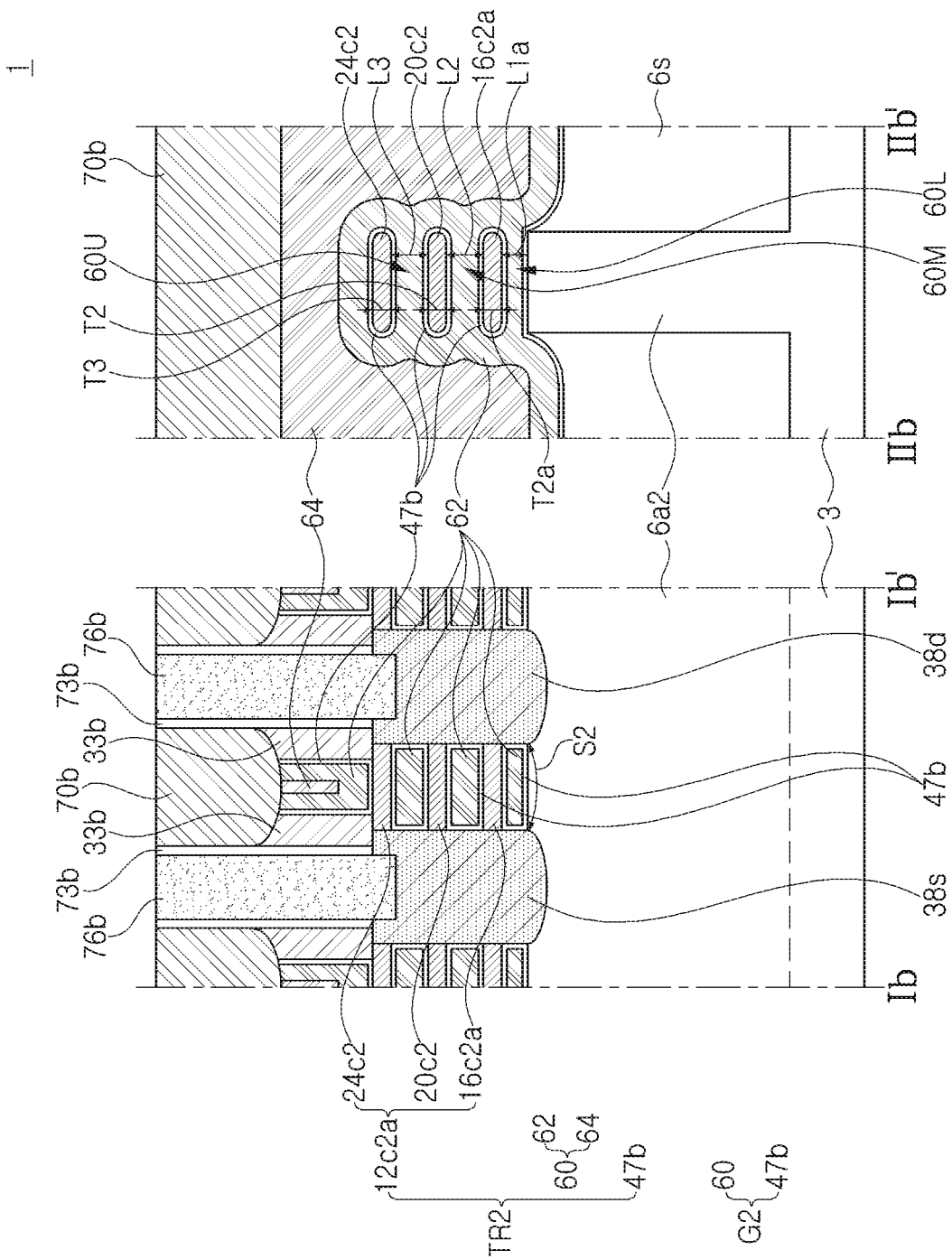

First, an example of a semiconductor device according to an example embodiment of the present inventive concept will be described with reference to FIGS. 1, 2A and 2B. FIG. 1 is a plan view schematically illustrating a semiconductor device according to an example embodiment of the present inventive concept, and FIGS. 2A and 2B are cross-sectional views schematically illustrating an example of a semiconductor device according to an example embodiment of the present inventive concept. In FIGS. 2A and 2B, FIG. 2A is a cross-sectional view schematically illustrating a region taken along lines Ia-Ia' and IIa-IIa' of FIG. 1, and FIG. 2B is a cross-sectional view schematically illustrating a region taken along lines Ib-Ib' and IIb-IIb' of FIG. 1.

Referring to FIGS. 1, 2A, and 2B, a semiconductor device 1 according to an example embodiment of the present inventive concept may include a substrate 3, a first active fin 6a1 and a second active fin 6a2 on the substrate 3, a first transistor TR1 on the first active fin 6a1, and a second transistor TR2 on the second active fin 6a2. The substrate 3 may be a semiconductor substrate. For example, the substrate 3 may be a single crystal semiconductor substrate that may be formed of a semiconductor material such as silicon (Si). In contrast, the substrate 3 may be a silicon (Si) substrate or may include, but is not limited to, SOI (silicon-on-insulator), silicon germanium (SiGe), SGOI (silicon germanium on insulator), indium antimonide (InSb), lead tellurium (PbTe) compounds, indium arsenide (InAs), indium phosphide (InP), gallium arsenide (GaAs), gallium phosphide (GaP), or gallium antimonide (GaSb). Also, the substrate 3 may include one or more semiconductor layers or structures and may include active or operable portions of semiconductor devices.

Each of the first and second active fins 6a1 and 6a2 may have a line shape or a bar shape extending in a first direction (X-direction). The first direction (X-direction) may be parallel to an upper surface of the substrate 3. The first and second active fins 6a1 and 6a2 may respectively protrude from the substrate 3 in a vertical direction (Z-direction) perpendicular to the upper surface of the substrate 3.

The semiconductor device 1 may further include an isolation region 6s disposed on side surfaces of the first and second active fins 6a1 and 6a2, and defining the first and second active fins 6a1 and 6a2. The isolation region 6s may be formed of an insulating material such as, for example, silicon oxide ($SiO_2$).

The first transistor TR1 may include a first source region 36s and a first drain region 36d spaced apart from each other in the first direction (X-direction) on the first active fin 6a1, a plurality of first channel layers 12c1a stacked on the first active fin 6a1 while being spaced apart from each other in the vertical direction (Z-direction) and disposed between the first source region 36s and the first drain region 36d, and a first gate structure G1 that traverses the first active fin 6a1, extends in a second direction (Y-direction), and respectively surrounds the plurality of first channel layers 12c1a. The second direction (Y-direction) may be parallel to the upper surface of the substrate 3 and may be perpendicular to the first direction (X-direction). The plurality of first channel layers 12c1a may be connected to the first source region 36s and the first drain region 36d. In other words, the first source region 36s and the first drain region 36d may be connected to each other by the plurality of first channel layers 12c1a interposed therebetween.

The second transistor TR2 may include a second source region 38s and a second drain region 38d spaced apart from each other in the first direction (X-direction) on the second active fin 6a2, a plurality of second channel layers 12c2a that are stacked on the second active fin 6a2 while being spaced apart from each other in the vertical direction (Z-direction) and disposed between the second source region 38s and the second drain region 38d, and a second gate structure G2 that traverses the second active fin 6a2, extends in the second direction (Y-direction), and respectively surrounds the plurality of second channel layers 12c2a. The plurality of second channel layers 12c2a may be connected to the second source region 38s and the second drain region 38d. In other words, the second source region 38s and the second drain region 38d may be connected to each other by the plurality of second channel layers 12c2a interposed therebetween.

The first transistor TR1 may be an N-channel metal-oxide semiconductor (NMOS) transistor. For example, the first source region 36s and the first drain region 36d may have N-type conductivity. In an example embodiment of the present inventive concept, the first source region 36s and the first drain region 36d may be formed of or include single-crystalline silicon (sc-Si). Alternatively, the first source region 36s and the first drain region 36d may include silicon carbide (SiC). The plurality of first channel layers 12c1a may be formed of a silicon (Si) material. For example, the plurality of first channel layers 12c1a may be formed of an undoped silicon (Si) material. The first active fin 6a1 may have P-type conductivity.

The plurality of first channel layers 12c1a may include at least three channel layers stacked while being spaced apart from each other in the vertical direction (Z-direction). For example, the plurality of first channel layers 12c1a may include a first lower channel layer 16c1a, a first intermediate channel layer 20c1, and a first upper channel layer 24c1, sequentially stacked while being spaced apart from each other in the vertical direction (Z-direction).

In an example embodiment of the present inventive concept, the plurality of first channel layers 12c1a may include three channel layers stacked while being spaced apart from each other in the vertical direction (Z-direction), but the present inventive concept is not limited thereto. For example, the plurality of first channel layers 12c1a may include four or more channel layers stacked while being spaced apart from each other in the vertical direction (Z-direction).

Vertically adjacent first channel layers among the plurality of first channel layers 12c1a may be spaced apart from each other by first distances L2 and L3. The separation distance L2 between the first lower channel layer 16c1a and the first intermediate channel layer 20c1, and the separation distance L3 between the first intermediate channel layer 20c1 and the first upper channel layer 24c1 may be substantially the same. The first active fin 6a1 and the first lower channel layer 16c1a may be spaced apart from each other by a second distance L1a that is different from the first distances L2 and L3.

The second transistor TR2 may be a P-channel metal-oxide semiconductor (PMOS) transistor. For example, the second source region 38s and the second drain region 38d may have a P-type conductivity. In an example embodiment of the present inventive concept, the second source region 38s and the second drain region 38d may include a semiconductor material (e.g., SiGe) having a lattice constant greater than that of a semiconductor element (e.g., Si) of the substrate 3, but the present inventive concept is not limited thereto. The plurality of second channel layers 12c2a may be formed of a silicon (Si) material. For example, the plurality of second channel layers 12c2a may be formed of an undoped silicon (Si) material.

The plurality of second channel layers 12c2a may include at least three channel layers stacked while being spaced apart from each other in the vertical direction (Z-direction). For example, the plurality of second channel layers 12c2a may include a second lower channel layer 16c2a, a second intermediate channel layer 20c2, and a second upper channel layer 24c2 sequentially stacked while being spaced apart from each other in the vertical direction (Z-direction).

In an example embodiment of the present inventive concept, the plurality of second channel layers 12c2a may include three channel layers stacked while being spaced apart from each other in the vertical direction (Z-direction), but the present inventive concept is not limited thereto. For example, the plurality of second channel layers 12c2a may include four or more channel layers stacked while being spaced apart from each other in the vertical direction (Z-direction).

Vertically adjacent second channel layers among the plurality of second channel layers 12c2a may be spaced apart from each other by the first distances L2 and L3. The second active fin 6a2 and the second lower channel layer 16c2a may be spaced apart from each other by the second distance L1a.

The second distance L1a may be smaller than the first distances L2 and L3.

The second distance L1a may have a size equal to or greater than about 0.6 times and equal to or less than about 0.8 times the first distances L2 and L3.

The term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The plurality of first channel layers 12c1a may have the same thickness T1a, T2, and T3. For example, the first intermediate and upper channel layers 20c1 and 24c1 may have first thicknesses T2 and T3, respectively, and the first lower channel layer 16c1a may have a second thickness T1a the same as the first thicknesses T2 and T3.

The plurality of second channel layers 12c2a may have the same thickness T2a, T2, and T3. For example, the second intermediate and upper channel layers 20c2 and 24c2 may have first thicknesses T2 and T3, respectively, and the second lower channel layer 16c2a may have a second thickness T2a the same as the first thicknesses T2 and T3.

The plurality of first channel layers 12c1a and the plurality of second channel layers 12c2a may each have a thickness of about 0.4 times or more and about 0.6 times or less the first distances L2 and L3.

The first gate structure G1 may include a first gate dielectric 47a in contact with the first active fin 6a1 and each of the plurality of first channel layers 12c1a, and a first gate electrode 50 in contact with the first gate dielectric 47a. The first gate dielectric 47a may include silicon oxide ($SiO_2$) and/or a high-k dielectric. The high-k dielectric may be formed of or include at least one of high-k dielectric materials whose dielectric constants are higher than that of silicon oxide ($SiO_2$). For example, the high-k dielectric material may include at least one of, for example, hafnium oxide ($HfO_2$), hafnium silicon oxide ($HfSiO_4$), hafnium zirconium oxide ($HfZrO_4$), hafnium tantalum oxide ($Hf_2Ta_2O_9$), hafnium aluminum oxide ($HfAlO_3$), lanthanum oxide ($La_2O_3$), lanthanum aluminum oxide ($LaAlO_3$), zirconium oxide ($ZrO_2$), zirconium silicon oxide ($ZrSiO_4$), tantalum oxide ($Ta_2O_5$), titanium oxide ($TiO_2$), barium strontium titanium oxide ($BaSrTi_2O_6$), barium titanium oxide ($BaTiO_3$), strontium titanium oxide ($SrTiO_3$), lithium oxide ($Li_2O$), aluminum oxide ($Al_2O_3$), lead scandium tantalum oxide ($Pb(Sc,Ta)O_3$), or lead zinc niobate [$Pb(Zn_{1/3}Nb_{2/3})O_3$]. The first gate dielectric 47a may extend onto a side surface of the first gate electrode 50.

The second gate structure G2 may include a second gate dielectric 47b in contact with the second active fin 6a2 and each of the plurality of second channel layers 12c2a, and a second gate electrode 60 in contact with the second gate dielectric 47b. The second gate dielectric 47b may include silicon oxide ($SiO_2$) and/or a high-k dielectric. The second gate dielectric 47b may extend onto a side surface of the second gate electrode 60.

The first gate electrode 50 may include a first lower electrode portion 50L between the first active fin 6a1 and the first lower channel layer 16c1a, a first intermediate electrode portion 50M between the first lower channel layer 16c1a and the first intermediate channel layer 20c1, and a first upper electrode portion 50U between the first intermediate channel layer 20c1 and the first upper channel layer 24c1.

The second gate electrode 60 may include a second lower electrode portion 60L between the second active fin 6a2 and the second lower channel layer 16c2a, a second intermediate electrode portion 60M between the second lower channel layer 16c2a and the second intermediate channel layer 20c2, and a second upper electrode portion 60U between the second intermediate channel layer 20c2 and the second upper channel layer 24c2.

The first transistor TR1 may have a first parasitic threshold voltage at the first lower electrode portion 50L and the first active fin 6a1, and may have a first operating threshold voltage between the first intermediate and upper electrode portions 50M and 50U and the plurality of first channel layers 12c1a. The first transistor TR1 may include a parasitic transistor in which a parasitic channel S1 is formed in the first active fin 6a1. For example, the parasitic channel S1 may be formed in the first active fin 6a1 under the first lower electrode portion 50L between the first source region 36s and the first drain region 36d. In this case, the parasitic transistor may have the first parasitic threshold voltage. The first parasitic threshold voltage may be greater than the first operating threshold voltage. In this case, the first operating threshold voltage is not high enough to induce the formation of the parasitic channel S1 in the first active fin 6a1 under the first lower electrode portion 50L. Accordingly, at the first operating threshold voltage at which the first transistor TR1 operates, the parasitic channel S1 is not formed in the first active fin 6a1, and thus, the operating threshold voltage distribution of the first transistor TR1 may be enhanced.

The first gate electrode 50 may include a first material layer 52 and a second material layer 54 on the first material layer 52. The first material layer 52 may surround the plurality of respective first channel layers 12c1a and fill between vertically adjacent first channel layers among the plurality of first channel layers 12c1a, and may also fill a space between the first active fin 6a1 and the first lower channel layer 16c1a. For example, the first lower, intermediate and upper electrode portions 50L, 50M and 50U may be formed of the first material layer 52.

The first material layer 52 may be an NMOS work function metal layer. For example, the first material layer 52 may include at least one of, for example, titanium aluminum carbide (TiAlC), titanium aluminum nitride (TiAlN), or tantalum aluminum carbide (TaAlC). The first gate electrode 50 may include a work function adjusting metal element. The content of the work function adjusting metal element in the first lower electrode portion 50L may be lower than the content of the work function adjusting metal element in each of the first intermediate electrode portion 50M and the first upper electrode portion 50U. In the NMOS work function metal layer of the first material layer 52, the work function adjusting metal element may be an aluminum (Al) element.

The second material layer 54 may be formed of an NMOS work function metal layer or another metal layer. For example, the second material layer 54 may include at least one of, for example, titanium (Ti), tantalum (Ta), tungsten (W), molybdenum (Mo), titanium nitride (TiN), tantalum nitride (TaN), tungsten nitride (WN), titanium aluminide (TiAl), titanium aluminum carbide (TiAlC), titanium aluminum nitride (TiAlN), or tantalum aluminum nitride (TaAlN).

In an example embodiment of the present inventive concept, the "NMOS work function metal layer" may be defined as a metal layer capable of adjusting or controlling the threshold voltage of the NMOS transistor.

The content of the work function adjusting metal element in the first lower electrode portion 50L may be lower than the content of the work function adjusting metal element in each of the first intermediate electrode portion 50M and the first upper electrode portion 50U. A work function of the first lower electrode portion 50L may be greater than a work function of each of the first intermediate electrode portion 50M and the first upper electrode portion 50U. For example, in an example, the first intermediate electrode portion 50M and the first upper electrode portion 50U may have work functions equal to each other. Accordingly, in the first transistor TR1, the first parasitic threshold voltage of the parasitic transistor having the parasitic channel S1 in the first active fin 6a1 may be greater than the first operating threshold voltage.

The first lower channel layer 16c1a among the plurality of first channel layers 12c1a and the first active fin 6a1 may be spaced apart by the second distance L1a smaller than the first distances L2 and L3, while the work function of the first lower electrode portion 50L interposed between the first lower channel layer 16c1a and the first active fin 6a1 may be relatively increased. Due to the increased work function of the first lower electrode portion 50L, the first parasitic threshold voltage of the parasitic transistor having the parasitic channel S1 in the first active fin 6a1 under the first lower electrode portion 50L may be higher than the first operating threshold voltage. Thus, the first operating threshold voltage is not high enough to induce the formation of the parasitic channel S1 in the first active fin 6a1 under the first lower electrode portion 50L. Therefore, a sub-threshold leakage current generated in the first active fin 6a1 in the first transistor TR1 may be significantly reduced or prevented. Accordingly, since the sub-threshold leakage current may be significantly reduced or prevented, the electrical characteristics and performance of the semiconductor device 1 may be enhanced.

The second gate electrode 60 may include a third material layer 62 and a fourth material layer 64 on the third material layer 62. The third material layer 62 surrounds the plurality of respective second channel layers 12c2a and fills between vertically adjacent second channel layers among the plurality of second channel layers 12c2a, and may also fill a space between the second active fin 6a2 and the second lower channel layer 16c2a. For example, the second lower, intermediate and upper electrode portions 60L, 60M and 60U may be formed of the third material layer 62.

The third material layer 62 may be a PMOS work function metal layer. For example, the third material layer 62 may include at least one of, for example, titanium nitride (TiN) or tantalum nitride (TaN). The fourth material layer 64 may be formed of a PMOS work function metal layer or another metal layer. For example, the fourth material layer 64 may include at least one of, for example, titanium (Ti), tantalum (Ta), tungsten (W), molybdenum (Mo), titanium nitride (TiN), tantalum nitride (TaN), tungsten nitride (WN), titanium aluminide (TiAl), titanium aluminum carbide (TiAlC), titanium aluminum nitride (TiAlN), or tantalum aluminum nitride (TaAlN).

In an example embodiment of the present inventive concept, the "PMOS work function metal layer" may be defined as a metal layer capable of adjusting or controlling the threshold voltage of the PMOS transistor.

In an example embodiment of the present inventive concept, the "PMOS work function metal layer" may have a higher work function than that of the "NMOS work function metal layer".

The second transistor TR2 may have enhanced electrical characteristics and performance similar to those of the first transistor TR1. For example, as the content of the PMOS work function adjusting metal element in the second lower electrode portion 60L is lower than the content of the PMOS work function adjusting metal element of each of the second intermediate electrode portion 60M and the second upper electrode portion 60U, a work function of the second lower electrode portion 60L may be lower than a work function of each of the second intermediate electrode portion 60M and the second upper electrode portion 60U (for example, in an example, the second intermediate electrode portion 60M and the second upper electrode portion 60U may have work functions equal to each other), and accordingly, the absolute value of the second parasitic threshold voltage of the parasitic transistor that uses the second active fin 6a2 as a channel S2 in the second transistor TR2 may be greater than the absolute value of the second operating threshold voltage of the second transistor TR2. Thus, the absolute value of the second operating threshold voltage is not high enough to induce the formation of the parasitic channel S2 in the second active fin 6a2 under the second lower electrode portion 60L between the second source region 38s and the second drain region 38d. Therefore, a sub-threshold leakage current generated in the second active fin 6a2 in the second transistor TR2 may be significantly reduced or prevented. Accordingly, since the sub-threshold leakage current may be significantly reduced or prevented, the electrical characteristics and performance of the semiconductor device 1 may be enhanced.

The semiconductor device 1 may further include first insulating spacers 33a on side surfaces of the first gate structure G1, a first insulating capping layer 70a on the first gate structure G1 and the first insulating spacers 33a, second insulating spacers 33b on side surfaces of the second gate structure G2, a second insulating capping layer 70b on the second gate structure G2 and the second insulating spacers 33b, first contact plugs 76a on the first source region 36s and the first drain region 36d, and second contact plugs 76b on the second source region 38s and the second drain region 38d. The semiconductor device 1 may further include first insulating patterns 73a in contact with side surfaces of the first contact plugs 76a, and second insulating patterns 73b in contact with side surfaces of the second contact plugs 76b.

Next, various modifications of the semiconductor device 1 according to an example embodiment of the present inventive concept described above will be described. Hereinafter, in describing various modified examples of the above-described semiconductor device 1, the modified or replaced components among the aforementioned components of the semiconductor device 1 will be mainly described. For example, in any one of the transistors described above, when any one component constituting the transistor is modified, the modified component of the transistor will be mainly described.

Figure 3A:
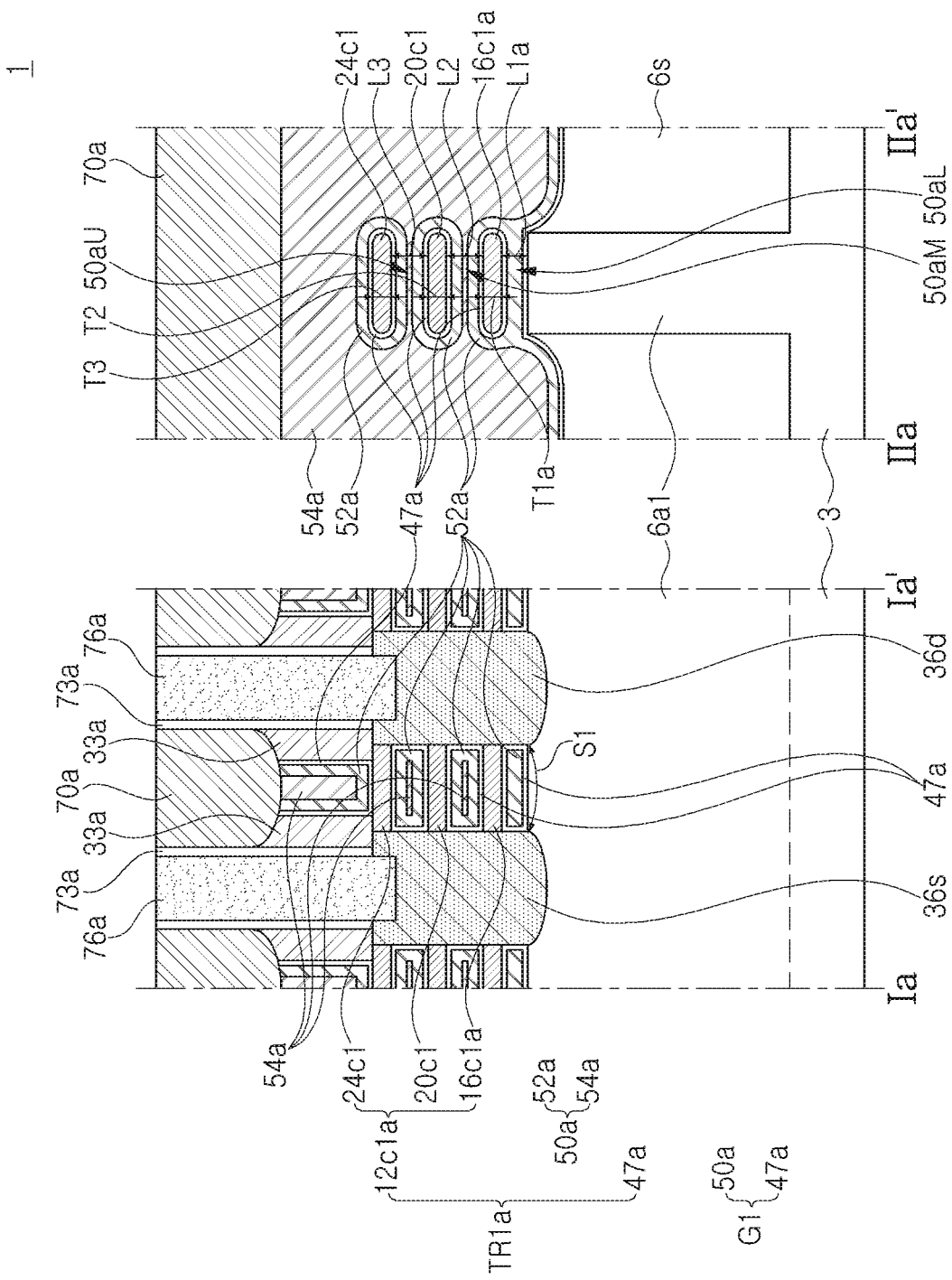
FIGS. 3A and 3B are cross-sectional views schematically illustrating a modified example of a semiconductor device according to an example embodiment of the present inventive concept.
Figure 3B:
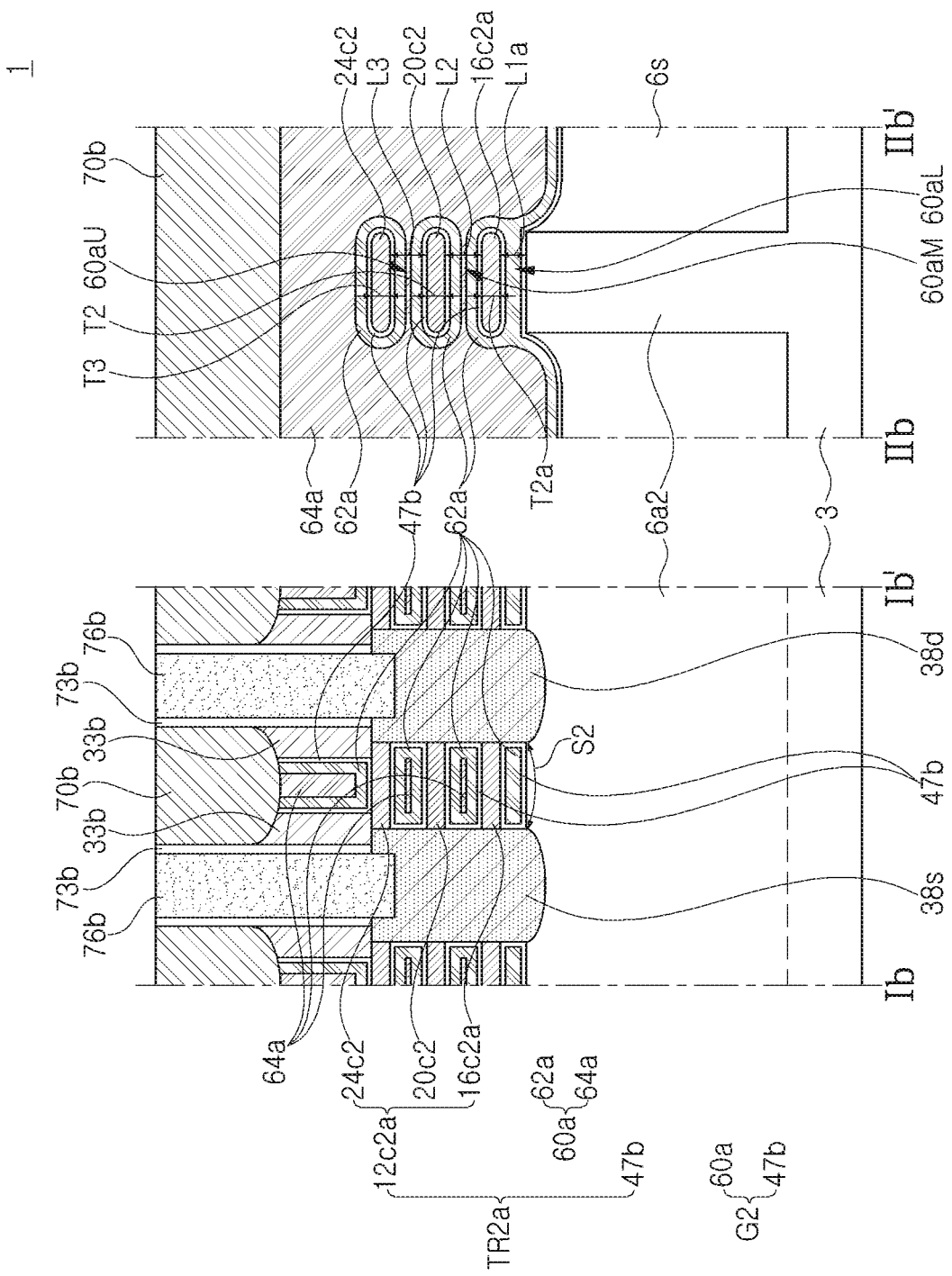

First, a modified example of a semiconductor device according to an example embodiment of the present inventive concept will be described with reference to FIGS. 3A and 3B. FIGS. 3A and 3B are cross-sectional views schematically illustrating a modified example of a semiconductor device according to an example embodiment of the present inventive concept. In FIGS. 3A and 3B, FIG. 3A is a cross-sectional view schematically illustrating regions taken along lines Ia-Ia' and IIa-IIa' of FIG. 1, and FIG. 3B is a cross-sectional view schematically illustrating regions taken along lines Ib-Ib' and IIb-IIb' of FIG. 1.

Referring to FIGS. 1, 3A and 3B, the first transistor TR1a that may be modified from the first transistor (TR1 of FIG. 2A) described above may include a first gate electrode 50a that includes first material layers 52a surrounding the plurality of respective first channel layers 12c1a and spaced apart from each other in the vertical direction (Z-direction), and a second material layer 54a on the first material layers 52a and in contact with the first material layers 52a. The second material layer 54a may be interposed between two adjacent first material layers 52a. Here and throughout the specification, two or more the same material layers may also be described as portions of the material layer. For example, the above description may also be expressed as "The second material layer 54a may be interposed between two adjacent portions of the first material layer 52a." The first material layer 52a may cover the first active fin 6a1.

The first gate electrode 50a may include a first lower electrode portion 50aL at a position corresponding to the first lower electrode portion 50L in FIG. 2A, a first intermediate electrode portion 50aM at a position corresponding to the first intermediate electrode portion 50M in FIG. 2A, and a first upper electrode portion 50aU at a position corresponding to the first upper electrode portion 50U in FIG. 2A.

The first lower electrode portion 50aL may be formed of the first material layer 52a, and the first intermediate electrode portion 50aM and the first upper electrode portion 50aU may each be formed of the first material layer 52a and the second material layer 54a. For example, the second material layer 54a may fill a space between a portion of the first material layers 52a covering an upper surface of the first lower channel layer 16c1a and a portion of the first material layers 52a covering a lower surface of the first intermediate channel layer 20c1, while simultaneously filling a space between a portion of the first material layers 52a covering an upper surface of the first intermediate channel layer 20c1 and a portion of the first material layers 52a covering a lower surface of the first upper channel layer 24c1.

The content of the work function adjusting metal element in the first lower electrode portion 50aL may be lower than the content of the work function adjusting metal element in each of the first intermediate electrode portion 50aM and the first upper electrode portion 50aU. A work function of the first lower electrode portion 50aL may be greater than a work function of each of the first intermediate electrode portion 50aM and the first upper electrode portion 50aU. Accordingly, substantially the same as the first transistor TR1 in FIG. 2A, the first parasitic threshold voltage in the first transistor TR1a may be greater than the first operating threshold voltage.

The first material layer 52a may be a first NMOS work function metal layer, and the second material layer 54a may be a second NMOS work function metal layer. The first material layer 52a may include at least one of, for example, titanium aluminum carbide (TiAlC), titanium aluminum nitride (TiAlN), or tantalum aluminum carbide (TaAlC). The second material layer 54a may include at least one of, for example, titanium (Ti), tantalum (Ta), tungsten (W), molybdenum (Mo), titanium nitride (TiN), tantalum nitride (TaN), tungsten nitride (WN), titanium aluminide (TiAl), titanium aluminum carbide (TiAlC), titanium aluminum nitride (TiAlN), or tantalum aluminum carbide (TaAlC).

Similar to the first transistor (TR1 in FIG. 2A) described with reference to FIG. 2A above, the first lower channel layer 16c1a from among the plurality of first channel layers 12c1a and the first active fin 6a1 may be separated by the second distance L1a that is smaller than the first distances L2 and L3, and the work function of the first lower electrode portion 50aL interposed between the first lower channel layer 16c1a and the first active fin 6a1 may be relatively increased. Due to the increased work function of the first lower electrode portion 50aL, the first parasitic threshold voltage of the parasitic transistor having the parasitic channel S1 in the first active fin 6a1 under the first lower electrode portion 50aL may be higher than the first operating threshold voltage. Thus, the first operating threshold voltage is not high enough to induce the formation of the parasitic channel S1 in the first active fin 6a1 under the first lower electrode portion 50aL. Therefore, a sub-threshold leakage current generated in the first active fin 6a1 in the first transistor TR1a may be significantly reduced or prevented. Accordingly, since the sub-threshold leakage current may be significantly reduced or prevented, the electrical characteristics and performance of the semiconductor device 1 may be enhanced.

The second transistor TR2a that may be modified from the above-described second transistor (TR2 in FIG. 2B) may include third material layers 62a surrounding each of the plurality of second channel layers 12c2a and spaced apart from each other in the vertical direction (Z-direction), and a fourth material layer 64a on the third material layers 62a. The fourth material layer 64a may be interposed between two adjacent third material layers 62a. The third material layer 62a may cover the second active fin 6a2.

The third material layer 62a may be a PMOS work function metal layer. For example, the third material layer 62a may include at least one of, for example, titanium nitride (TiN) or tantalum nitride (TaN). The fourth material layer 64a may be formed of a PMOS work function metal layer or another metal layer. For example, the fourth material layer 64a may include at least one of, for example, titanium (Ti), tantalum (Ta), tungsten (W), molybdenum (Mo), titanium nitride (TiN), tantalum nitride (TaN), tungsten nitride (WN), titanium aluminide (TiAl), titanium aluminum carbide (TiAlC), titanium aluminum nitride (TiAlN), or tantalum aluminum nitride (TaAlN).

Figure 4:
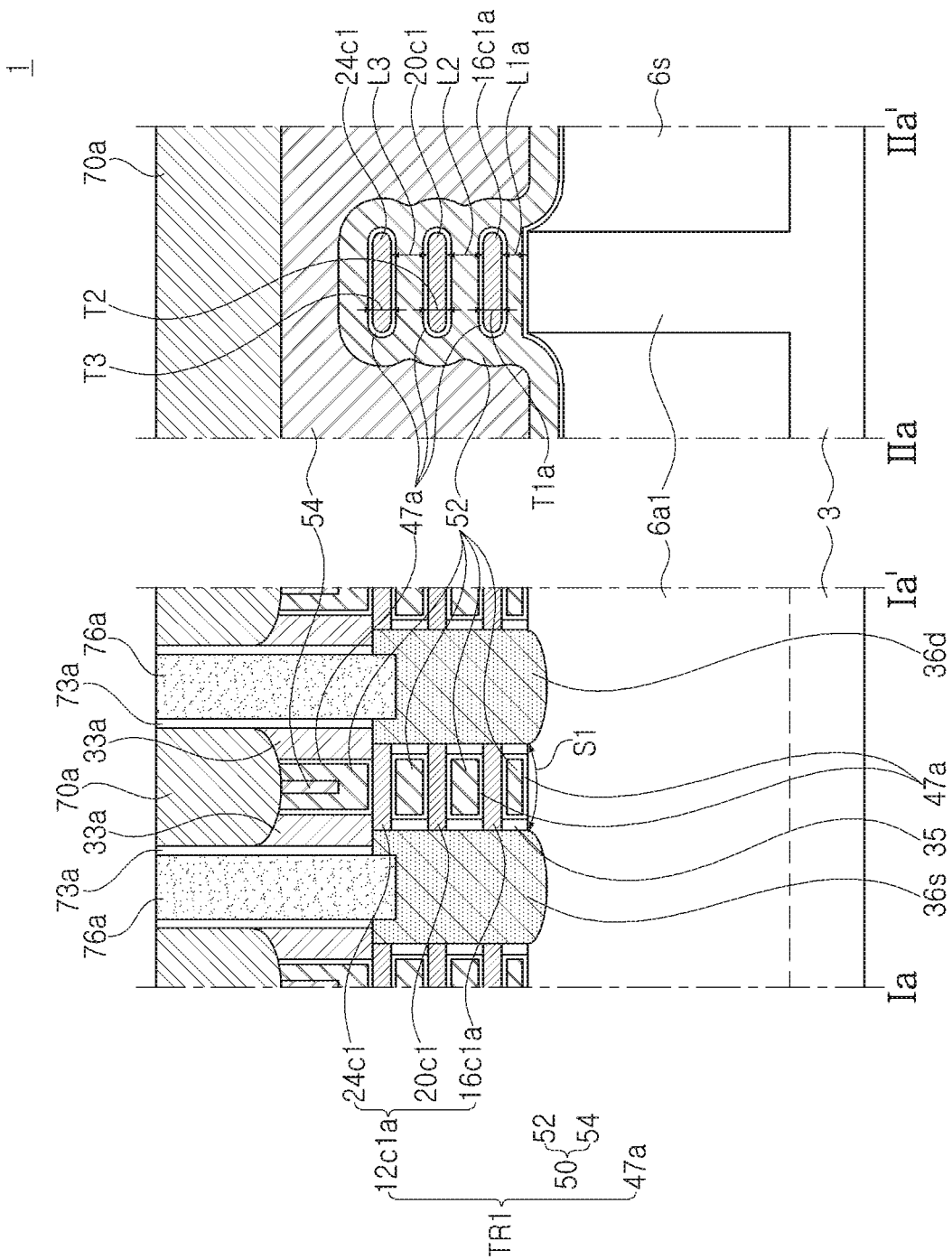
FIG. 4 is a cross-sectional view schematically illustrating a modified example of a semiconductor device according to an example embodiment of the present inventive concept.

Next, a modified example of a semiconductor device according to an example embodiment of the present inventive concept will be described with reference to FIG. 4. FIG. 4 is a cross-sectional view schematically illustrating a modified example of a semiconductor device according to an example embodiment of the present inventive concept, and is a cross-sectional view schematically illustrating a region taken along lines Ia-Ia' and IIa-IIa' of FIG. 1.

Referring to FIGS. 1 and 4, a semiconductor device 1 according to an example embodiment of the present inventive concept may further include inner insulating spacers 35 disposed between portions of the first gate structure G1 positioned below the plurality of respective first channel layers 12c1a and the first source and drain regions 36s and 36d.

Figure 5A:
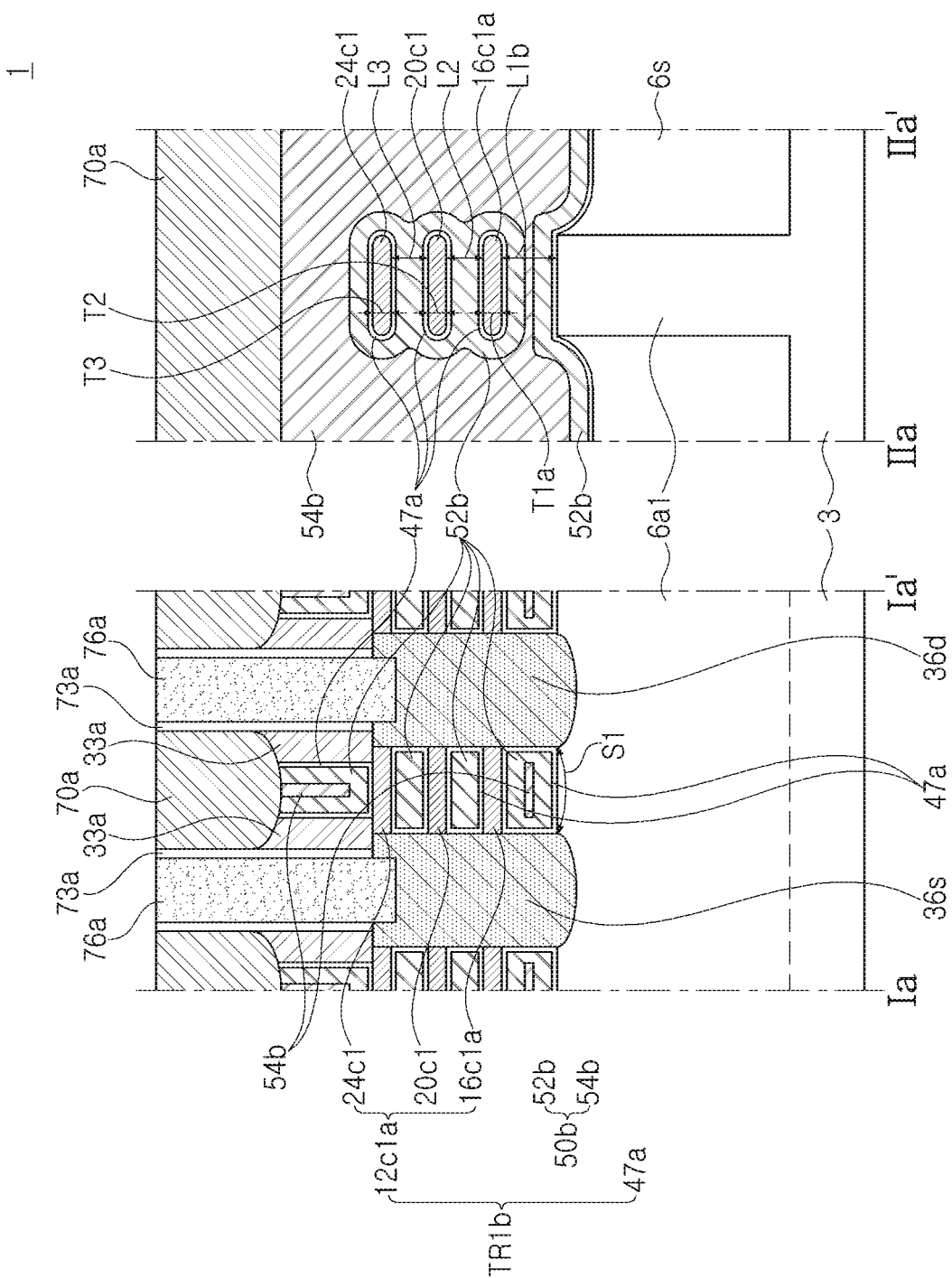
FIGS. 5A and 5B are cross-sectional views schematically illustrating a modified example of a semiconductor device according to an example embodiment of the present inventive concept.
Figure 5B:
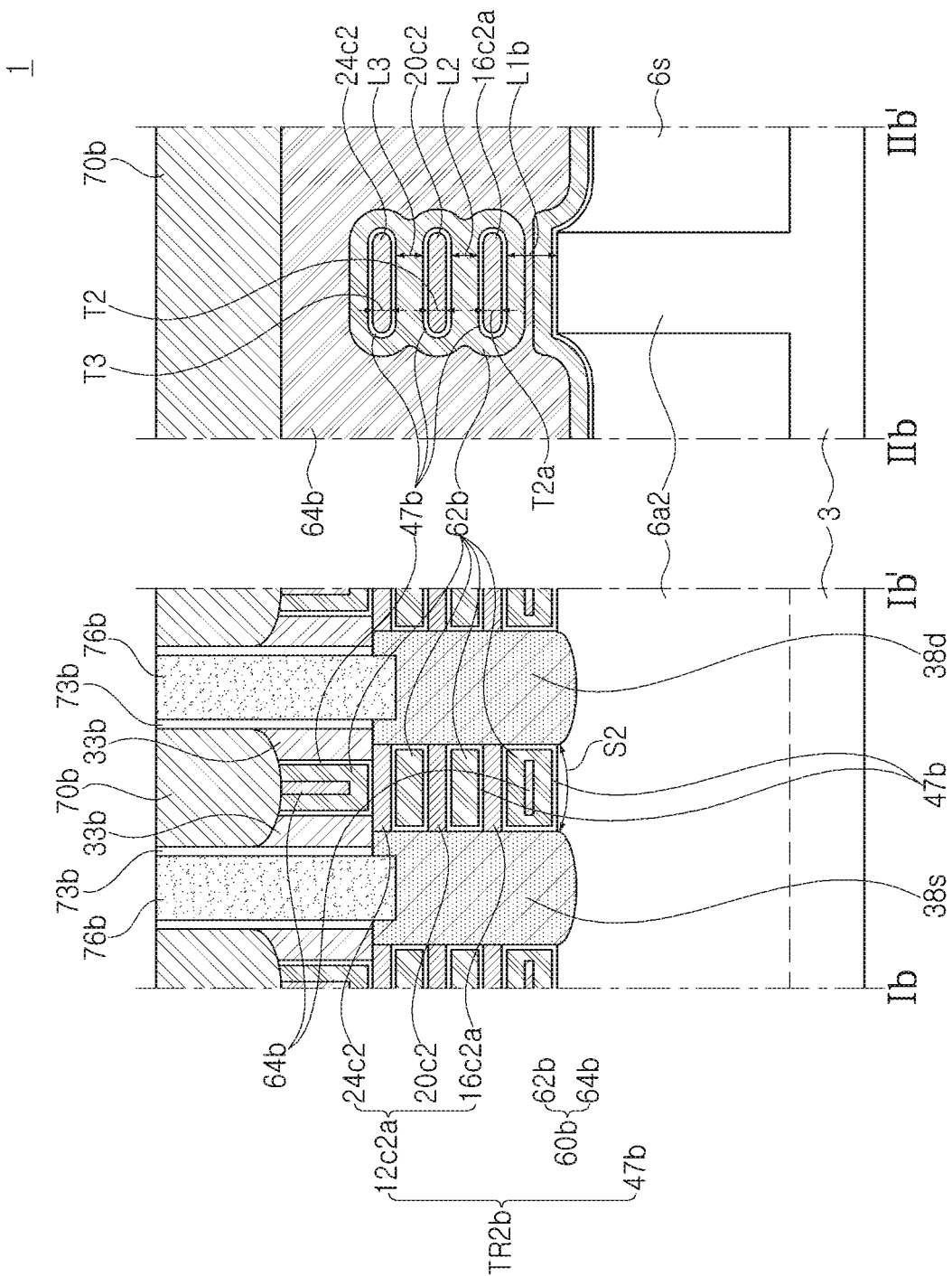

Next, a modified example of a semiconductor device according to an example embodiment of the present inventive concept will be described with reference to FIGS. 5A and 5B. FIGS. 5A and 5B are cross-sectional views schematically illustrating a modified example of a semiconductor device according to an example embodiment of the present inventive concept. In FIGS. 5A and 5B, FIG. 5A is a cross-sectional view schematically illustrating an area taken along lines Ia-Ia' and IIa-IIa' of FIG. 1, and FIG. 5B is a cross-sectional view schematically illustrating a region taken along lines Ib-Ib' and IIb-IIb' of FIG. 1.

Referring to FIGS. 1, 5A and 5B, in the first transistor TR1b that may be modified from the first transistor (TR1 in FIG. 2A) described above, vertically adjacent first channel layers among the plurality of first channel layers 12c1a may be spaced apart by the first distances L2 and L3, and the first lower channel layer 16c1a among the plurality of first channel layers 12c1a and the first active fin 6a1 may be separated by a third distance L1b greater than the first distances L2 and L3.

In the second transistor TR2b that may be modified from the aforementioned second transistor TR2 in FIG. 2B, vertically adjacent second channel layers among the plurality of second channel layers 12c2a may be spaced apart from each other by the first distances L2 and L3, and the second active fin 6a2 and the second lower channel layer 16c2a may be spaced apart by the third distance L1b.

The first transistor TR1b may include a first gate electrode 50b including a first material layer 52b surrounding each of the plurality of first channel layers 12c1a and covering the first active fin 6a1, and a second material layer 54b disposed on the first material layer 52b and contacting the first material layer 52b. In the first material layer 52b, portions surrounding the plurality of respective first channel layers 12c1a may be connected to each other, and a portion surrounding each of the plurality of first channel layers 12c1a and a portion covering the first active fins 6a1 may be spaced apart from each other. The second material layer 54b may include a portion interposed between a portion surrounding each of the plurality of first channel layers 12c1a and a portion covering the first active fin 6a1. For example, the second material layer 54b may include a portion interposed between a portion of the first material layer 52b covering the upper surface of the first active fin 6a1 and a portion of the first material layer 52b covering a lower surface of the first lower channel layer 16c1a.

The first gate electrode 50b may include the first material layer 52b and the second material layer 54b at a position corresponding to the first lower electrode portion 50L in FIG. 2A. On the other hand, as illustrated in FIG. 2A, at the first lower electrode portion 50L, the first gate electrode 50 may include the first material layer 52, but may not include the second material layer 54. The first material layer 52b may be an NMOS work function metal layer, and the second material layer 54b may be a PMOS work function metal layer or another metal layer. For example, by forming the second material layer 54b as a PMOS work function metal layer different from that of the first material layer 52b, in the first transistor TR1b, sub-threshold leakage current generated in the first active fin 6a1 may be significantly reduced or prevented. In this case, due to the first gate electrode 50b may include the first material layer 52b having an NMOS work function metal layer and the second material layer 54b having a PMOS work function metal layer to have a higher work function at a position corresponding to the first lower electrode portion 50L in FIG. 2A, the first parasitic threshold voltage of the parasitic transistor having the parasitic channel S1 in the first active fin 6a1 may be higher than the first operating threshold voltage. Thus, the first operating threshold voltage is not high enough to induce the formation of the parasitic channel S1 in the first active fin 6a1, thereby reducing the sub-threshold leakage current generated in the first active fin 6a1. Accordingly, since the sub-threshold leakage current may be significantly reduced or prevented, the electrical characteristics and performance of the semiconductor device 1 may be enhanced.

The second transistor TR2b may include a second gate electrode 60b including a third material layer 62b surrounding each of the plurality of second channel layers 12c2a and covering the second active fin 6a2, and a fourth material layer 64b on the third material layer 62b and in contact with the third material layer 62b. In the third material layer 62b, portions surrounding the plurality of respective second channel layers 12c2a may be connected to each other, and a portion surrounding each of the plurality of second channel layers 12c2a and a portion covering the second active fins 6a2 may be spaced apart from each other. The fourth material layer 64b may include a portion interposed between a portion surrounding each of the plurality of second channel layers 12c2a and a portion covering the second active fin 6a2.

The second gate electrode 60b may include the third material layer 62b and the fourth material layer 64b, at a position corresponding to the second lower electrode portion 60L in FIG. 2B. On the other hand, as illustrated in FIG. 2B, at the second lower electrode portion 60L, the second gate electrode 60 may include the third material layer 62, but may not include the fourth material layer 64.

The third material layer 62b may be a PMOS work function metal layer. The fourth material layer 64b may be an NMOS work function metal layer or another metal layer. For example, the fourth material layer 64b, which may be an NMOS work function metal layer at a position corresponding to the second lower electrode portion 60L in FIG. 2B, may reduce the work function of the lower electrode portion of the second gate electrode 60b at the position corresponding to the second lower electrode portion 60L in FIG. 2B. Thus, the absolute value of the second parasitic threshold voltage of the parasitic transistor that uses the second active fin 6a2 as a channel S2 in the second transistor TR2b may be greater than the absolute value of the second operating threshold voltage of the second transistor TR2b. Therefore, the absolute value of the second operating threshold voltage is not high enough to induce the formation of the parasitic channel S2 in the second active fin 6a2 at the position corresponding to the second lower electrode portion 60L in FIG. 2B between the second source region 38s and the second drain region 38d. Accordingly, in the second transistor TR2b, a sub-threshold leakage current generated in the second active fin 6a2 may be significantly reduced or prevented. Accordingly, since the sub-threshold leakage current of the second transistor TR2b may be significantly reduced or prevented, the electrical characteristics or performance of the semiconductor device 1 may be enhanced.

Figure 6A:
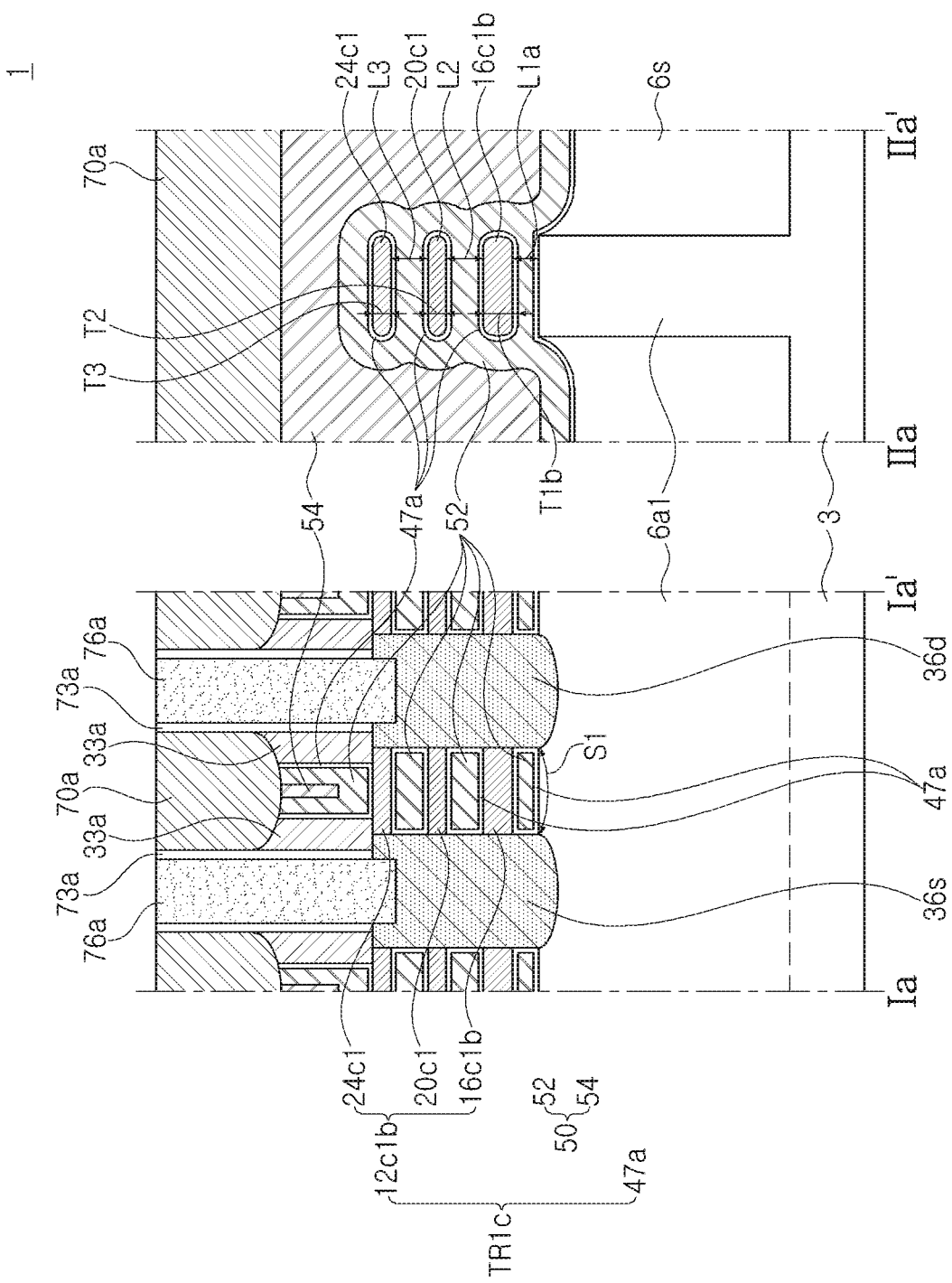
FIGS. 6A and 6B are cross-sectional views schematically illustrating a modified example of a semiconductor device according to an example embodiment of the present inventive concept.
Figure 6B:
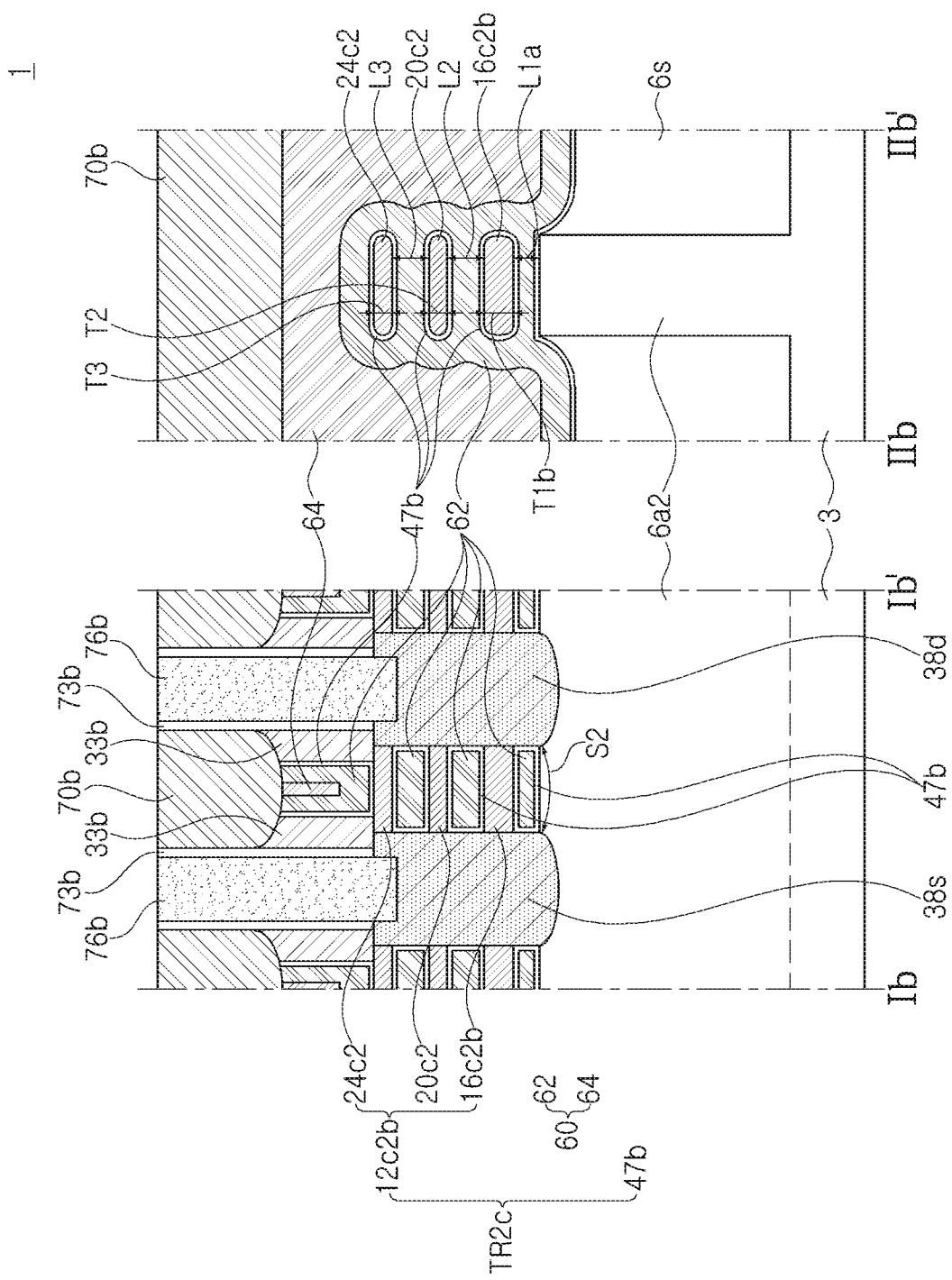

Next, a modified example of a semiconductor device according to an example embodiment of the present inventive concept will be described with reference to FIGS. 6A and 6B. FIGS. 6A and 6B are cross-sectional views schematically illustrating a modified example of a semiconductor device according to an example embodiment of the present inventive concept. In FIGS. 6A and 6B, FIG. 6A is a cross-sectional view schematically illustrating a region taken along lines Ia-Ia' and IIa-IIa' of FIG. 1, and FIG. 6B is a cross-sectional view schematically illustrating a region taken along lines Ib-Ib' and IIb-IIb' of FIG. 1.

Referring to FIGS. 1, 6A, and 6B, in the first transistor TR1c that may correspond to the first transistor TR1 of FIG. 2A described above, the first lower channel layer (16c1a of FIG. 2A) described with reference to FIG. 2A may be replaced with the first lower channel layer (16c1b of FIG. 6A) having an increased thickness. Accordingly, the first transistor TR1c may include a plurality of first channel layers 12c1b including the first lower channel layer (16c1b in FIG. 6A) having an increased thickness and the first intermediate and upper channel layers 20c1 and 24c1 substantially the same as those described with reference to FIG. 2A. For example, the first intermediate and upper channel layers 20c1 and 24c1 may have first thicknesses T2 and T3, respectively, and the first lower channel layer 16c1b may have a second thickness T1b greater than the first thicknesses T2 and T3. By increasing the thickness of the first lower channel layer 16c1b, the amount of current during the operation of the first transistor TR1c may be increased. Accordingly, since the on-current of the first transistor TR1c may be increased, the performance of the semiconductor device 1 may be enhanced.

By increasing the thickness of the first lower channel layer 16c1b, in the first transistor TR1c, a threshold voltage of a transistor in which a channel is formed in the first lower channel layer 16c1b may be changed to be substantially the same as the operating threshold voltage of a transistor in which channels are formed in the first intermediate and upper channel layers 20c and 24c1. Accordingly, the distribution of the operating threshold voltage of the first transistor TR1c may be enhanced.

In the second transistor TR2c that may correspond to the second transistor (TR2 in FIG. 2B) described above, the second lower channel layer (16c2a of FIG. 2B) among the plurality of second channel layers 12c2a may be replaced with a second lower channel layer (16c2b of FIG. 6B) having an increased thickness. Accordingly, the second transistor TR2c may include a plurality of second channel layers 12c2b including the second lower channel layer (16c2b in FIG. 6B) having an increased thickness and the second intermediate and upper channel layers 20c2 and 24c2 substantially the same as those described with reference to FIG. 2B. For example, the second intermediate and upper channel layers 20c2 and 24c2 may have the first thickness T2 and T3, respectively, and the second lower channel layer 16c2b may have the second thickness T1b. By increasing the thickness of the second lower channel layer 16c2b, the amount of current during the operation of the second transistor TR2c may be increased. Accordingly, since the on-current of the second transistor TR2c may be increased, the performance of the semiconductor device 1 may be enhanced.

By increasing the thickness of the second lower channel layer 16c2b, in the second transistor TR2c, a threshold voltage of a transistor in which a channel is formed in the second lower channel layer 16c2b may be changed to be substantially equal to an operating threshold voltage of a transistor in which channels are formed in the second intermediate and upper channel layers 20c2 and 24c2. Accordingly, the distribution of the operating threshold voltage of the second transistor TR2c may be enhanced.

The first thicknesses T2 and T3 illustrated in FIGS. 6A and 6B may be greater than about 0.4 times and less than or equal to about 0.6 times the first distances L2 and L3 as described with reference to FIGS. 2A and 2B.

The second thickness T1b may be greater than or equal to about 0.7 times and less than or equal to about 0.9 times the first distances L2 and L3.

Figure 7A:
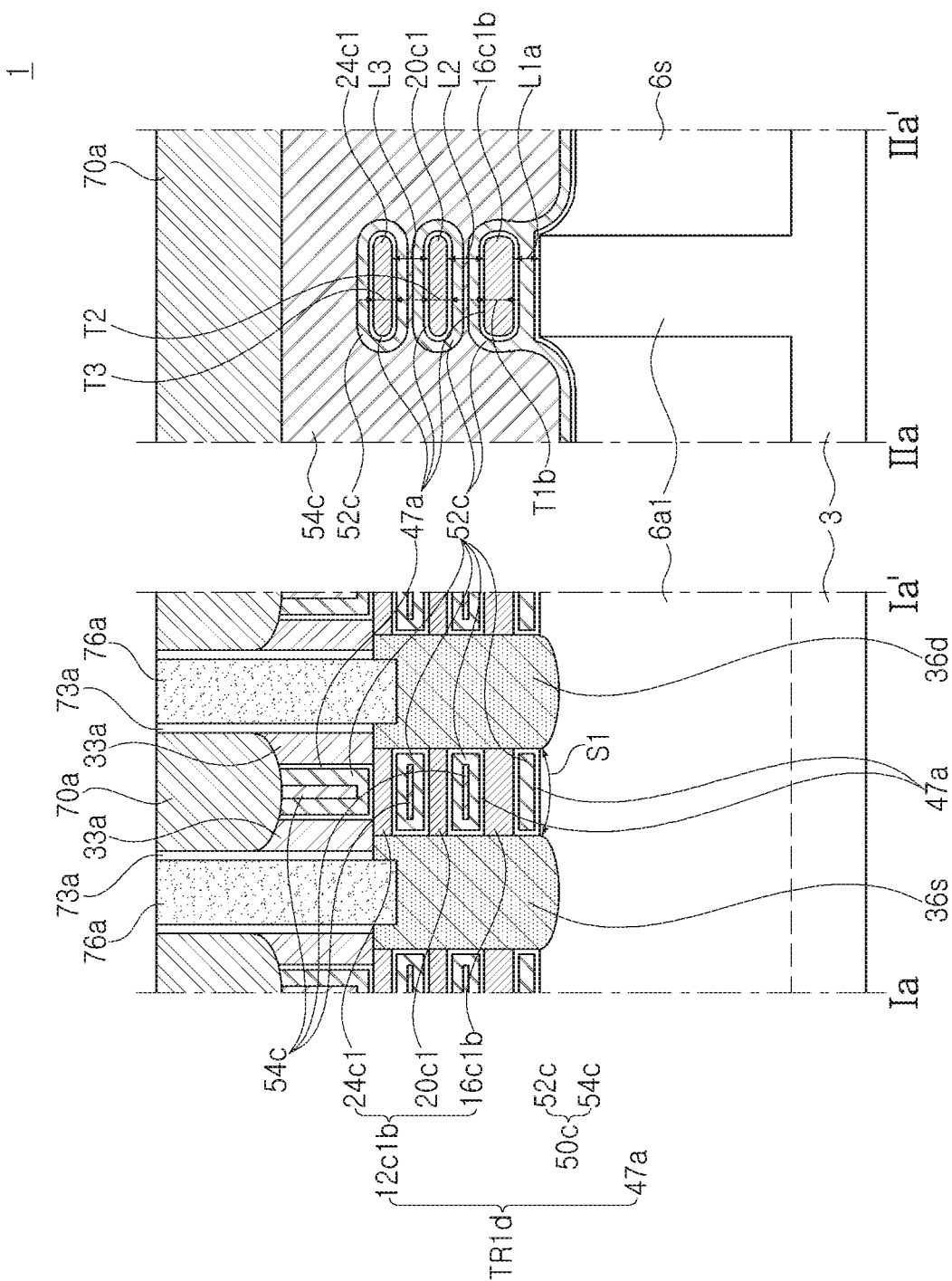
FIGS. 7A and 7B are cross-sectional views schematically illustrating a modified example of a semiconductor device according to an example embodiment of the present inventive concept.
Figure 7B:
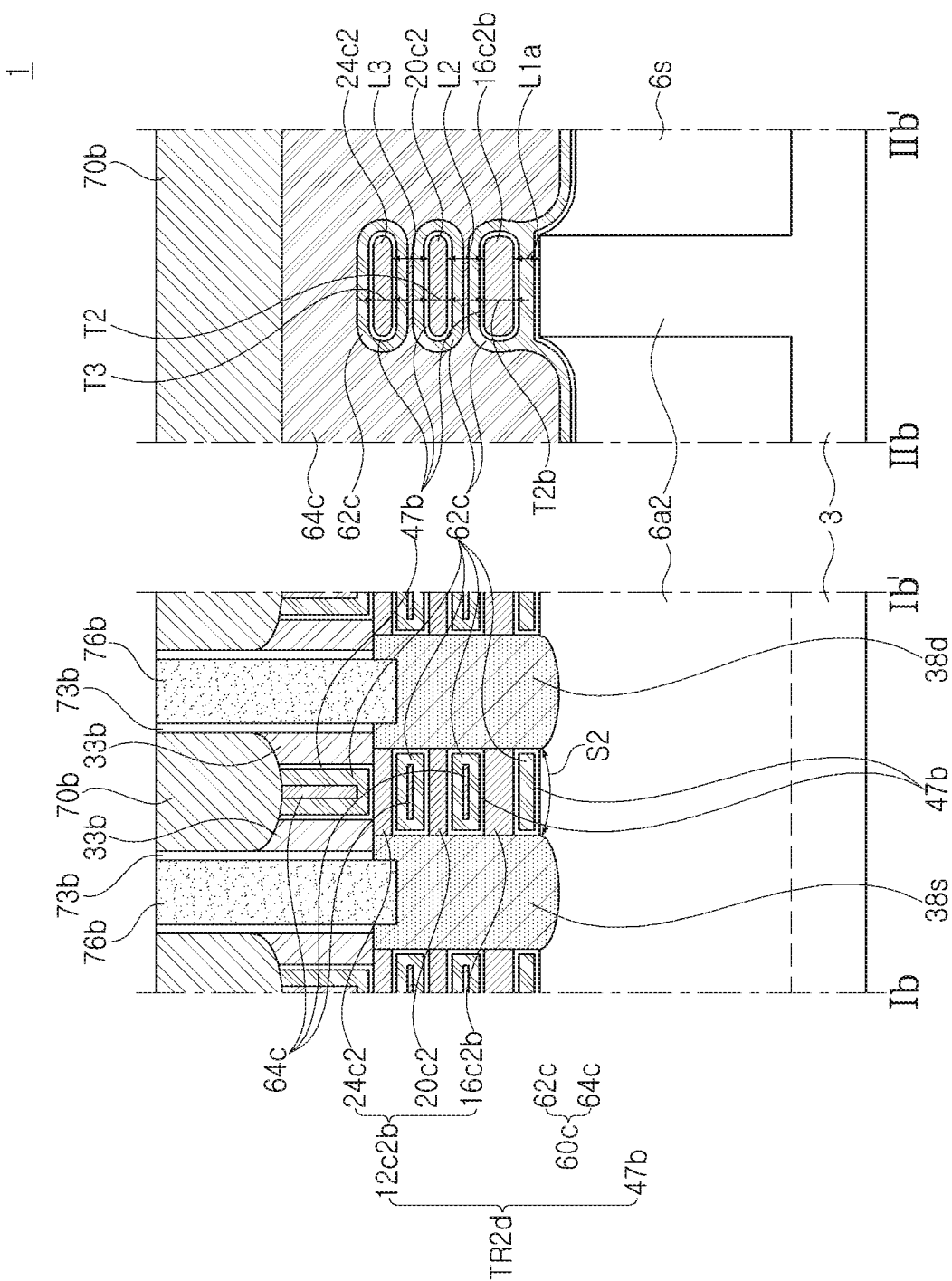

Next, a modified example of the semiconductor device according to an example embodiment of the present inventive concept will be described with reference to FIGS. 7A and 7B. FIGS. 7A and 7B are cross-sectional views schematically illustrating a modified example of a semiconductor device according to an example embodiment of the present inventive concept. In FIGS. 7A and 7B, FIG. 7A is a cross-sectional view schematically illustrating a region taken along lines Ia-Ia' and IIa-IIa' of FIG. 1, and FIG. 7B is a cross-sectional view schematically illustrating a region taken along lines Ib-Ib' and IIb-IIb' of FIG. 1.

Referring to FIGS. 1, 7A and 7B, the first transistor TR1d that may be modified from the above-described first transistor (TR1 of FIG. 2A) may include the plurality of first channel layers 12c1b as illustrated in FIG. 6A. The first transistor TR1d may include a first gate electrode 50c including a first material layer 52c surrounding each of the plurality of first channel layers 12c1b and covering the first active fin 6a1, and a second material layer 54c disposed on the first material layer 52c and contacting the first material layer 52c.

In the first material layer 52c, portions surrounding each of the plurality of first channel layers 12c1b may be spaced apart from each other in the vertical direction (Z-direction). A portion of the first material layer 52c surrounding the first lower channel layer 16c1b and a portion of the first material layer 52c covering the first active fin 6a1 may be connected to each other. The second material layer 54c may include portions interposed between two adjacent first material layers vertically spaced apart from each other. Accordingly, between the first lower channel layer 16c1b and the first intermediate channel layer 20c1 and between the first intermediate channel layer 20c1 and the first upper channel layer 24c1, the first and second material layers 52c and 54c may be disposed. The first and second material layers 52c and 54c may have materials the same as those of the first and second material layers 52a and 54a in FIG. 3A. Accordingly, since the first gate electrode 50c may have a structure similar to that of the first gate electrode 50a in FIG. 3A, similar to the first transistor (TR1a in FIG. 3A) in FIG. 3A, the sub-threshold leakage current generated in the first active fin 6a1 in the first transistor TR1d may be significantly reduced or prevented. Accordingly, the electrical characteristics or performance of the semiconductor device 1 may be enhanced.

The second transistor TR2d that may be modified from the above-described second transistor (TR2 of FIG. 2B) may include the plurality of second channel layers 12c2b as illustrated in FIG. 6B. The second transistor TR2d may include a second gate electrode 60c including a third material layer 62c with portions surrounding each of the plurality of second channel layers 12c2b and spaced apart from each other in the vertical direction (Z-direction), and a portion covering the second active fin 6a2, and a fourth material layer 64c on the third material layer 62c and in contact with the third material layer 62c.

The third and fourth material layers 62c and 64c may have materials the same as those of the third and fourth material layers 62a and 64a described with reference to FIG. 3B.

Accordingly, the second gate electrode 60c may have a structure similar to that of the second gate electrode 60a in FIG. 3B. Similarly, the sub-threshold leakage current generated in the second active fin 6a2 in the second transistor TR2d may be significantly reduced or prevented. Accordingly, the electrical characteristics or performance of the semiconductor device 1 may be enhanced.

Figure 8:
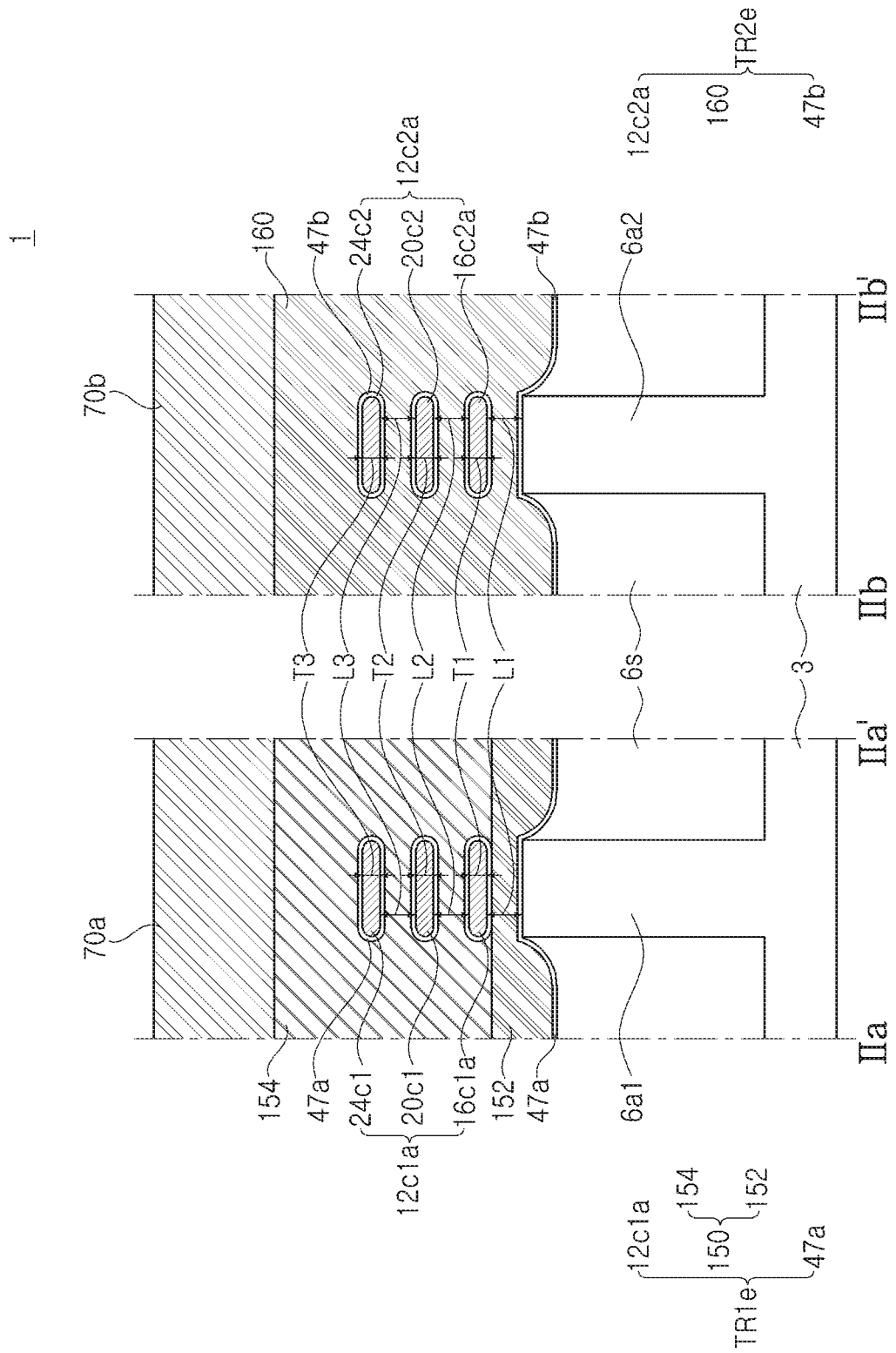
FIG. 8 is a cross-sectional view schematically illustrating a modified example of a semiconductor device according to an example embodiment of the present inventive concept.

Next, a modified example of a semiconductor device according to an example embodiment of the present inventive concept will be described with reference to FIG. 8. FIG. 8 is a cross-sectional view schematically illustrating a modified example of a semiconductor device according to an example embodiment of the present inventive concept. FIG. 8 is a cross-sectional view schematically illustrating a region taken along lines IIa-IIa' and IIb-IIb' of FIG. 1.

Referring to FIGS. 1 and 8, the first transistor TR1e that may be modified from the first transistor (TR1 of FIG. 2A) described above may include a plurality of first channel layers 12c1a including first channel layers 16c1a, 20c1 and 24c1 that are spaced apart from each other and stacked. The separation distances L2 and L3 between the first channel layers adjacent to each other among the first channel layers 16c1a, 20c1, and 24c1 may be substantially the same as the separation distance L1 between the first lower channel layer 16c1a of the first channel layers 16c1a, 20c1, and 24c1 and the first active fin 6a1.

The second transistor TR2e that may be modified from the above-described second transistor (TR2 in FIG. 2B) may include a plurality of second channel layers 12c2a including second channel layers 16c2a, 20c2 and 24c2 that are spaced apart from each other and stacked. The separation distances L2 and L3 between the second channel layers adjacent to each other among the second channel layers 16c2a, 20c2, and 24c2 may be substantially the same as the separation distance L1 between the second lower channel layer 16c2a of the second channel layers 16c2a, 20c2, and 24c2 and the second active fin 6a2.

The first transistor TR1e may include a first gate electrode 150 including a first PMOS work function metal layer 152 between the first lower channel layer 16c1a and the first active fin 6a1, and an NMOS work function metal layer 154 on the first PMOS work function metal layer 152. The NMOS work function metal layer 154 may surround the first intermediate and upper channel layers 20c1 and 24c1, respectively, and may be disposed on the first lower channel layer 16c1a.

The second transistor TR2e may include a second gate electrode 160 including the second PMOS work function metal layer. The second PMOS work function metal layer of the second gate electrode 160 may surround the plurality of second channel layers 12c2a, respectively, and cover the second active fin 6a2.

In the first transistor TR1e, the first PMOS work function metal layer 152 is disposed between the first lower channel layer 16c1a and the first active fin 6a1, whereby the sub-threshold leakage current generated in the first active fin 6a1 may be significantly reduced or prevented. Accordingly, the electrical characteristics or performance of the semiconductor device 1 may be enhanced.

Figure 9:
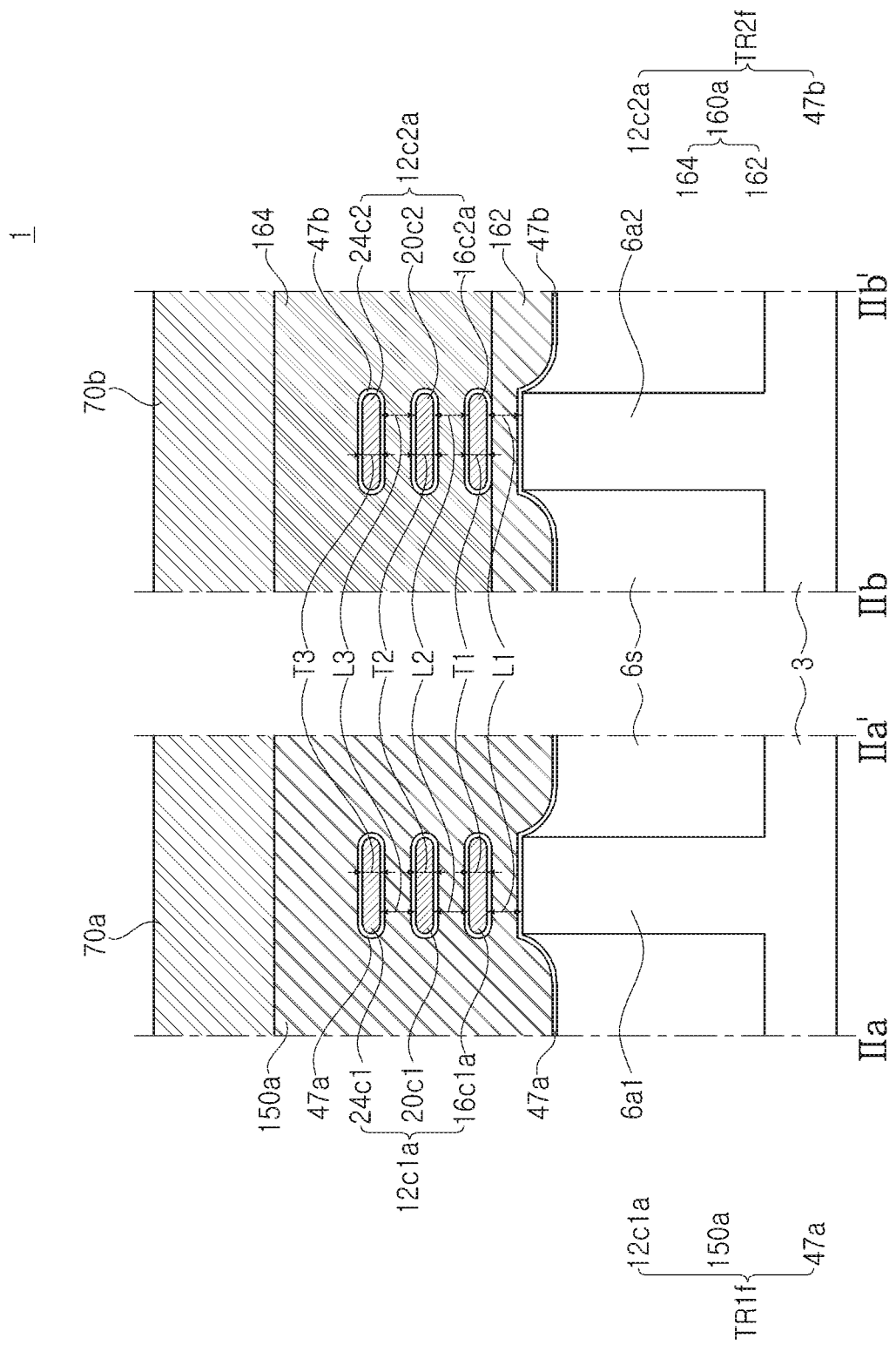
FIG. 9 is a cross-sectional view schematically illustrating a modified example of a semiconductor device according to an example embodiment of the present inventive concept.

Next, a modified example of a semiconductor device according to an example embodiment of the present inventive concept will be described with reference to FIG. 9. FIG. 9 is a cross-sectional view schematically illustrating a modified example of a semiconductor device according to an example embodiment of the present inventive concept. FIG. 9 is a cross-sectional view schematically illustrating a region taken along lines IIa-IIa' and IIb-IIb' of FIG. 1.

Referring to FIGS. 1 and 9, the first transistor TR1f that may be modified from the first transistor TR1 of FIG. 2A described above may include the plurality of first channel layers 12c1a as illustrated in FIG. 8. The second transistor TR2f that may be modified from the aforementioned second transistor (TR2 of FIG. 2B) may include the plurality of second channel layers 12c2a as illustrated in FIG. 8.

The first transistor TR1f may include a first gate electrode 150a including the first NMOS work function metal layer. The first NMOS work function metal layer of the first gate electrode 150a may surround the plurality of first channel layers 12c1a, respectively, and may cover the first active fin 6a1.

The second transistor TR2f may include a second gate electrode 160a including a second NMOS work function metal layer 162 between the second lower channel layer 16c2a and the second active fin 6a2 and a PMOS work function metal layer 164 on the second NMOS work function metal layer 162. The PMOS work function metal layer 164 may surround the second intermediate and upper channel layers 20c2 and 24c2, respectively, and may be disposed on the second lower channel layer 16c2a.

In the second transistor TR2f, by disposing the second NMOS work function metal layer 162 between the second lower channel layer 16c2a and the second active fin 6a2, the sub-threshold leakage current generated in the second active fin 6a2 may be significantly reduced or prevented. Accordingly, the electrical characteristics or performance of the semiconductor device 1 may be enhanced.

Figure 10:
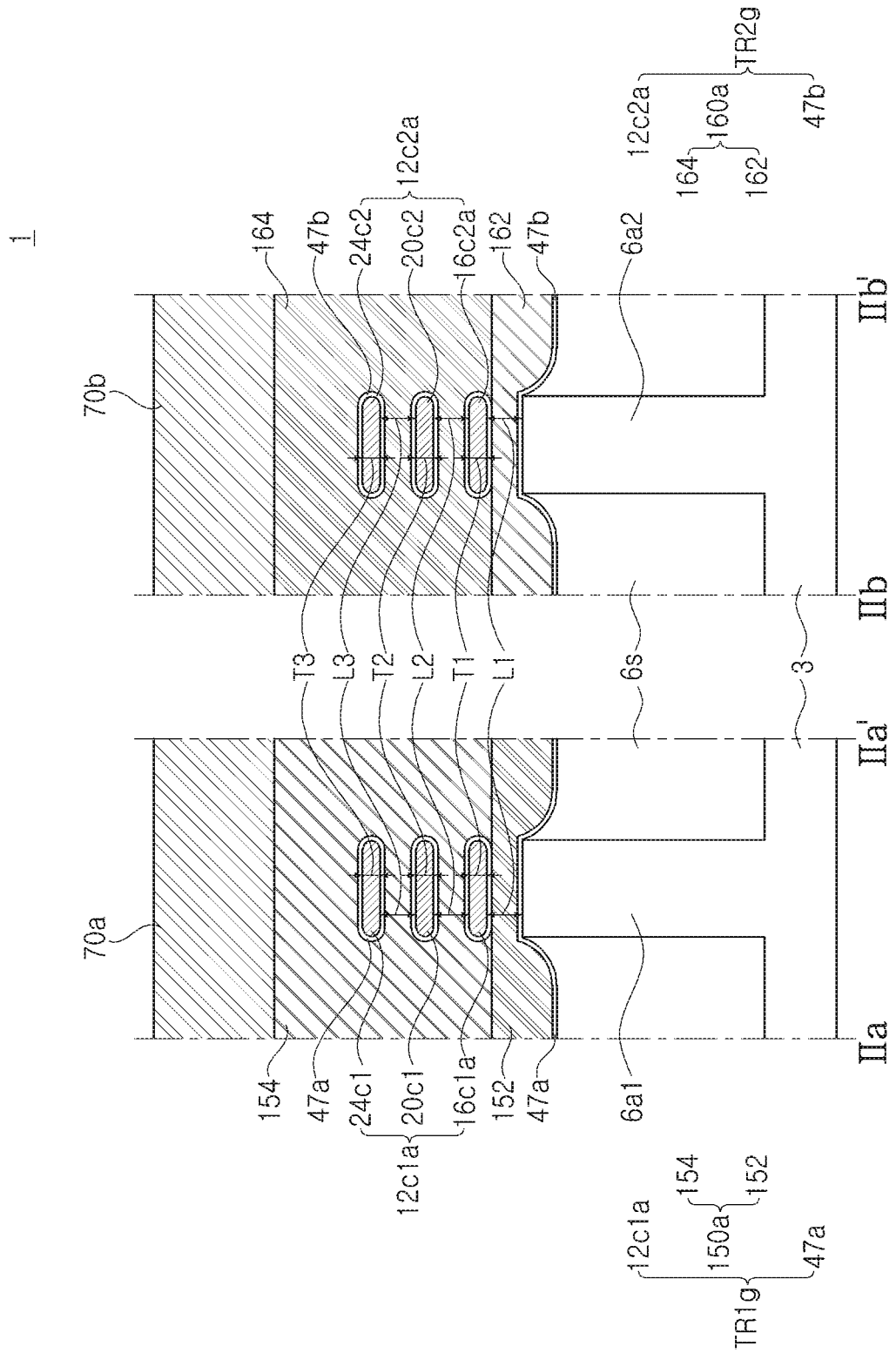
FIG. 10 is a cross-sectional view schematically illustrating a modified example of a semiconductor device according to an example embodiment of the present inventive concept.

Next, a modified example of a semiconductor device according to an example embodiment of the present inventive concept will be described with reference to FIG. 10. FIG. 10 is a cross-sectional view schematically illustrating a modified example of a semiconductor device according to an example embodiment of the present inventive concept. FIG. 10 is a cross-sectional view schematically illustrating a region taken along lines IIa-IIa' and IIb-IIb' of FIG. 1.

Referring to FIGS. 1 and 10, a semiconductor device 1 according to an example embodiment of the present inventive concept may include a first transistor TR1g substantially identical to the first transistor TR1e described with reference to FIG. 8, and a second transistor TR2g substantially identical to the second transistor TR2f described with reference to FIG. 9.

Figure 11:
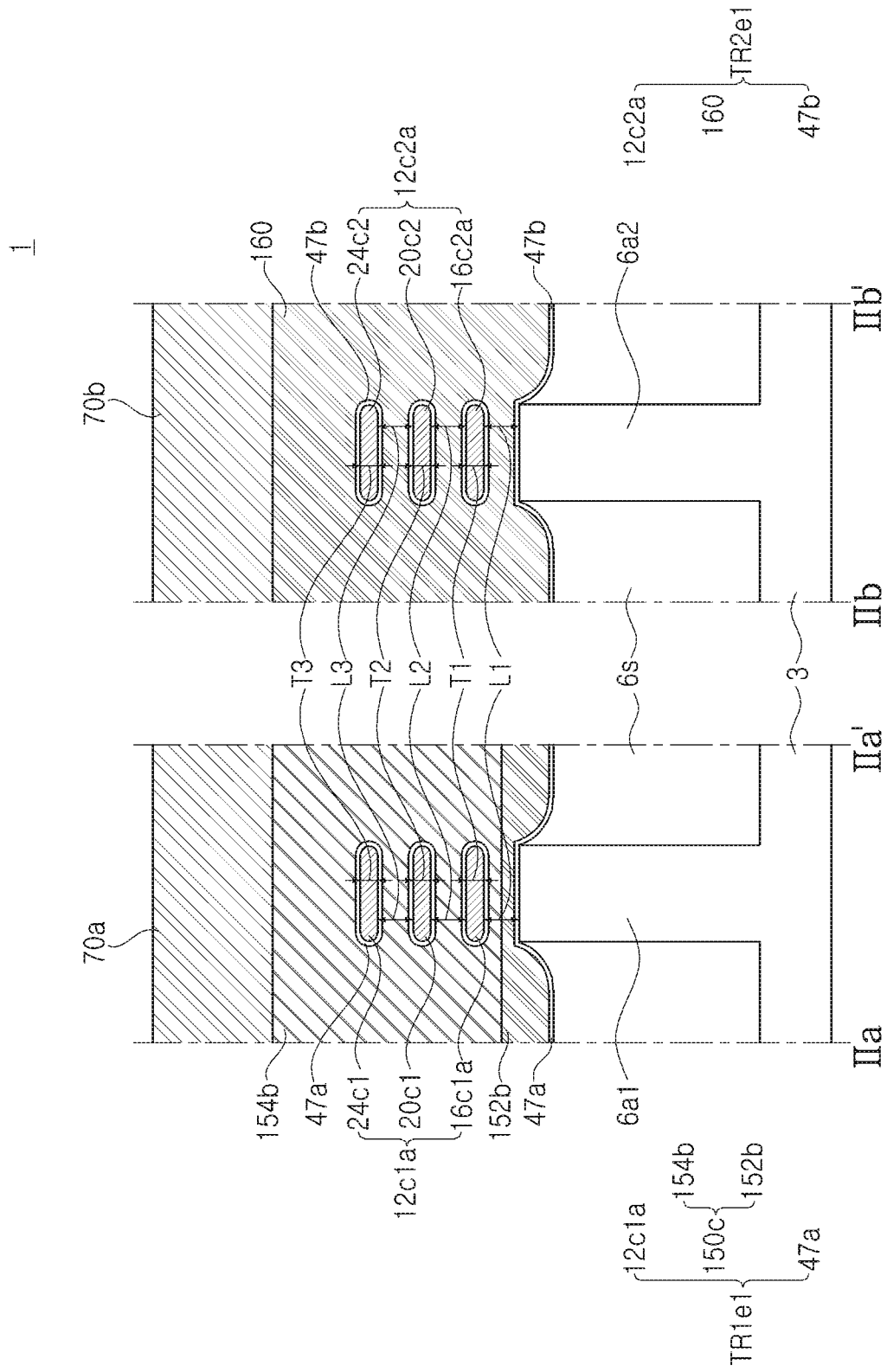
FIG. 11 is a cross-sectional view schematically illustrating a modified example of a semiconductor device according to an example embodiment of the present inventive concept.

Next, a modified example of the semiconductor device according to an example embodiment of the present inventive concept will be described with reference to FIG. 11. FIG. 11 is a cross-sectional view schematically illustrating a modified example of a semiconductor device according to an example embodiment of the present inventive concept. FIG. 11 is a cross-sectional view schematically illustrating a region taken along lines IIa-IIa' and IIb-IIb' of FIG. 1.

Referring to FIGS. 1 and 11, a semiconductor device 1 according to an example embodiment of the present inventive concept may include a first transistor TR1e1 in which the first gate electrode may be modified from that of the first transistor TR1e described with reference to FIG. 8, and a second transistor TR2e1 substantially identical to the second transistor TR2e in FIG. 8.

The first transistor TR1e1 may include a first gate electrode 150c including a first PMOS work function metal layer 152b partially filling between the first lower channel layer 16c1a and the first active fin 6a1, and an NMOS work function metal layer 154b on the first PMOS work function metal layer 152b. The NMOS work function metal layer 154b may be disposed to surround each of the plurality of first channel layers 12c1a. The first PMOS work function metal layer 152b and the NMOS work function metal layer 154b may be disposed between the first lower channel layer 16c1a and the first active fin 6a1.

In the first transistor TR1e1, the first PMOS work function metal layer 152b is disposed between the first lower channel layer 16c1a and the first active fin 6a1, and thus, the sub-threshold leakage current generated in the first active fin 6a1 may be significantly reduced or prevented. Accordingly, the electrical characteristics or performance of the semiconductor device 1 may be enhanced.

Figure 12:
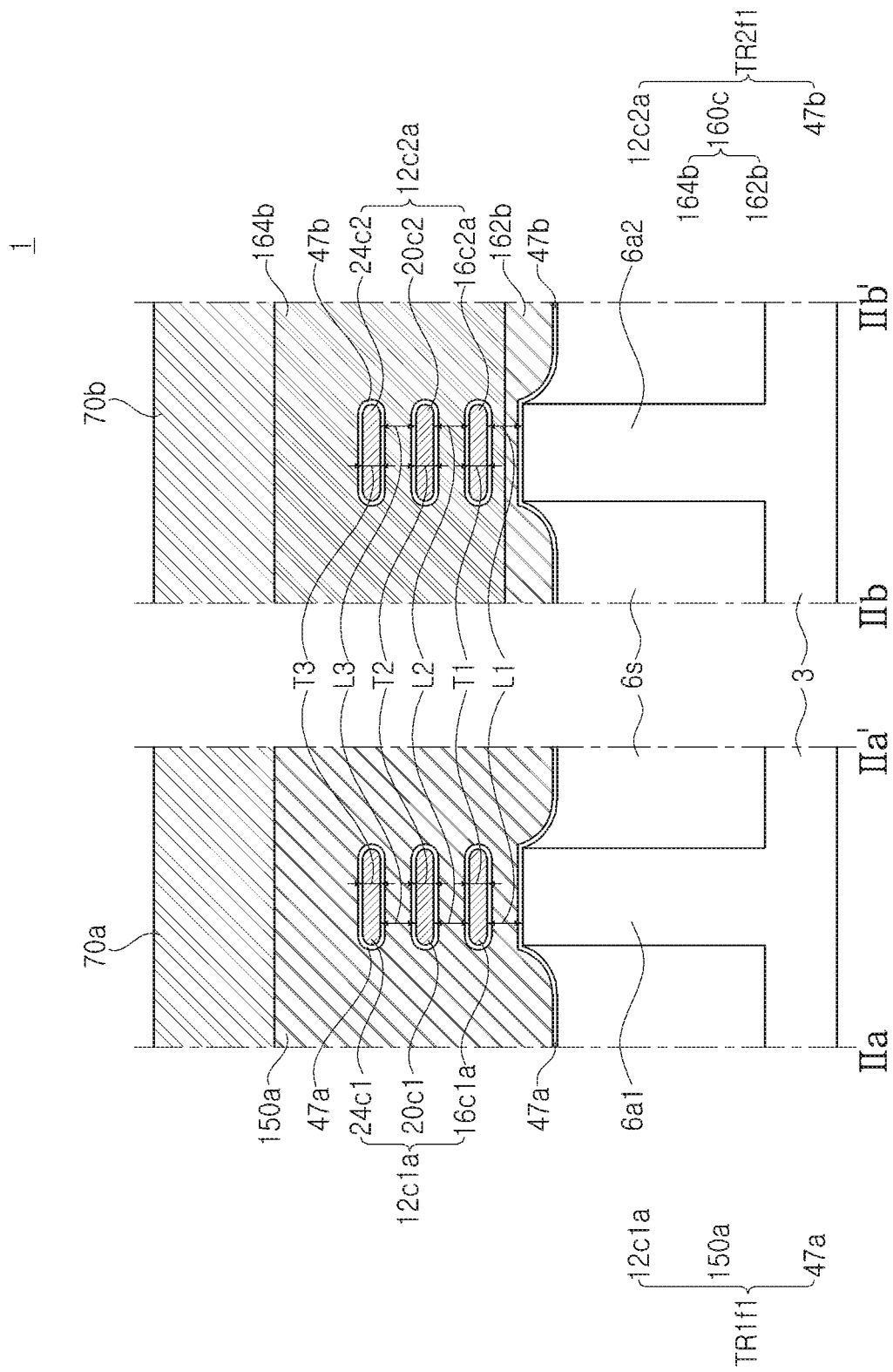
FIG. 12 is a cross-sectional view schematically illustrating a modified example of a semiconductor device according to an example embodiment of the present inventive concept.

Next, a modified example of a semiconductor device according to an example embodiment of the present inventive concept will be described with reference to FIG. 12. FIG. 12 is a cross-sectional view schematically illustrating a modified example of a semiconductor device according to an example embodiment of the present inventive concept. FIG. 12 is a cross-sectional view schematically illustrating a region taken along lines IIa-IIa' and IIb-IIb' of FIG. 1.

Referring to FIGS. 1 and 12, a semiconductor device 1 according to an example embodiment of the present inventive concept may include a first transistor TR1f1 substantially identical to the first transistor TR1f described with reference to FIG. 9, and a second transistor TR2f1 in which the second gate electrode may be modified from that of the second transistor TR2f described with reference to FIG. 9.

The second transistor TR2f1 may include a second gate electrode 160c including a second NMOS work function metal layer 162b partially filling between the second lower channel layer 16c2a and the second active fin 6a2, and a PMOS work function metal layer 164b on the second NMOS work function metal layer 162b. The PMOS work function metal layer 164b may be disposed to surround each of the plurality of second channel layers 12c2a. The second NMOS work function metal layer 162b and the PMOS work function metal layer 164b may be disposed between the second lower channel layer 16c2a and the second active fin 6a2.

In the second transistor TR2f1, the second NMOS work function metal layer 162b is disposed between the second lower channel layer 16c2a and the second active fin 6a2, whereby the sub-threshold leakage current generated in the second active fin 6a2 may be significantly reduced or prevented. Accordingly, the electrical characteristics or performance of the semiconductor device 1 may be enhanced.

Figure 13:
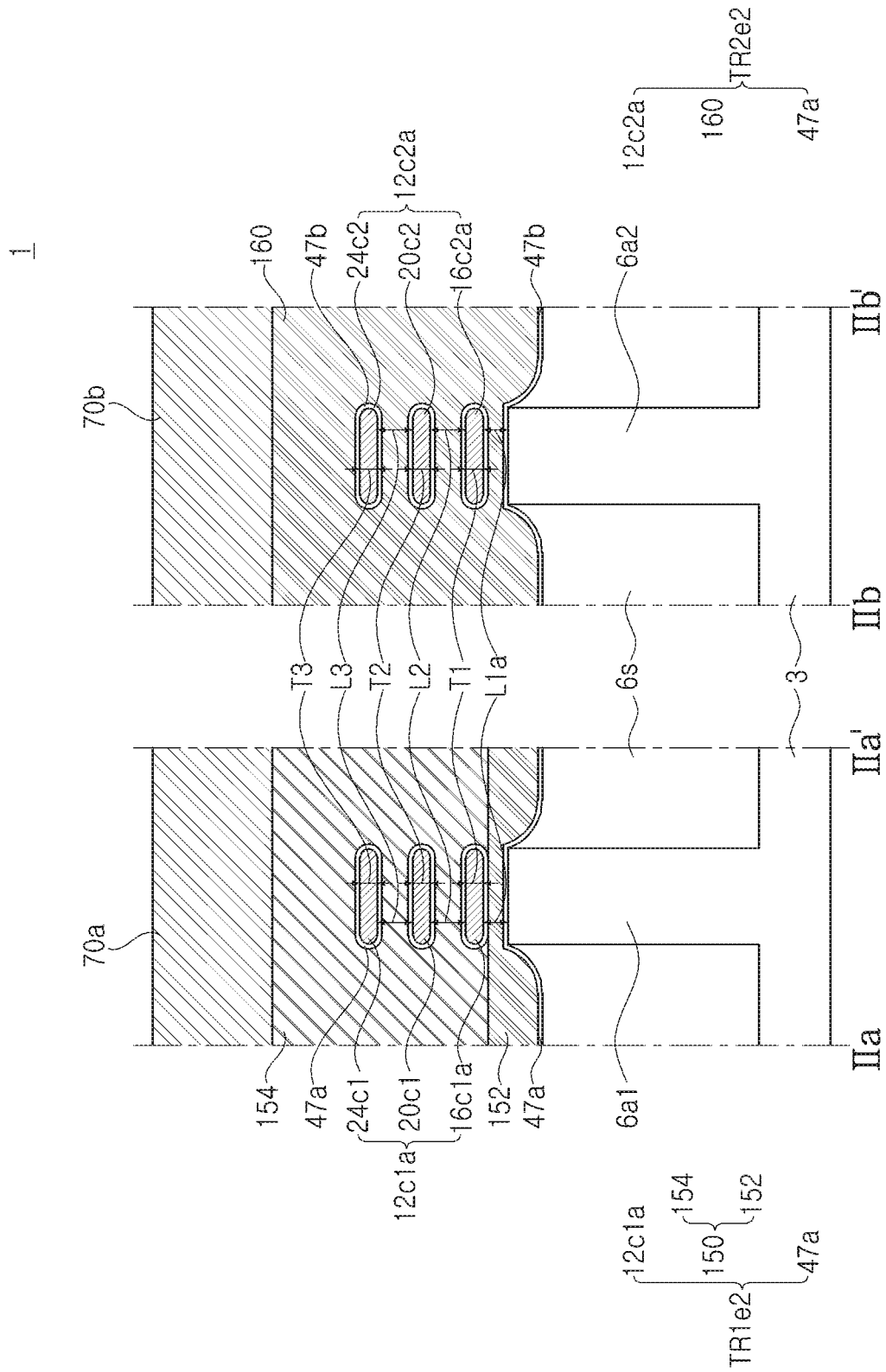
FIG. 13 is a cross-sectional view schematically illustrating a modified example of a semiconductor device according to an example embodiment of the present inventive concept.

Next, a modified example of a semiconductor device according to an example embodiment of the present inventive concept will be described with reference to FIG. 13. FIG. 13 is a cross-sectional view schematically illustrating a modified example of a semiconductor device according to an example embodiment of the present inventive concept. FIG. 13 is a cross-sectional view schematically illustrating an area taken along lines IIa-IIa' and IIb-IIb' of FIG. 1.

Referring to FIGS. 1 and 13, a semiconductor device 1 according to an example embodiment of the present inventive concept may include a first transistor TR1e2 in which the distance between the plurality of first channel layers 12c1a and the first active fin 6a1 in the first transistor TR1e described with reference to FIG. 8 is variable, and a second transistor TR2e2 in which the distance between the plurality of second channel layers 12c2a and the second active fin 6a2 may be modified from the second transistor TR2e of FIG. 8.

In the first transistor TR1e2, a second distance L1a between the plurality of first channel layers 12c1a and the first active fin 6a1 may be smaller than the first distances L2 and L3 between channel layers adjacent to each other in the vertical direction (Z-direction) among the plurality of first channel layers 12c1a. In the second transistor TR2e2, a second distance L1a between the plurality of second channel layers 12c2a and the second active fin 6a2 may be smaller than the first distances L2 and L3 between channel layers adjacent to each other in the vertical direction (Z-direction) among the plurality of second channel layers 12c2a.

Figure 14:
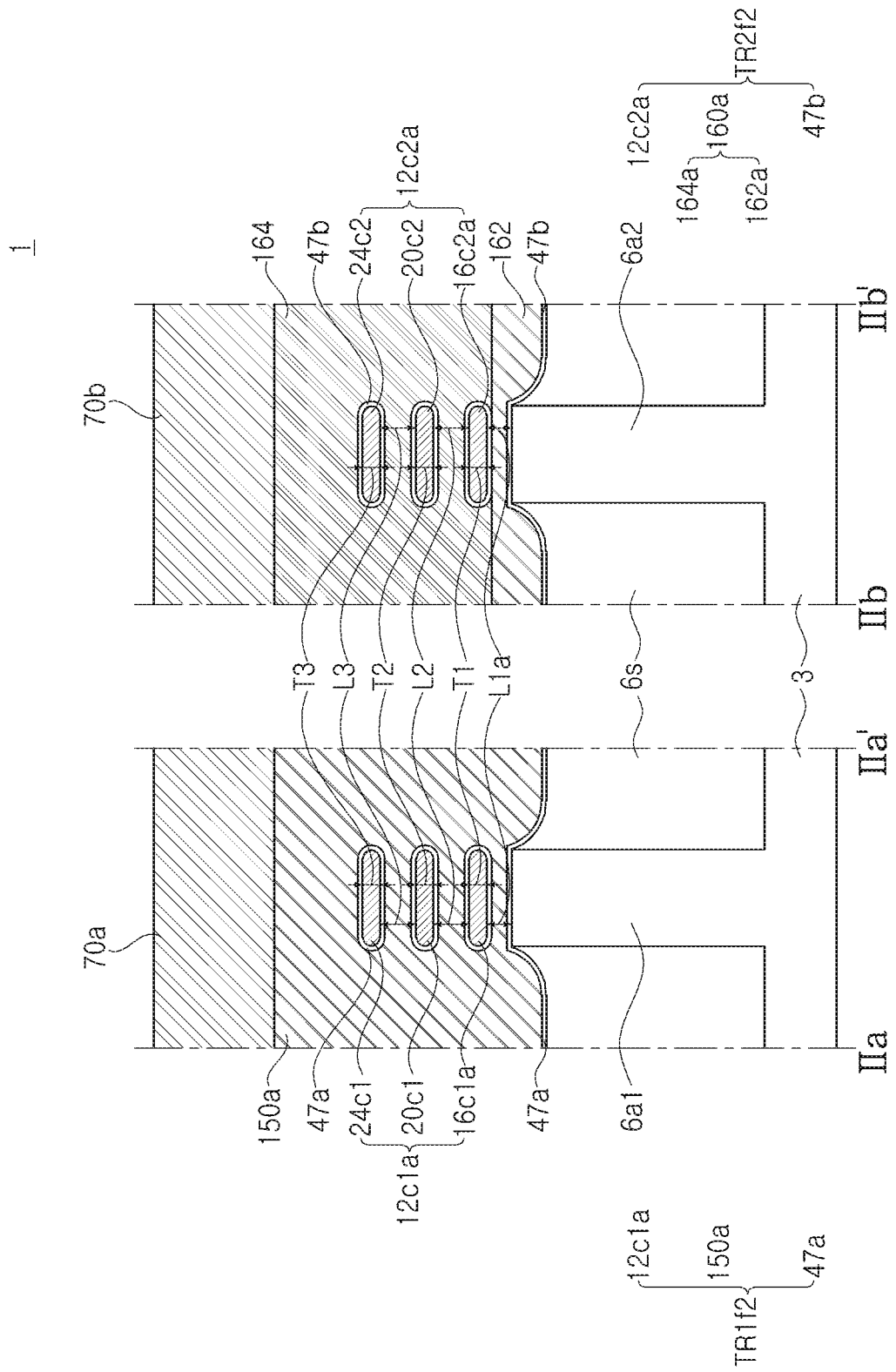
FIG. 14 is a cross-sectional view schematically illustrating a modified example of a semiconductor device according to an example embodiment of the present inventive concept.

Next, a modified example of a semiconductor device according to an example embodiment of the present inventive concept will be described with reference to FIG. 14. FIG. 14 is a cross-sectional view schematically illustrating a modified example of a semiconductor device according to an example embodiment of the present inventive concept. FIG. 14 is a cross-sectional view schematically illustrating a region taken along lines IIa-IIa' and IIb-IIb' of FIG. 1.

Referring to FIGS. 1 and 14, a semiconductor device 1 according to an example embodiment of the present inventive concept may include a first transistor TR1f2 in which the distance between the plurality of first channel layers 12c1a and the first active fin 6a1 in the first transistor TR1f described with reference to FIG. 9 is variable, and a second transistor TR2f2 in which the distance between the plurality of second channel layers 12c2a and the second active fin 6a2 may be modified from the second transistor TR2f of FIG. 9.

In the first transistor TR1f2, a second distance L1a between the plurality of first channel layers 12c1a and the first active fin 6a1 may be smaller than the first distances L2 and L3 between channel layers adjacent to each other in the vertical direction (Z-direction) among the plurality of first channel layers 12c1a. In the second transistor TR2f2, a second distance L1a between the plurality of second channel layers 12c2a and the second active fin 6a2 may be smaller than the first distances L2 and L3 between channel layers adjacent to each other in the vertical direction (Z-direction) among the plurality of second channel layers 12c2a.

Figure 15A:
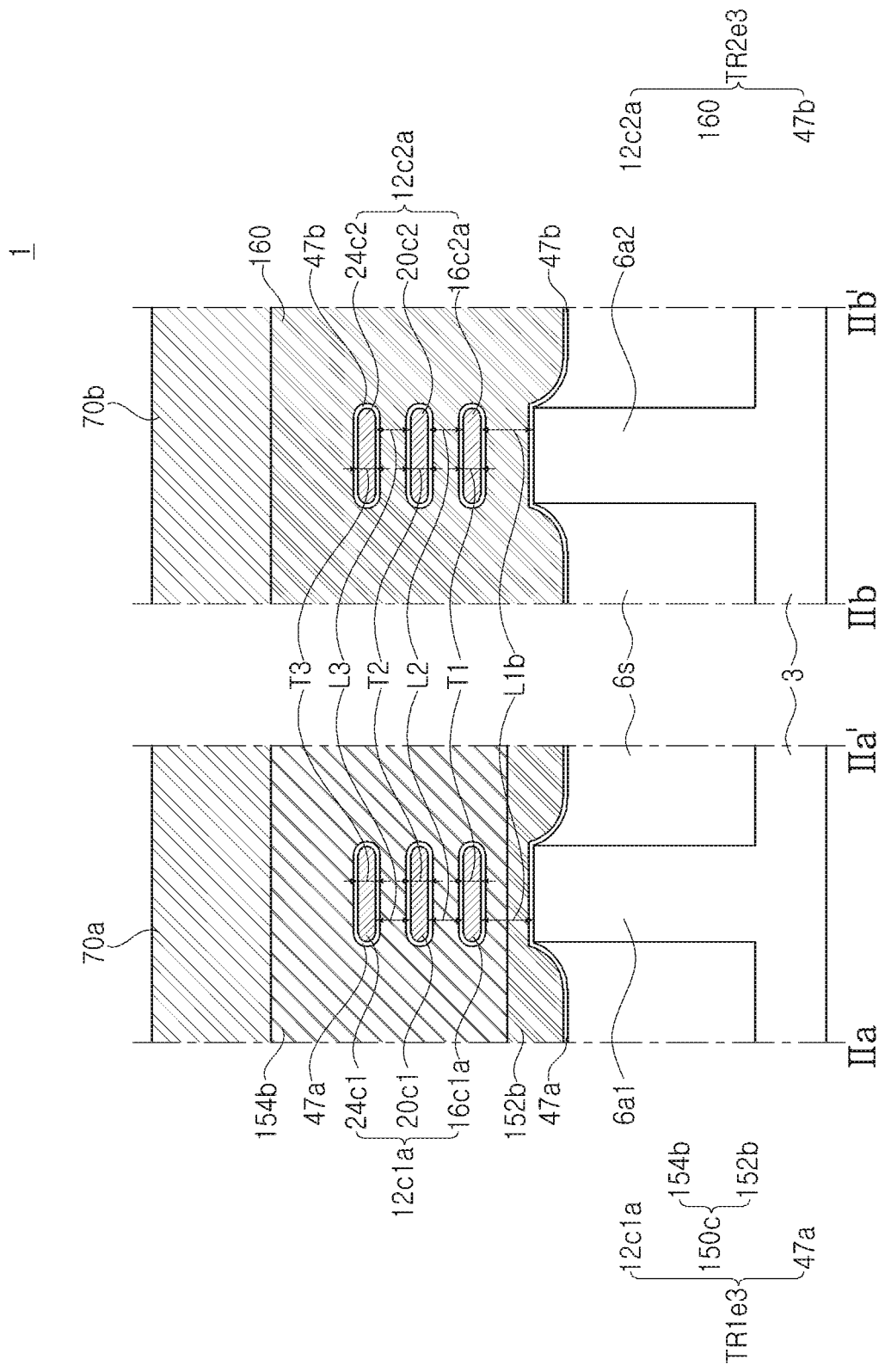
FIG. 15A is a cross-sectional view schematically illustrating a modified example of a semiconductor device according to an example embodiment of the present inventive concept.

Next, a modified example of a semiconductor device according to an example embodiment of the present inventive concept will be described with reference to FIG. 15A. FIG. 15A is a cross-sectional view schematically illustrating a modified example of a semiconductor device according to an example embodiment of the present inventive concept. FIG. 15A is a cross-sectional view schematically illustrating a region taken along lines IIa-IIa' and IIb-IIb' of FIG. 1.

Referring to FIGS. 1 and 15A, a semiconductor device 1 according to an example embodiment of the present inventive concept may include a first transistor TR1e3 in which the distance between the plurality of first channel layers 12c1a and the first active fin 6a1 in the first transistor TR1e1 described with reference to FIG. 11 is variable, and a second transistor TR2e3 in which a distance between the plurality of second channel layers 12c2a and the second active fin 6a2 may be modified from the second transistor TR2e1 of FIG. 11.

In the first transistor TR1e3, a third distance L1b between the plurality of first channel layers 12c1a and the first active fin 6a1 may be greater than the first distances L2 and L3 between channel layers adjacent to each other in the vertical direction (Z-direction) among the plurality of first channel layers 12c1a. For example, the third distance L1b may be about 1.2 times to about 2 times the first distances L2 and L3. In the second transistor TR2e3, a third distance L1b between the plurality of second channel layers 12c2a and the second active fin 6a2 may be greater than the first distances L2 and L3 between channel layers adjacent to each other in the vertical direction (Z-direction) among the plurality of second channel layers 12c2a.

Next, a modified example of a semiconductor device according to an example embodiment of the present inventive concept will be described with reference to FIG. 15B.

Figure 15B:
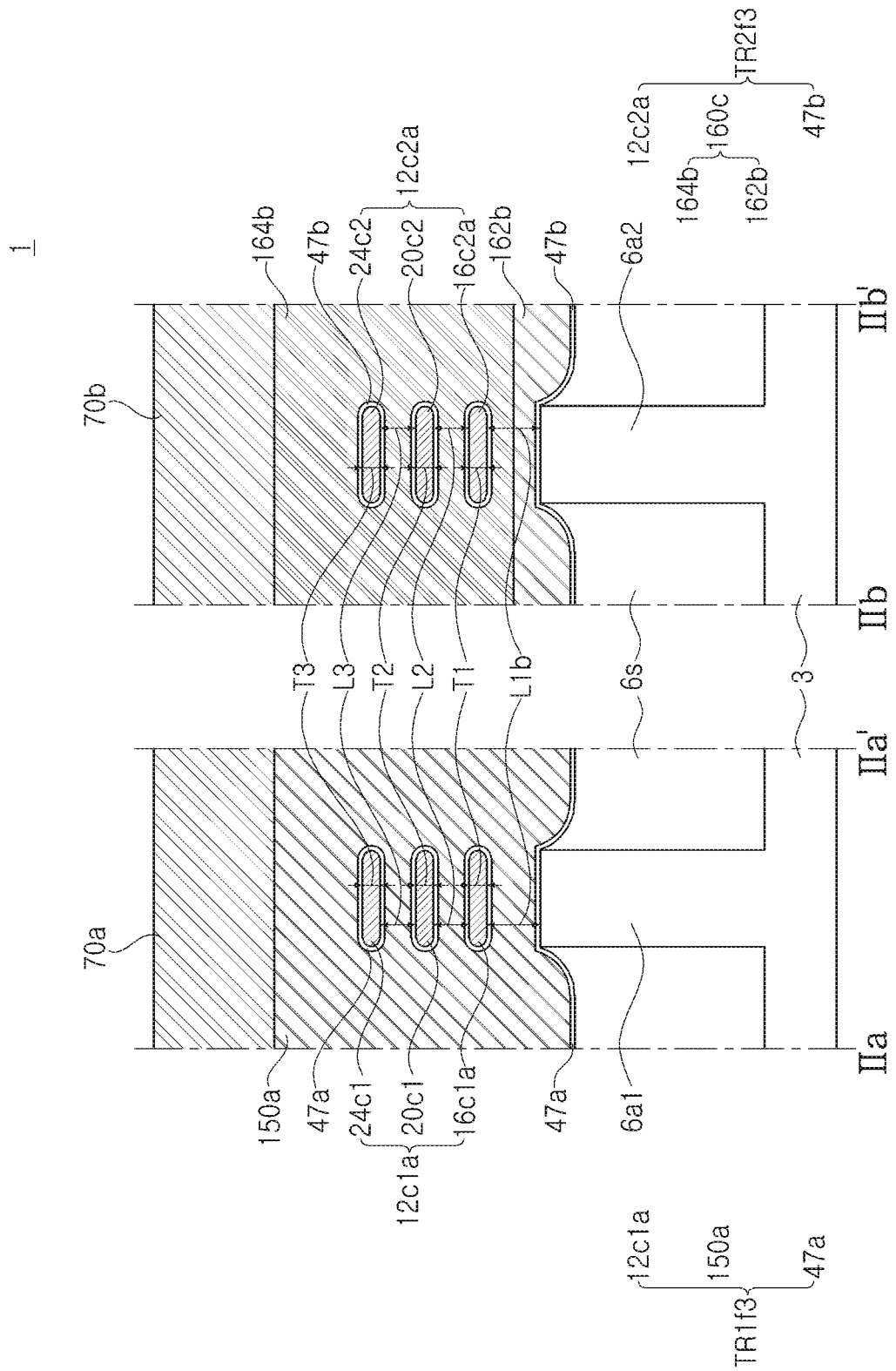
FIG. 15B is a cross-sectional view schematically illustrating a modified example of a semiconductor device according to an example embodiment of the present inventive concept.

FIG. 15B is a cross-sectional view schematically illustrating a modified example of a semiconductor device according to an example embodiment of the present inventive concept. FIG. 15B is a cross-sectional view schematically illustrating a region taken along lines IIa-IIa' and IIb-IIb' of FIG. 1.

Referring to FIGS. 1 and 15B, a semiconductor device 1 according to an example embodiment of the present inventive concept may include a first transistor TR1*f*3 in which the distance between the plurality of first channel layers 12*c*1*a* and the first active fin 6*a*1 in the first transistor TR1*f*1 described with reference to FIG. 12 is variable, and a second transistor TR2*f*3 in which the distance between the plurality of second channel layers 12*c*2*a* and the second active fin 6*a*2 may be modified from the second transistor TR2*f*1 of FIG. 12.

In the first transistor TR1*f*3, a third distance L1*b* between the plurality of first channel layers 12*c*1*a* and the first active fin 6*a*1 may be greater than the first distances L2 and L3 between channel layers adjacent to each other in the vertical direction (Z-direction) among the plurality of first channel layers 12*c*1*a*. In the second transistor TR2*f*3, a third distance L1*b* between the plurality of second channel layers 12*c*2*a* and the second active fin 6*a*2 may be greater than the first distances L2 and L3 between channel layers adjacent to each other in the vertical direction (Z-direction) among the plurality of second channel layers 12*c*2*a*.

Figure 16:
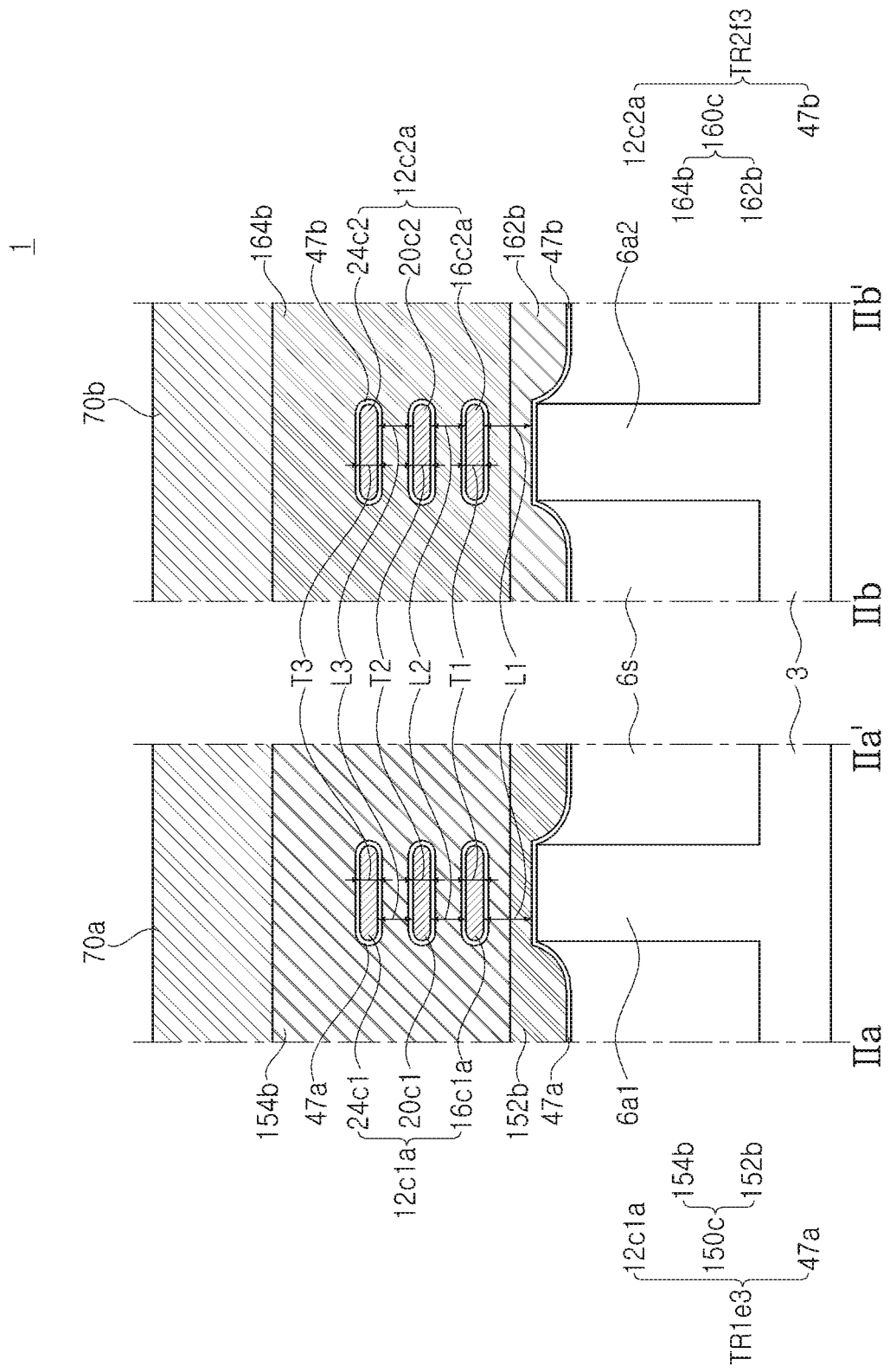
FIG. 16 is a cross-sectional view schematically illustrating a modified example of a semiconductor device according to an example embodiment of the present inventive concept.

Next, a modified example of a semiconductor device according to an example embodiment of the present inventive concept will be described with reference to FIG. 16. FIG. 16 is a cross-sectional view schematically illustrating a modified example of a semiconductor device according to an example embodiment of the present inventive concept. FIG. 16 is a cross-sectional view schematically illustrating a region taken along lines IIa-IIa' and IIb-IIb' of FIG. 1.

Referring to FIGS. 1 and 16, the semiconductor device 1 according to an example embodiment of the present inventive concept may include the first transistor TR1*e*3 described with reference to FIG. 15A and the second transistor TR2*f*3 described with reference to FIG. 15B.

Figure 17:
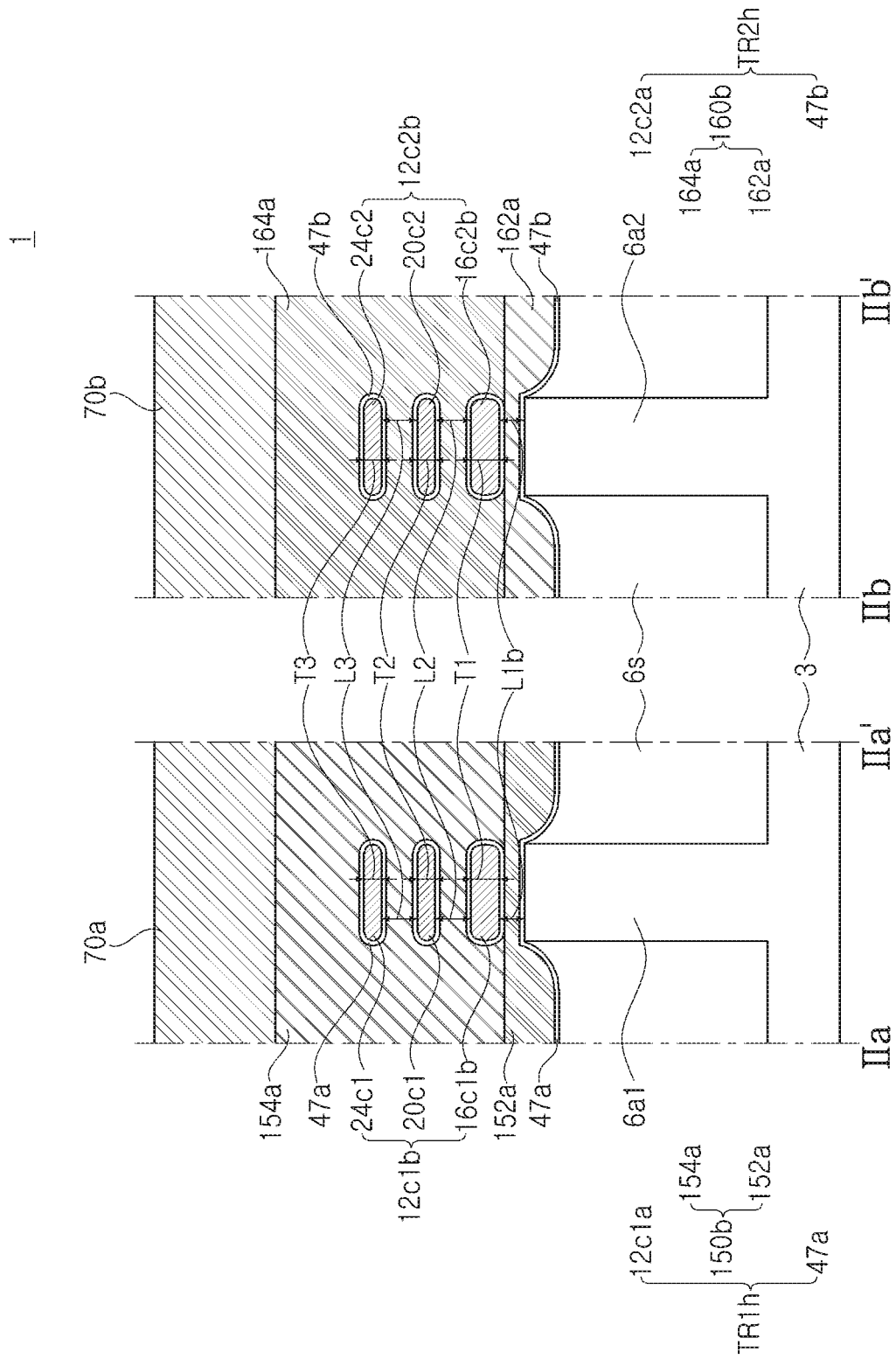
FIG. 17 is a cross-sectional view schematically illustrating a modified example of a semiconductor device according to an example embodiment of the present inventive concept.

Next, a modified example of a semiconductor device according to an example embodiment of the present inventive concept will be described with reference to FIG. 17. FIG. 17 is a cross-sectional view schematically illustrating a modified example of a semiconductor device according to an example embodiment of the present inventive concept. FIG. 17 is a cross-sectional view schematically illustrating an area taken along lines IIa-IIa' and IIb-IIb' of FIG. 1.

Referring to FIGS. 1 and 17, a semiconductor device 1 according to an example embodiment of the present inventive concept may include a first transistor TR1*h* that may be modified to increase the thickness of the first lower channel layer 16*c*1*a* among the plurality of first channel layers 12*c*1*a* in the first transistor TR1*g* described with reference to FIG. 10, and a second transistor TR2*h* that may be modified to increase the thickness of the second lower channel layer 16*c*2*a* among the plurality of second channel layers 12*c*2*a* in the second transistor TR2*g* described with reference to FIG. 10.

In the first transistor TR1*h*, the thickness T1 of the first lower channel layer 16*c*1*b* among the plurality of first channel layers 12*c*1*b* may be greater than the thicknesses T2 and T3 of each of the first intermediate and upper channel layers 20*c*1 and 24*c*1, respectively. In the second transistor TR2*h*, the thickness T1 of the second lower channel layer 16*c*2*b* among the plurality of second channel layers 12*c*2*b* may be greater than the thicknesses T2 and T3 of each of the second intermediate and upper channel layers 20*c*2 and 24*c*2, respectively. By increasing the thickness T1 of the first lower channel layer 16*c*1*b*, the amount of current during the operation of the first transistor TR1*h* may be increased. Accordingly, since the on-current of the first transistor TR1*h* may be increased, the performance of the semiconductor device 1 may be enhanced. Also, by increasing the thickness T1 of the second lower channel layer 16*c*2*b*, the amount of current during the operation of the second transistor TR2*h* may be increased. Accordingly, since the on-current of the second transistor TR2*h* may be increased, the performance of the semiconductor device 1 may be enhanced.

Figure 18:
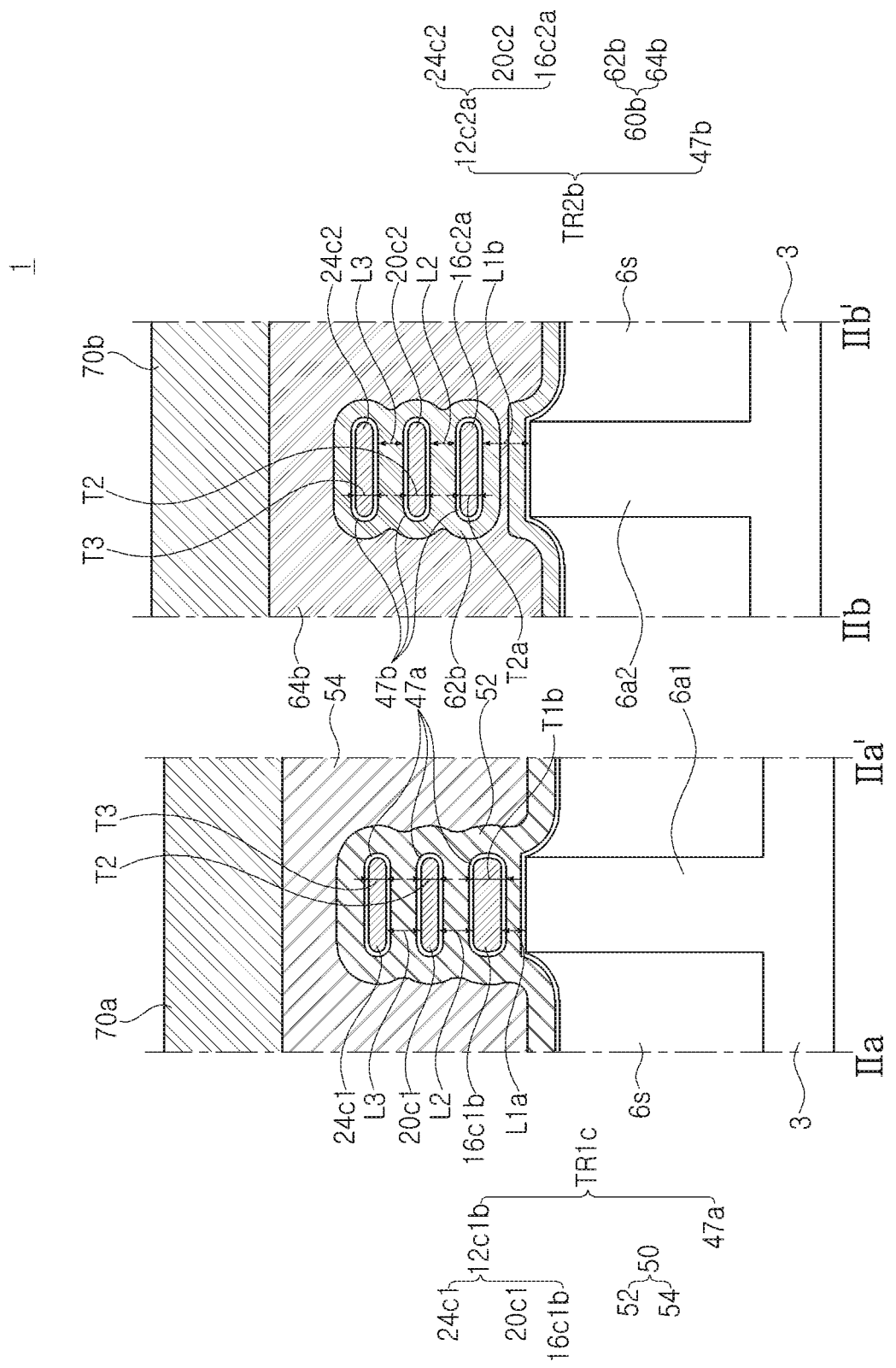
FIG. 18 is a cross-sectional view schematically illustrating a modified example of a semiconductor device according to an example embodiment of the present inventive concept.

Among the example embodiments of the present inventive concept described above with reference to FIGS. 2A to 17, a component referred to as a "first transistor" may be an NMOS transistor, and a component referred to as a "second transistor" may be a PMOS transistor. The semiconductor device 1 according to an example embodiment of the present inventive concept may include any one of the first transistors of the first transistors of the example embodiments described above with reference to FIGS. 2A to 17, and any one of the second transistors of the second transistors of the example embodiments described above with reference to FIGS. 2A to 17. As such, an illustrative example of the semiconductor device 1 that includes any one first transistor of the first transistors of the example embodiments described above with reference to FIGS. 2A to 17, and any one second transistor of the second transistors of the example embodiments described above with reference to FIGS. 2A to 17, will be described with reference to FIG. 18. FIG. 18 is a cross-sectional view schematically illustrating an example of a semiconductor device according to an example embodiment of the present inventive concept, and may illustrate a cross-sectional structure indicated by IIa-IIa' in FIG. 6A and a cross-sectional structure indicated by IIb-IIb' in FIG. 5B.

Referring to FIGS. 1 and 18, a semiconductor device 1 according to an example embodiment of the present inventive concept may include the first transistor TR1*c* as described with reference to FIG. 6A, and the second transistor TR2*b* as described with reference to FIG. 5B. Accordingly, the semiconductor device 1 according to an example embodiment of the present inventive concept may include any one first transistor among the first transistors (TR1 in FIGS. 2A and 4, TR1*a* in FIG. 3A, TR1*b* in FIG. 5A, TR1*c* in FIG. 6A, TR1*d* in FIG. 7A, TR1*e* in FIG. 8, TR1*f* in FIG. 9, TR1*g* in FIG. 10, TR1*e*1 in FIG. 11, TR1*f*1 in FIG. 12, TR1*e*2 in FIG. 13, TR1*f*2 in FIG. 14, TR1*e*3 in FIG. 15A, TR1*f*3 in FIG. 15B, TR1*e*3 in FIG. 16, and TR1*h* in FIG. 17) of the example embodiments described above with reference to FIGS. 2A to 17; and any one second transistor among the second transistors (TR2 in FIG. 2B, TR2*a* in FIG. 3B, TR2*b* in FIG. 5B, TR2*c* in FIG. 6B, TR2*d* in FIG. 7B, TR2*e* in FIG. 8, TR2*f* in FIG. 9, TR2*g* in FIG. 10, TR2*e*1 in FIG. 11, TR2*f*1 in FIG. 12, TR2*e*2 in FIG. 13, TR2*f*2 in FIG. 14, TR2*e*3 in FIG. 15A, TR2*f*3 in FIG. 15B, TR2*f*3 in FIG. 16, and TR2*h* in FIG. 17).

Next, an example of a method of forming a semiconductor device according to an example embodiment of the present inventive concept will be described. FIGS. 19A to 21B are cross-sectional views schematically illustrating an example of a method of forming a semiconductor device according to an example embodiment of the present inventive concept. In FIGS. 19A to 21B, FIGS. 19A, 20A and 21A are cross-sectional views schematically illustrating a region taken along lines Ia-Ia' and IIa-IIa' of FIG. 1, and FIGS. 19B, 20B and 21B are cross-sectional views schematically illustrating a region taken along lines Ib-Ib' and IIb-IIb' of FIG. 1.

Figure 19A:
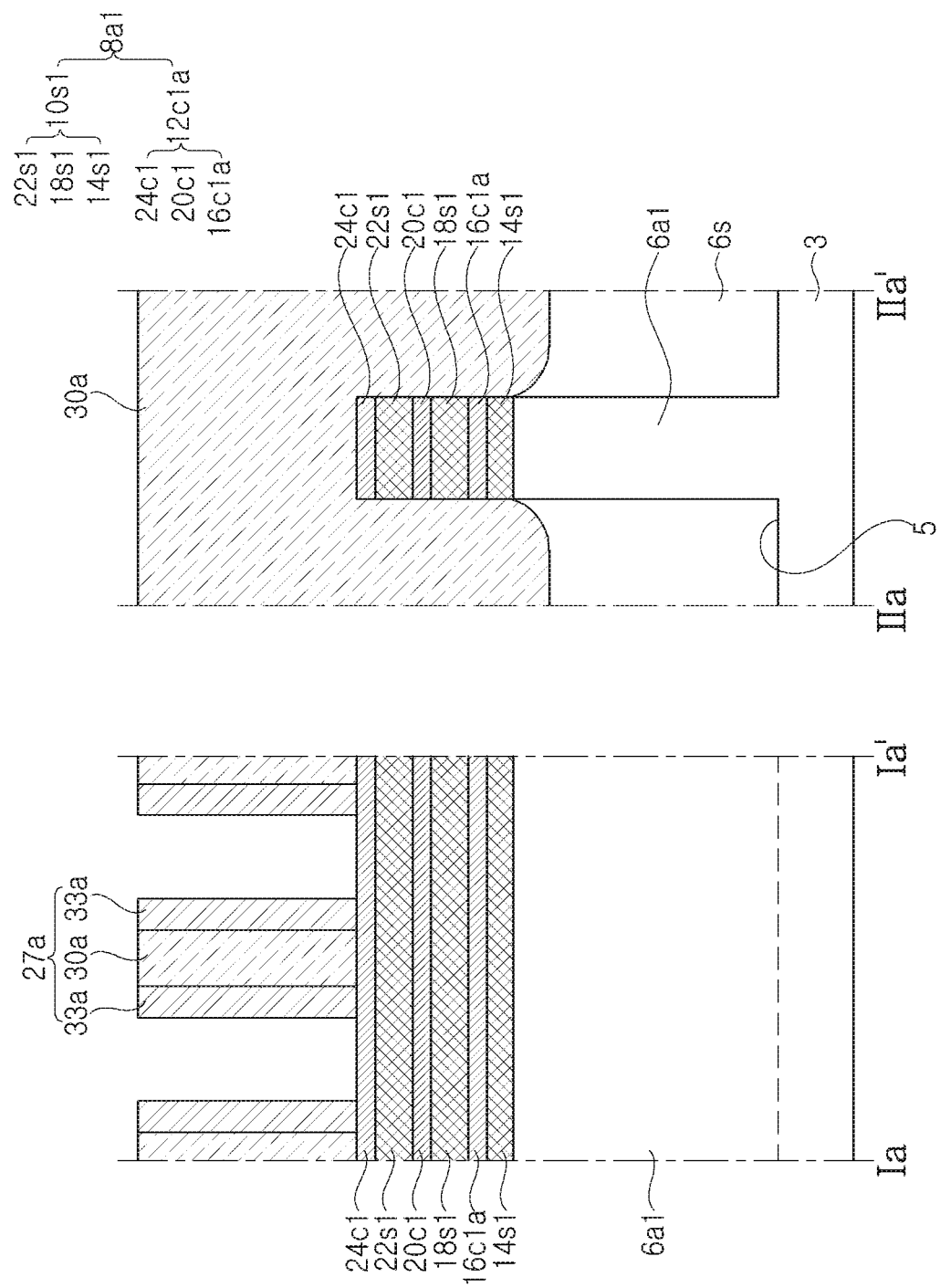
FIGS. 19A, 19B, 20A, 20B, 21A and 21B are cross-sectional views schematically illustrating an example of a method of forming a semiconductor device according to an example embodiment of the present inventive concept.
Figure 19B:
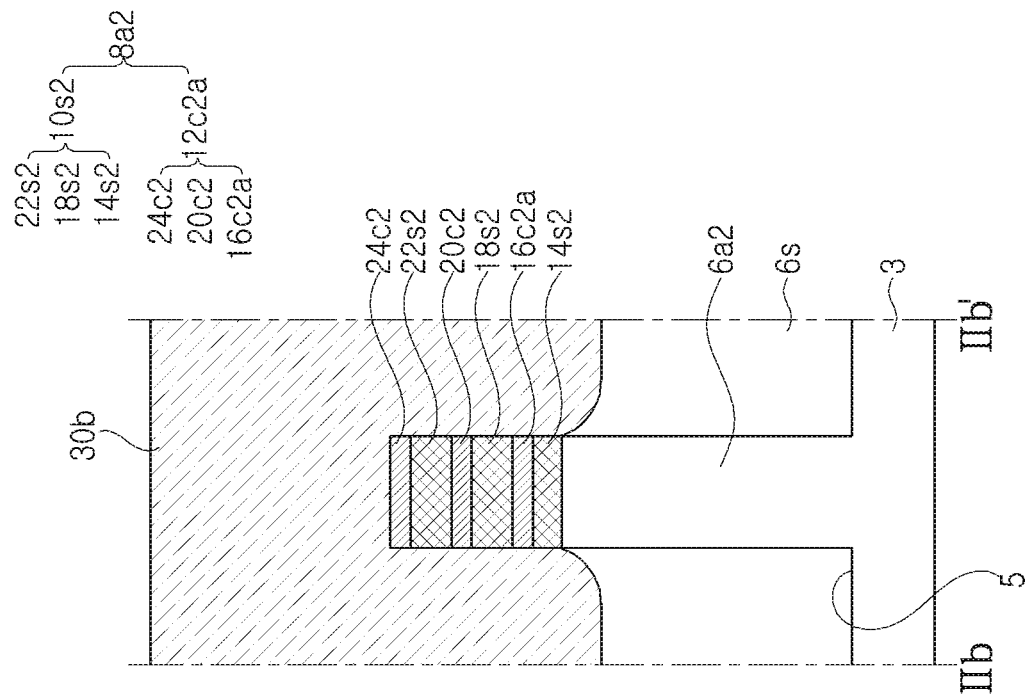
Figure 19B:
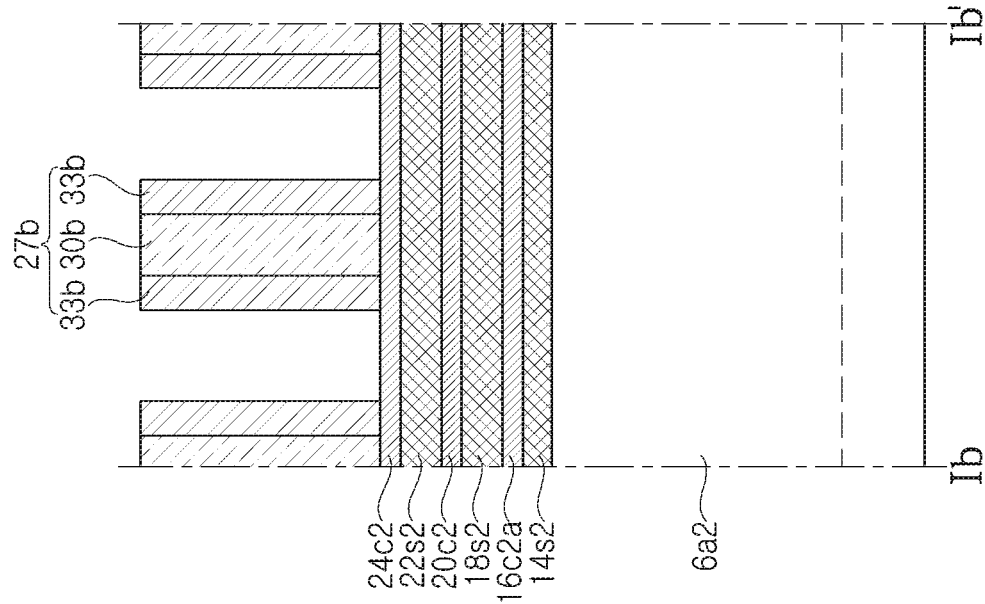

Referring to FIGS. 1, 19A, and 19B, a first semiconductor structure 8a1 and a second semiconductor structure 8a2 sequentially stacked on a substrate 3 may be included. The substrate 3 may be a semiconductor substrate. For example, the substrate 3 may be a single crystal semiconductor substrate that may be formed of a semiconductor material such as silicon (Si).

The first semiconductor structure 8a1 may include a plurality of first sacrificial layers 10s1 and a plurality of first channel layers 12c1a that are alternately stacked. The plurality of first sacrificial layers 10s1 may include a first lower sacrificial layer 14s1, a first intermediate sacrificial layer 18s1 and a first upper sacrificial layer 22s1 vertically stacked while being spaced apart from each other, and the plurality of first channel layers 12c1a may include the first lower channel layer 16c1a, the first intermediate channel layer 20c1, and the first upper channel layer 24c1 vertically stacked while being spaced apart from each other.

The second semiconductor structure 8a2 may include a plurality of second sacrificial layers 10s2 and a plurality of second channel layers 12c2a that are alternately stacked. The plurality of second sacrificial layers 10s2 may include the second lower sacrificial layer 14s2, the second intermediate sacrificial layer 18s2, and the second upper sacrificial layer 22s2 vertically stacked while being spaced apart from each other. The plurality of second channel layers 12c2a may include the second lower channel layer 16c2a, the second intermediate channel layer 20c2, and the second upper channel layer 24c2 vertically stacked while being spaced apart from each other.

The plurality of first sacrificial layers 10s1 and the plurality of second sacrificial layers 10s2 may be formed of a silicon germanium (SiGe) material by an epitaxial growth process. The plurality of first channel layers 12c1a and the plurality of second channel layers 12c2a may be formed of a silicon (Si) material by an epitaxial growth process. The plurality of first channel layers 12c1a and the plurality of second channel layers 12c2a may be formed of an undoped silicon (Si) material.

The first and second semiconductor structures 8a1 and 8a2 and the substrate 3 are etched to form a trench 5, and an isolation region 6s partially filling the trench 5 may be formed. A first active fin 6a1 and a second active fin 6a2 of which side surfaces are defined by the isolation region 6s may be formed, the first semiconductor structure 8a1 may remain on the first active fin 6a1, and the second semiconductor structure 8a2 may remain on the second active fin 6a2.

The first active fin 6a1 and the second active fin 6a2 may each have a line shape or a bar shape extending in the first direction (X-direction). The first direction (X-direction) may be parallel to the upper surface of the substrate 3.

First structures 27a extending in the second direction (Y-direction) across the first active fin 6a1, and second structures 27b traversing the second active fin 6a2 and extending in the second direction (Y-direction) may be formed. The second direction (Y-direction) may be parallel to the upper surface of the substrate 3 and may be perpendicular to the first direction (X-direction).

Each of the first structures 27a may include a first sacrificial gate 30a and first insulating spacers 33a on side surfaces of the first sacrificial gate 30a. Each of the second structures 27b may include a second sacrificial gate 30b and second insulating spacers 33b on side surfaces of the second sacrificial gate 30b.

Figure 20A:
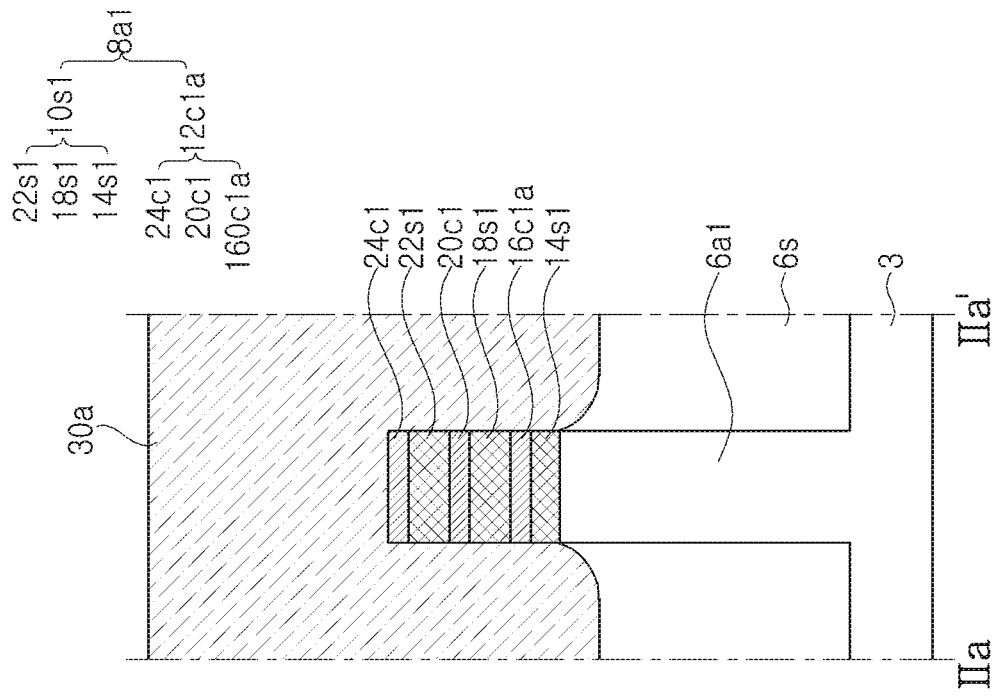
Figure 20A:
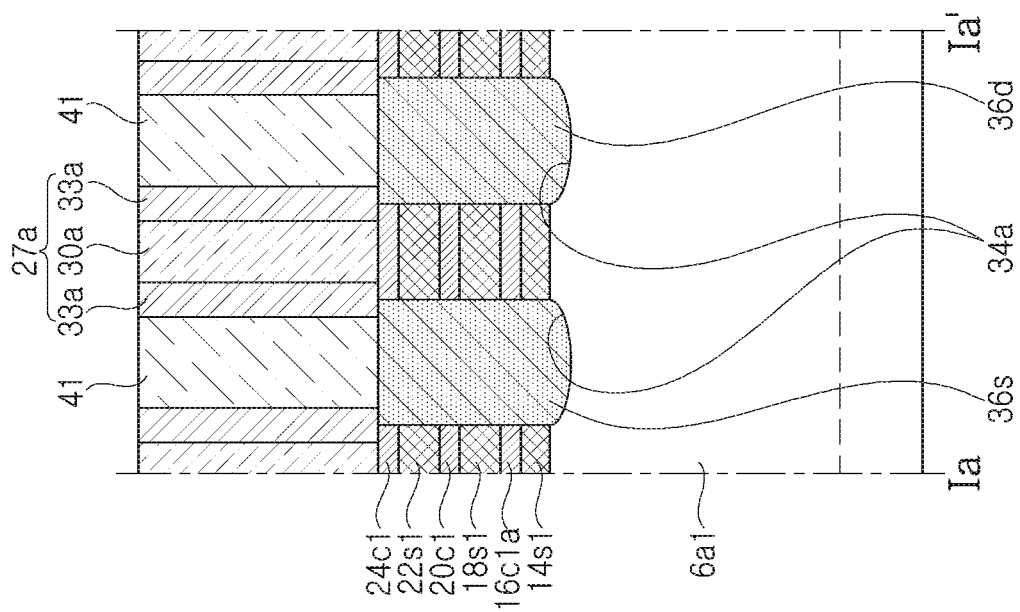
Figure 20B:
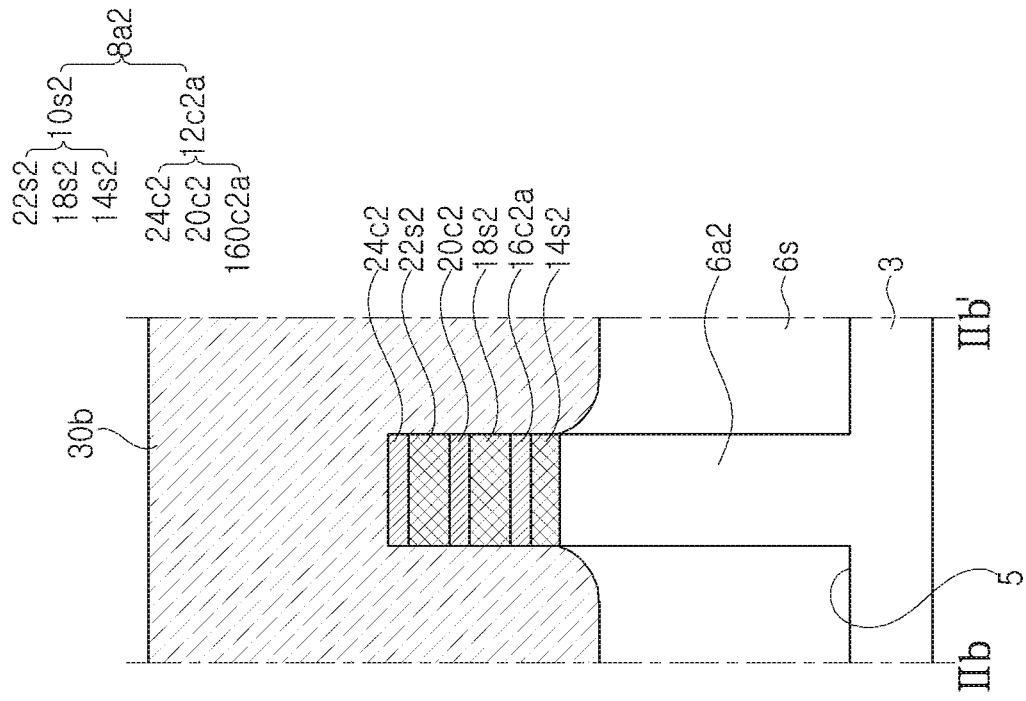
Figure 20B:
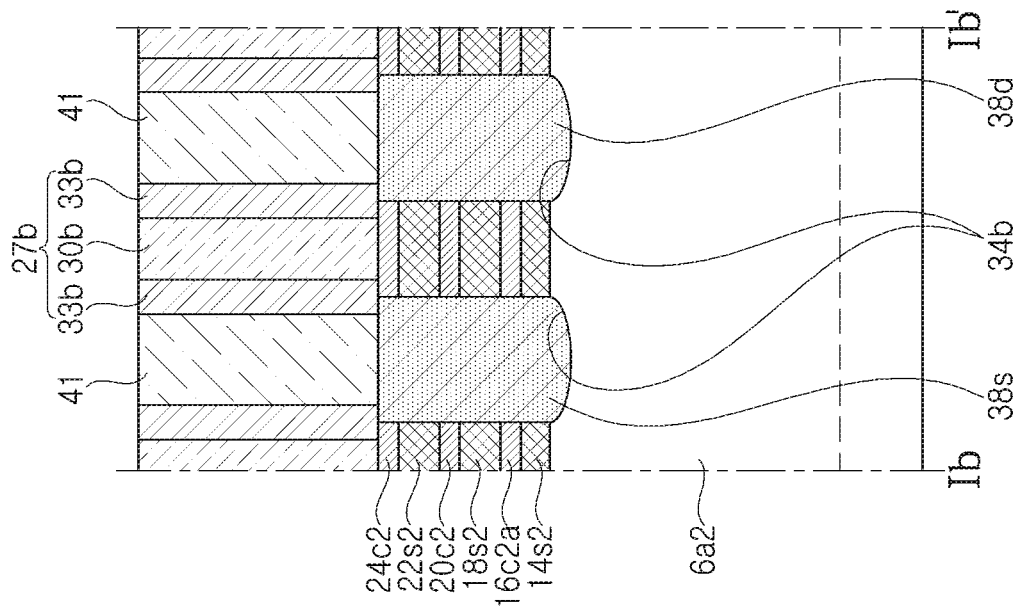

Referring to FIGS. 1, 20A and 20B, the first and second semiconductor structures 8a1 and 8a2 are etched on the first and second active fins 6a1 and 6a2 by using the first and second structures 27a and 27b as an etch mask, to form first recesses 34a on the first active fin 6a1 and second recesses 34b on the second active fin 6a2, a first epitaxial growth process is performed to form a first source region 36s and a first drain region 36d filling the first recesses 34a, and a second epitaxial growth process may be performed to form a second source region 38s and a second drain region 38d filling the second recesses 34b.

The first source region 36s and the first drain region 36d may be formed of a silicon (Si) epitaxial layer. The first source region 36s and the first drain region 36d may have an N-type conductivity. In an example embodiment of the present inventive concept, each of the first source region 36s and the first drain region 36d may include a silicon (Si) layer doped with N-type dopants such as, for example, phosphorus (P), arsenic (As), antimony (Sb) and/or bismuth (Bi).

The second source region 38s and the second drain region 38d may include a silicon germanium (SiGe) epitaxial layer. The second source region 38s and the second drain region 38d may have a P-type conductivity. In an example embodiment of the present inventive concept, each of the second source region 38s and the second drain region 38d may include a silicon germanium (SiGe) layer doped with P-type dopants such as, for example, boron (B), aluminum (Al), gallium (Ga), and/or indium (In).

An interlayer insulating layer 41 filling between the first structures 27a and between the second structures 27b may be formed.

Figure 21A:
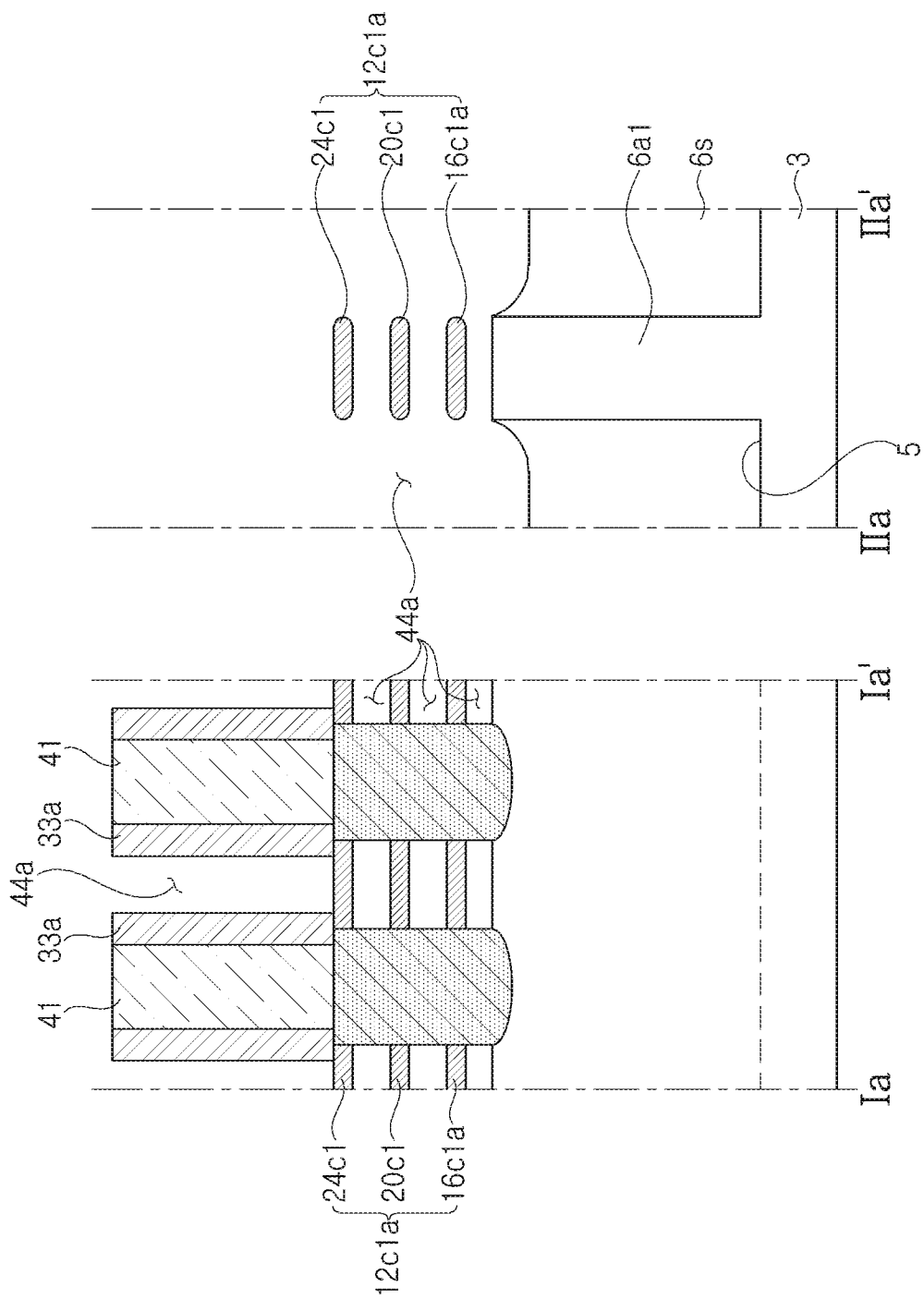
Figure 21B:
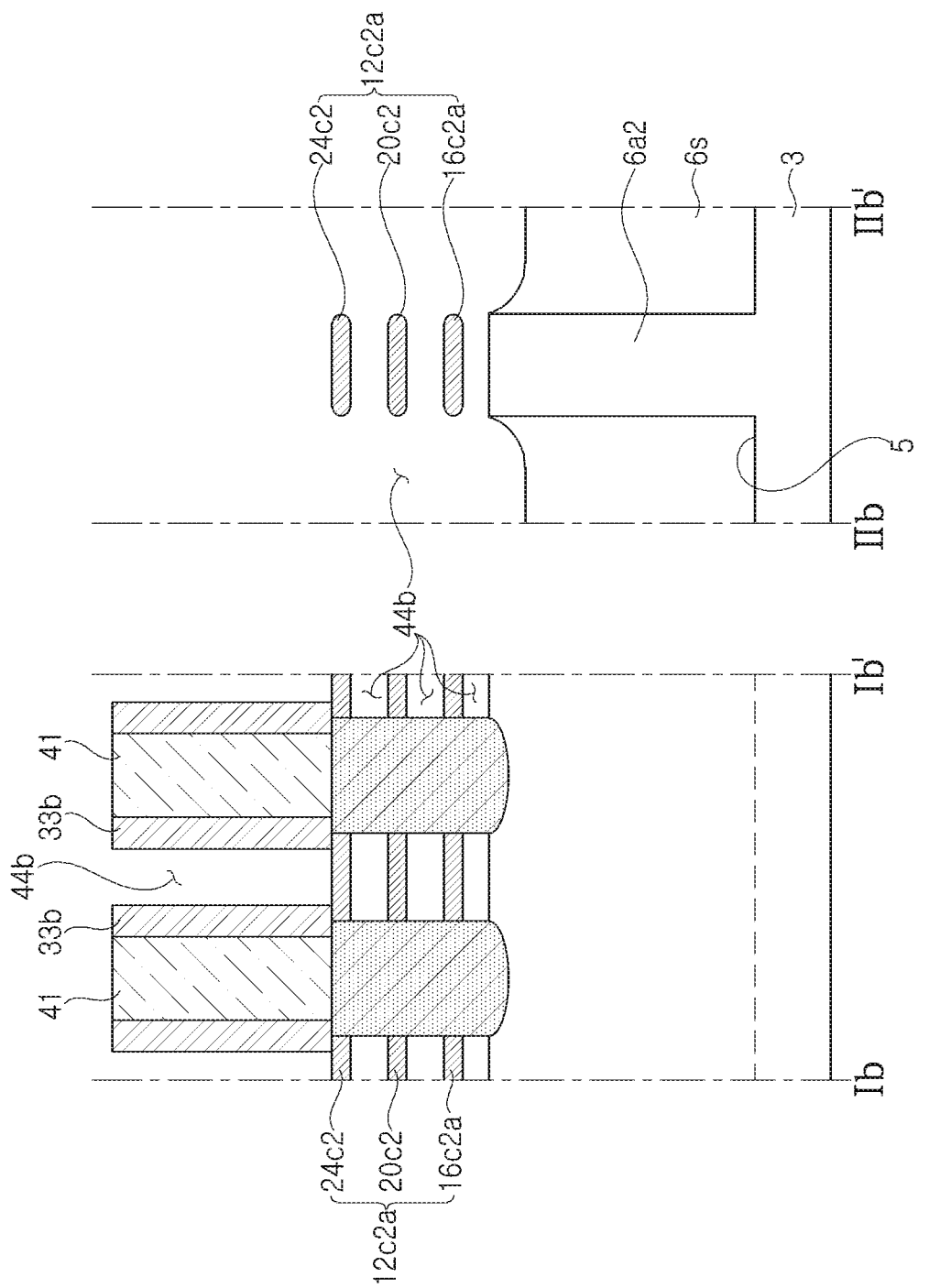

Referring to FIGS. 1, 21A and 21B, the first and second sacrificial gates (30a in FIG. 19A and 30b in FIG. 19B) are removed, and the plurality of first sacrificial layers 10s1 and the plurality of second sacrificial layers 10s2 are removed.

Hereinafter, for convenience of description, one first sacrificial gate (30a in FIG. 19A) among the first sacrificial gates (30a in FIG. 19A) and one second sacrificial gate (30b in FIG. 19B) among the second sacrificial gates (30b in FIG. 19B) will be mainly described.

A first gate trench 44a is formed by removing the first sacrificial gate (30a in FIG. 19A) and the plurality of first sacrificial layers (10s1 in FIG. 19A), and at the same time, the second sacrificial gate (in FIG. 19B) 30b) and the plurality of second sacrificial layers (10s2 of FIG. 19B) may be removed to form a second gate trench 44b. For example, to form the first gate trench 44a and the second gate trench 44b, the first sacrificial layers (10s1 in FIG. 19A) and the second sacrificial layers (10s2 of FIG. 19B) may be selectively etched by using an etching selectivity difference between the first sacrificial layers (10s1 in FIG. 19A) and the first channel layers 12c1a and between the second sacrificial layers (10s2 of FIG. 19B) and the second channel layers 12c2a. In an example embodiment of the present inventive concept, the first gate trench 44a and the second gate trench 44b may be formed by a wet etching process.

Again, referring to FIGS. 1, 2A and 2B, a first gate structure G1 filling the first gate trench 44a and a second gate structure G2 filling the second gate trench 44b may be formed. Forming the first and second gate structures G1 and G2 may include forming a first gate dielectric 47a conformally covering the inner wall of the first gate trench 44a and a second gate dielectric 47b conformally covering the inner wall of the second gate trench 44b, respectively, forming a first gate electrode 50 on the first gate dielectric 47a, and forming a second gate electrode 60 on the second gate dielectric 47b.

At least a portion of the first gate electrode 50 and at least a portion of the second gate electrode 60 may be formed in a different process order.

After the first and second gate structures G1 and G2 and the first and second insulating spacers 33*a* and 33*b* are partially etched, first and second insulating capping layers 70*a* and 70*b* may be respectively formed.

Contact holes are formed by etching the interlayer insulating layer (41 of FIGS. 20A and 20B), insulating patterns 73*a* and 73*b* are formed on sidewalls of the contact holes, and contact plugs (76*a*, 76*b*) filling the contact holes may be formed. Accordingly, the semiconductor device 1 as shown in FIGS. 2A and 2B may be formed. During the formation of the contact plugs (76*a*, 76*b*), silicide patterns may be respectively formed between the first contact plugs 76*a* and the first source and drain regions 36*s* and 36*d*, and between the second contact plugs 76*b* and the second source and drain regions 38*s* and 38*d* to provide reliable metal-semiconductor contact.

In an example embodiment of the present inventive concept, to form the first and second transistors TR1*b* and TR2*b* described with reference to FIGS. 5A and 5B, the thickness of the first and second lower sacrificial layers 14*s*1 and 14*s*2 described with reference to FIGS. 19A and 19B may be increased.

Figure 22A:
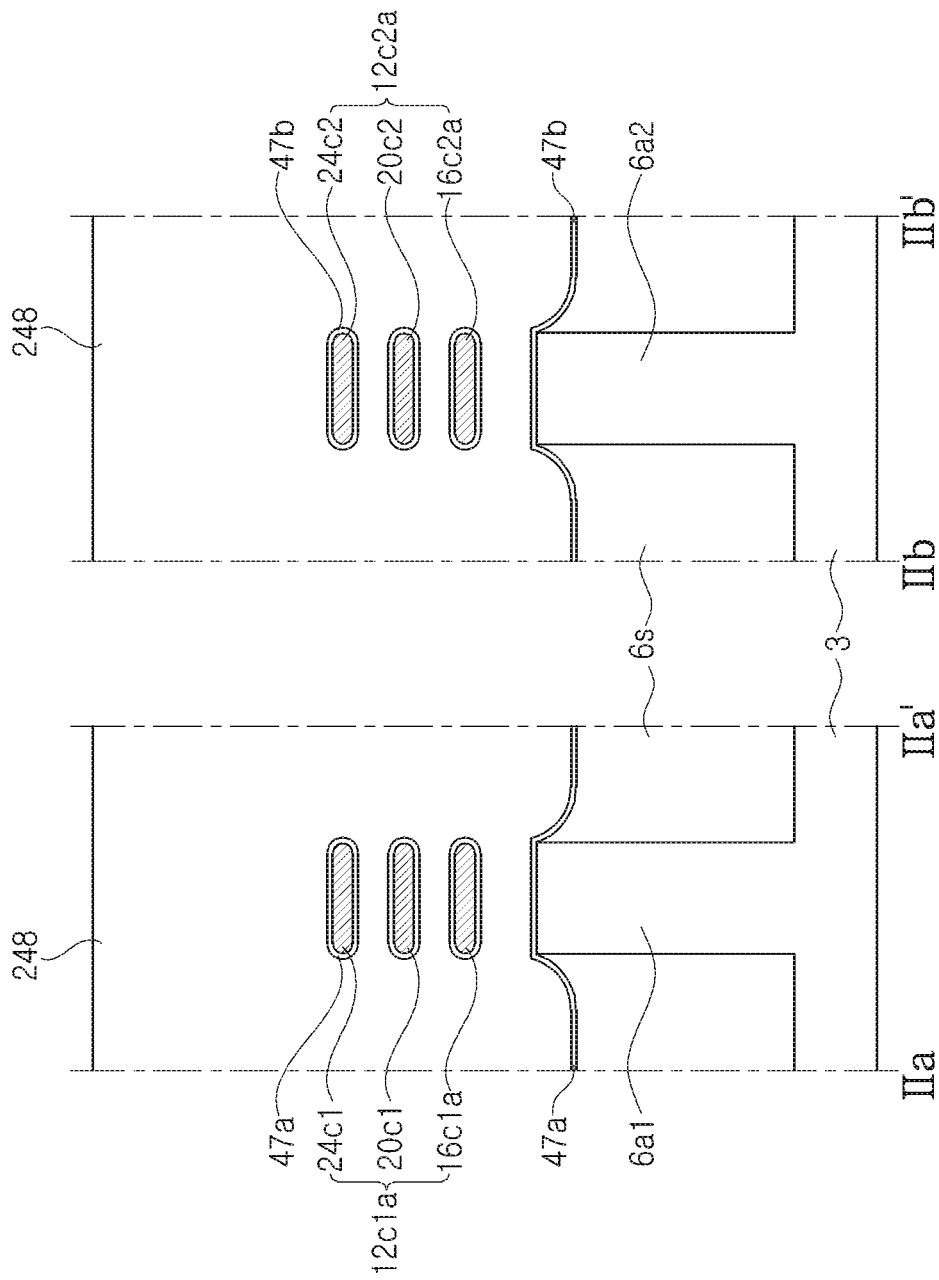
Figure 22C:
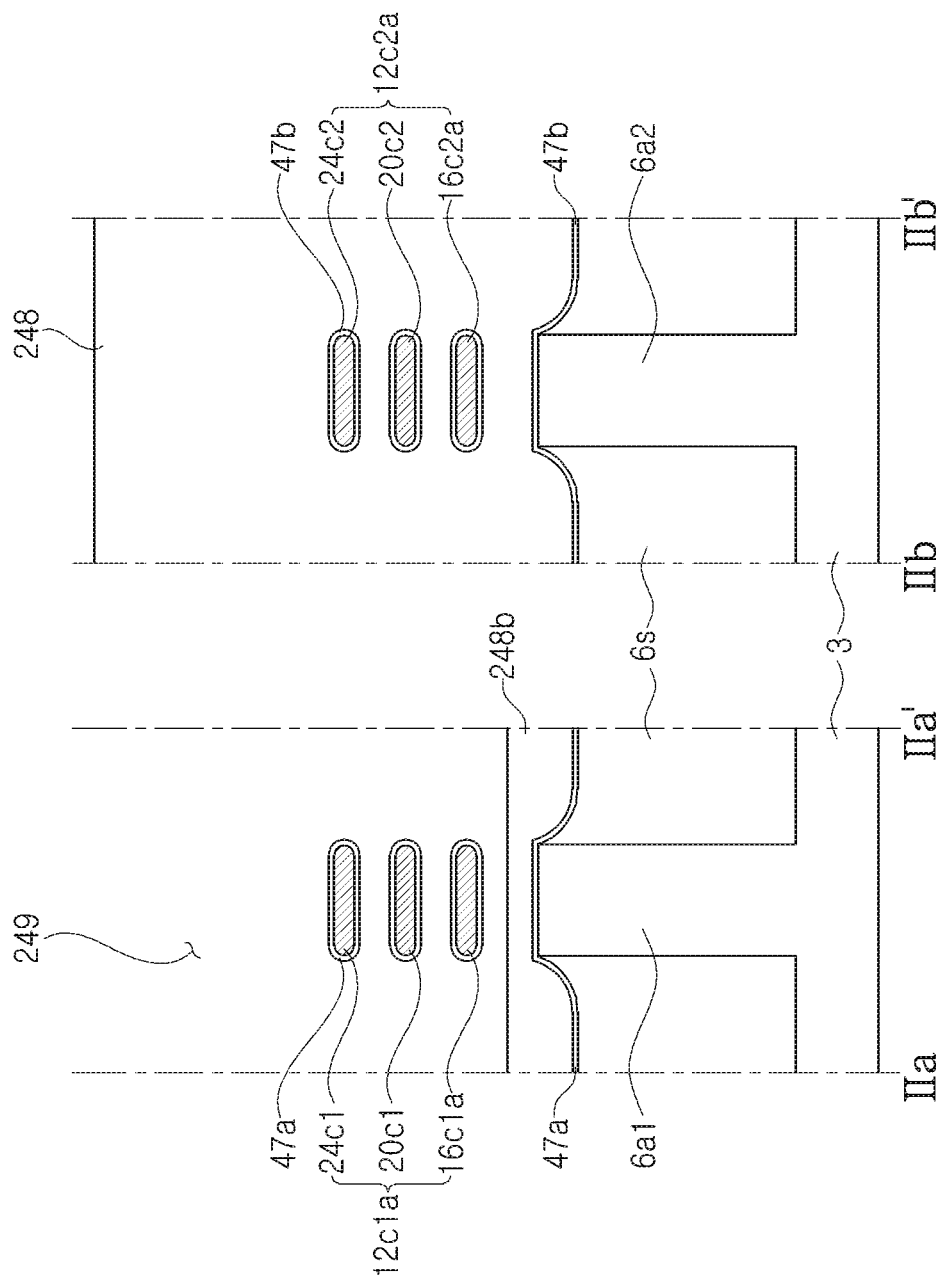

Next, another example of a method of forming a semiconductor device according to an example embodiment of the present inventive concept will be described. FIGS. 22A to 22C are cross-sectional views schematically illustrating a modified example of a method of forming a semiconductor device according to an example embodiment of the present inventive concept. FIGS. 22A to 22C are cross-sectional views schematically illustrating regions taken along lines IIa-IIa' and IIb-IIb' of FIG. 1.

Referring to FIGS. 1 and 22A, after forming the first gate trench 44*a* and the second gate trench 44*b* as described with reference to FIGS. 20A and 20B, a first gate dielectric 47*a* surrounding the plurality of first channel layers 12*c*1*a*, respectively, and covering an upper surface of the first active fin 6*a*1, and a second gate dielectric 47*b* surrounding the plurality of second channel layers 12*c*2*a*, respectively, and covering an upper surface of the second active fin 6*a*2 may be formed.

A first conductive layer 248 may be formed on the first gate dielectric 47*a* and the second gate dielectric 47*b*. The first conductive layer 248 may be a PMOS work function metal layer.

Referring to FIGS. 1 and 22B, the partially etched conductive layer 248*a* may be formed while forming a recess 249 by partially etching the first conductive layer 248 positioned on the first gate dielectric 47*a*. The partially etched conductive layer 248*a* may be disposed at least at a level the same height as that of the first lower channel layer 16*c*1*a* or at a level higher than that of the first lower channel layer 16*c*1*a*.

Referring to FIGS. 1 and 22C, by performing an etching process in which the etching rate in the horizontal direction is greater than the etching rate in the vertical direction, the partially etched conductive layer 248*a* is partially etched. As a result, a partially etched conductive layer 248*b* that is positioned at a level lower than that of the first lower channel layer 16*c*1*a* and covers the first active fin 6*a*1 may be formed. The partially etched conductive layer 248*b* may be the first PMOS work function metal layer 152*b* in FIGS. 11 and 15A.

Referring again to FIGS. 1 and 15A, on the partially etched conductive layer 248*b*, i.e., the first PMOS work function metal layer (152*b* in FIG. 15A) as illustrated in FIG. 15A. An NMOS work function metal layer 154*b* on the first PMOS work function metal layer 152*b* may be formed. Thus, as illustrated in FIG. 15A, the first PMOS work function metal layer 152*b* and the NMOS work function metal layer 154*b* may be disposed between the first lower channel layer 16*c*1*a* and the first active fin 6*a*1. Accordingly, the semiconductor device 1 including the first and second transistors TR1*e*3 and TR2*e*3 as described with reference to FIG. 15A may be formed. In the first transistor TR1*e*3, the first PMOS work function metal layer 152*b* is disposed between the first lower channel layer 16*c*1*a* and the first active fin 6*a*1, and thus, the sub-threshold leakage current generated in the first active fin 6*a*1 may be significantly reduced or prevented. Accordingly, the electrical characteristics or performance of the semiconductor device 1 may be enhanced.

As described above, the semiconductor device 1 according to an example embodiment of the present inventive concept may include a transistor in which sub-threshold leakage current may be significantly reduced or prevented by adjusting the distance between the lower channel layer and the active fin among the plurality of channel layers, or adjusting the work function of the gate electrode portion interposed between the lower channel layer and the active fin. By including the above described transistor, electrical characteristics and performance of the semiconductor device 1 may be enhanced.

As set forth above, according to an example embodiment of the present inventive concept, there is provided a semiconductor device in which a sub-threshold leakage current occurring in an active fin may be significantly reduced or prevented in a transistor including a plurality of channel layers stacked while being spaced apart from each other on the active fin. For example, by adjusting the distance between the active fin and the lower channel layer among the plurality of channel layers and adjusting the work function of a gate electrode portion interposed between the lower channel layer and the active fin, sub-threshold leakage current may be significantly reduced or prevented.

According to an example embodiment of the present inventive concept, a semiconductor device in which an operating threshold voltage distribution may be enhanced in a transistor including a plurality of channel layers stacked while being spaced apart from each other on an active fin may be provided.

While example embodiments have been illustrated and described above, it will be apparent to those skilled in the art that modifications and variations could be made without departing from the spirit and scope of the present inventive concept as defined by the appended claims.

What is claimed is:

1. A semiconductor device comprising:
   a substrate;
   a first active fin on the substrate and extending in a first direction parallel to an upper surface of the substrate;
   a second active fin on the substrate and extending in the first direction;
   an isolation region disposed on the substrate and disposed on side surfaces of the first active fin and the second active fin;
   a first transistor on the first active fin; and
   a second transistor on the second active fin,
   wherein the first transistor includes:
      a first source region and a first drain region spaced apart from each other in the first direction, on the first active fin;

a plurality of first channel layers including a first lower channel layer, a first intermediate channel layer, and a first upper channel layer spaced apart from each other in a vertical direction perpendicular to the upper surface of the substrate, on the first active fin, and sequentially stacked, the plurality of first channel layers being disposed between the first source region and the first drain region; and a first gate structure extending in a second direction perpendicular to the first direction while traversing the first active fin, and respectively surrounding the plurality of first channel layers, wherein the second transistor includes:
a second source region and a second drain region spaced apart from each other in the first direction, on the second active fin;

a plurality of second channel layers including a second lower channel layer, a second intermediate channel layer, and a second upper channel layer sequentially stacked on the second active fin and spaced apart from each other in the vertical direction, the plurality of second channel layers being disposed between the second source region and the second drain region; and a second gate structure extending in the second direction while traversing the second active fin and respectively surrounding the plurality of second channel layers, wherein the first gate structure includes a first gate dielectric in contact with the first active fin and the plurality of first channel layers, respectively, and a first gate electrode in contact with the first gate dielectric, wherein the first gate electrode includes a first lower electrode portion between the first active fin and the first lower channel layer, a first intermediate electrode portion between the first lower channel layer and the first intermediate channel layer, and a first upper electrode portion between the first intermediate channel layer and the first upper channel layer, wherein the second gate structure includes a second gate dielectric in contact with the second active fin and the plurality of second channel layers, respectively, and a second gate electrode in contact with the second gate dielectric, wherein the second gate electrode includes a second lower electrode portion between the second active fin and the second lower channel layer, a second intermediate electrode portion between the second lower channel layer and the second intermediate channel layer, and a second upper electrode portion between the second intermediate channel layer and the second upper channel layer, wherein vertically adjacent first channel layers among the plurality of first channel layers are spaced apart from each other by a first distance, wherein the first active fin and the first lower channel layer are spaced apart from each other by a second distance different from the first distance, wherein the first transistor has a first parasitic threshold voltage in the first lower electrode portion and the first active fin, and a first operating threshold voltage between the first intermediate and upper electrode portions and the plurality of first channel layers, and wherein the first parasitic threshold voltage is greater than the first operating threshold voltage.

2. The semiconductor device of claim 1, wherein the first gate electrode includes a work function adjusting metal element, and
a content of the work function adjusting metal element in the first lower electrode portion is lower than a content of the work function adjusting metal element in each of the first intermediate electrode portion and the first upper electrode portion.

3. The semiconductor device of claim 2, wherein the first gate electrode includes an NMOS work function metal layer including at least one of titanium aluminum carbide (TiAlC), titanium aluminum nitride (TiAlN) or tantalum aluminum carbide (TaAlC), and
in the NMOS work function metal layer, the work function adjusting metal element is an aluminum (Al) element.

4. The semiconductor device of claim 1, wherein the second distance is smaller than the first distance.

5. The semiconductor device of claim 4, wherein a thickness of the first lower channel layer is greater than a thickness of each of the first intermediate channel layer and the first upper channel layer, and
a thickness of the second lower channel layer is greater than a thickness of each of the second intermediate channel layer and the second upper channel layer.

6. The semiconductor device of claim 1, wherein the second distance is greater than the first distance.

7. The semiconductor device of claim 1, wherein the first transistor is an NMOS transistor,
the second transistor is a PMOS transistor,
the first intermediate electrode portion and the first upper electrode portion each includes an NMOS work function metal layer, and
the first lower electrode portion includes a PMOS work function metal layer different from the NMOS work function metal layer.

8. The semiconductor device of claim 1, wherein the first transistor is an NMOS transistor,
the second transistor is a PMOS transistor,
the second intermediate electrode portion and the second upper electrode portion each includes a PMOS work function metal layer, and
the second lower electrode portion includes an NMOS work function metal layer different from the PMOS work function metal layer.

9. The semiconductor device of claim 1, wherein the first transistor is an NMOS transistor,
the second transistor is a PMOS transistor,
the first intermediate electrode portion and the first upper electrode portion each includes an NMOS work function metal layer,
the first lower electrode portion includes a PMOS work function metal layer different from the NMOS work function metal layer,
the second intermediate electrode portion and the second upper electrode portion each includes the PMOS work function metal layer, and
the second lower electrode portion includes the NMOS work function metal layer.

10. A semiconductor device comprising:
a substrate;
a first active fin disposed on the substrate and extending in a first direction parallel to an upper surface of the substrate;
an isolation region on the substrate and on a side surface of the first active fin;

a first source region and a first drain region on the first active fin and spaced apart from each other in the first direction;

a plurality of first channel layers including a first lower channel layer, a first intermediate channel layer and a first upper channel layer sequentially stacked while being spaced apart from each other in a vertical direction perpendicular to the upper surface of the substrate, on the first active fin, the plurality of first channel layers being disposed between the first source region and the first drain region; and a first gate structure traversing the first active fin and extending in a second direction perpendicular to the first direction, the first gate structure respectively surrounding the plurality of first channel layers, wherein vertically adjacent first channel layers among the plurality of first channel layers are spaced apart from each other by a first distance, wherein the first active fin and the first lower channel layer are spaced apart from each other by a second distance different from the first distance, wherein the first gate structure includes a first gate dielectric in contact with the first active fin and each of the plurality of first channel layers, and a first gate electrode in contact with the first gate dielectric, wherein the first gate electrode includes a first lower electrode portion between the first active fin and the first lower channel layer, a first intermediate electrode portion between the first lower channel layer and the first intermediate channel layer, and a first upper electrode portion between the first intermediate channel layer and the first upper channel layer, wherein the first intermediate electrode portion and the first upper electrode portion have a first work function equal to each other, and wherein the first lower electrode portion has a second work function different from the first work function.

11. The semiconductor device of claim 10, wherein the second distance is smaller than the first distance, the first gate electrode includes a work function adjusting metal element, and a content of the work function adjusting metal element in the first lower electrode portion is lower than a content of the work function adjusting metal element in each of the first intermediate electrode portion and the first upper electrode portion.

12. The semiconductor device of claim 10, wherein the first gate electrode includes first material layers and a second material layer on the first material layers, the first material layers surround the plurality of first channel layers, respectively, to be spaced apart from each other, and fill a space between the first active fin and the first lower channel layer, and the second material layer fills a space between a portion of the first material layers covering an upper surface of the first lower channel layer and a portion of the first material layers covering a lower surface of the first intermediate channel layer, while simultaneously filling a space between a portion of the first material layers covering an upper surface of the first intermediate channel layer and a portion of the first material layers covering a lower surface of the first upper channel layer.

13. The semiconductor device of claim 10, wherein each of the plurality of first channel layers has a thickness equal to or greater than about 0.4 times and equal to or less than about 0.6 times the first distance, the second distance is smaller than the first distance, and the second distance is equal to or greater than about 0.6 times and equal to or less than about 0.8 times the first distance.

14. The semiconductor device of claim 10, wherein the second distance is smaller than the first distance, the second distance is greater than or equal to about 0.6 times and less than or equal to about 0.8 times the first distance, the first intermediate channel layer and the first upper channel layer each has a first thickness, the first lower channel layer has a second thickness greater than the first thickness, the first thickness is greater than or equal to about 0.4 times and less than or equal to about 0.6 times the first distance, and the second thickness is equal to or greater than about 0.7 times and less than or equal to about 0.9 times the first distance.

15. The semiconductor device of claim 10, wherein the first gate electrode includes first material layers and a second material layer on the first material layers, the first material layers surround the plurality of first channel layers, respectively, fill a space between the vertically adjacent first channel layers among the plurality of first channel layers, and include a portion covering an upper surface of the first active fin, and the second material layer includes a portion interposed between a portion of the first material layers covering the upper surface of the first active fin and a portion of the first material layers covering a lower surface of the first lower channel layer.

16. The semiconductor device of claim 10, wherein each of the plurality of first channel layers has a thickness of about 0.4 times to about 0.6 times the first distance, the second distance is greater than the first distance, and the second distance is about 1.2 times to about 2 times the first distance.

17. The semiconductor device of claim 10, further comprising:

a second active fin disposed on the substrate, extending in the vertical direction, and extending in the first direction;

a second source region and a second drain region on the second active fin and spaced apart from each other in the first direction;

a plurality of second channel layers including a second lower channel layer, a second intermediate channel layer, and a second upper channel layer sequentially stacked and spaced apart from each other in the vertical direction, on the second active fin, the plurality of second channel layers being disposed between the second source region and the second drain region; and a second gate structure traversing the second active fin and extending in the second direction, the second gate structure respectively surrounding the plurality of second channel layers, wherein the second lower channel layer and the second intermediate channel layer are spaced apart from each other by the first distance, the second active fin and the second lower channel layer are spaced apart from each other by the second distance, the second gate structure further includes a second gate dielectric in contact with the second active fin and each of the plurality of second channel layers, and a second gate electrode in contact with the second gate dielectric, the second gate electrode includes a second lower electrode portion between the second active fin and the second lower channel layer, a second intermediate electrode portion between the second lower channel layer and the second intermediate channel layer, and a second upper electrode portion between the second intermediate channel layer and the second upper channel layer, the second intermediate electrode portion and the second upper electrode portion have a third work function equal to each other, and the second lower electrode portion has a fourth work function different from the third work function.

18. A semiconductor device comprising:

a substrate;

an active fin on the substrate and extending in a first direction parallel to an upper surface of the substrate;

an isolation region disposed on the substrate and disposed on a side surface of the active fin; and a transistor on the active fin, wherein the transistor includes:
- a source region and a drain region spaced apart from each other in the first direction on the active fin;
- a plurality of channel layers including a lower channel layer, an intermediate channel layer and an upper channel layer sequentially stacked while being spaced apart from each other on the active fin, in a vertical direction perpendicular to the upper surface of the substrate, the plurality of channel layers being disposed between the source region and the drain region; and
- a gate structure traversing the active fin and extending in a second direction perpendicular to the first direction, the gate structure respectively surrounding the plurality of channel layers, wherein the gate structure includes a gate dielectric in contact with the active fin and each of the plurality of channel layers, and a gate electrode in contact with the gate dielectric, wherein the gate electrode includes a lower electrode portion between the active fin and the lower channel layer, an intermediate electrode portion between the lower channel layer and the intermediate channel layer, and an upper electrode portion between the intermediate channel layer and the upper channel layer, wherein the gate electrode includes a work function adjusting metal element, and wherein a content of the work function adjusting metal element in the lower electrode portion is different from a content of the work function adjusting metal element in each of the intermediate electrode portion and the upper electrode portion.

19. The semiconductor device of claim 18, wherein vertically adjacent channel layers among the plurality of channel layers are spaced apart by a first distance, the active fin and the lower channel layer are spaced apart from each other by a second distance smaller than the first distance, and the content of the work function adjusting metal element in the lower electrode portion is lower than the content of the work function adjusting metal element in each of the intermediate electrode portion and the upper electrode portion.

20. The semiconductor device of claim 19, wherein a thickness of the lower channel layer is greater than a thickness of each of the intermediate channel layer and the upper channel layer.

* * * * *